United States Patent
Markovic et al.

(10) Patent No.: US 11,545,167 B2
(45) Date of Patent: Jan. 3, 2023

(54) SIGNAL FILTERING

(71) Applicant: Fraunhofer-Gesellschaft zur Förderung der angewandten Forschung e.V., Munich (DE)

(72) Inventors: Goran Markovic, Erlangen (DE); Emmanuel Ravelli, Erlangen (DE); Martin Dietz, Erlangen (DE); Bernhard Grill, Erlangen (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 183 days.

(21) Appl. No.: 16/869,143

(22) Filed: May 7, 2020

(65) Prior Publication Data

US 2020/0335118 A1    Oct. 22, 2020

Related U.S. Application Data

(63) Continuation of application No. PCT/EP2018/080837, filed on Nov. 9, 2018.

(30) Foreign Application Priority Data

Nov. 10, 2017   (EP) .................................... 17201105

(51) Int. Cl.
   *G11B 27/038*      (2006.01)
   *G10L 19/26*      (2013.01)
   (Continued)

(52) U.S. Cl.
   CPC .............. *G10L 19/26* (2013.01); *G10L 19/09* (2013.01); *H03H 17/0294* (2013.01);
   (Continued)

(58) Field of Classification Search
   CPC ....... G10L 19/26; G10L 19/022; G10L 19/09; G11B 27/038
   See application file for complete search history.

(56) References Cited

U.S. PATENT DOCUMENTS

| | | | |
|---|---|---|---|
| 4,972,484 A | 11/1990 | Link et al. | |
| 5,012,517 A | 4/1991 | Chhatwal et al. | |

(Continued)

FOREIGN PATENT DOCUMENTS

| | | | |
|---|---|---|---|
| CN | 101140759 A | 3/2008 | |
| CN | 102779526 A | 11/2012 | |

(Continued)

OTHER PUBLICATIONS

Sujoy Sarkar, "Examination Report for IN Application No. 202037018091", dated Jun. 1, 2021, Intellectual Property India, India.

(Continued)

*Primary Examiner* — Feng-Tzer Tzeng
(74) *Attorney, Agent, or Firm* — Novick, Kim & Lee PLLC; Jae Youn Kim

(57) ABSTRACT

In methods and systems for filtering an information input signal, a system may have: a first filter unit filtering an input signal at an initial subinterval in a current update interval according to parameters associated to the preceding update interval, the parameters being scaled by a first scaling factor changing towards 0; and a second filter unit filtering a second filter input signal, based on the output of the first filter unit, at the initial subinterval, according to parameters associated to the current update interval, the parameters being scaled by a second scaling factor changing from 0, or a value close to 0, toward a value more distant from 0.

31 Claims, 15 Drawing Sheets

(51) Int. Cl.
  *G10L 19/09* (2013.01)
  *H03H 17/02* (2006.01)
  *G10L 19/00* (2013.01)
  *G10L 19/22* (2013.01)

(52) U.S. Cl.
  CPC ...... *G10L 19/22* (2013.01); *G10L 2019/0012* (2013.01); *G11B 27/038* (2013.01); *H03H 2017/0295* (2013.01)

(56) References Cited

U.S. PATENT DOCUMENTS

| | | | |
|---|---|---|---|
| 5,581,653 | A | 12/1996 | Todd |
| 5,651,091 | A | 7/1997 | Chen et al. |
| 5,781,888 | A | 7/1998 | Herre |
| 5,812,971 | A | 9/1998 | Herre |
| 5,819,209 | A | 10/1998 | Inoue |
| 5,909,663 | A | 6/1999 | Iijima et al. |
| 5,999,899 | A | 12/1999 | Robinson |
| 6,018,706 | A | 1/2000 | Huang et al. |
| 6,148,288 | A | 11/2000 | Park |
| 6,167,093 | A | 12/2000 | Tsutsui et al. |
| 6,507,814 | B1 | 1/2003 | Gao |
| 6,570,991 | B1 | 5/2003 | Scheirer et al. |
| 6,665,638 | B1 | 12/2003 | Kang et al. |
| 6,735,561 | B1 | 5/2004 | Johnston et al. |
| 7,009,533 | B1 | 3/2006 | Wegener |
| 7,302,396 | B1 * | 11/2007 | Cooke .................. G11B 27/038 704/500 |
| 7,353,168 | B2 | 4/2008 | Chen et al. |
| 7,395,209 | B1 | 7/2008 | Dokic et al. |
| 7,539,612 | B2 | 5/2009 | Chen et al. |
| 7,546,240 | B2 | 6/2009 | Chen et al. |
| 8,015,000 | B2 | 9/2011 | Chen et al. |
| 8,095,359 | B2 | 1/2012 | Boehm et al. |
| 8,280,538 | B2 | 10/2012 | Kim et al. |
| 8,473,301 | B2 | 6/2013 | Chen et al. |
| 8,543,389 | B2 | 9/2013 | Ragot et al. |
| 8,554,549 | B2 | 10/2013 | Morii et al. |
| 8,612,240 | B2 | 12/2013 | Fuchs et al. |
| 8,682,681 | B2 | 3/2014 | Fuchs et al. |
| 8,738,385 | B2 | 5/2014 | Chen |
| 8,751,246 | B2 | 6/2014 | Bayer et al. |
| 8,847,795 | B2 | 9/2014 | Faure et al. |
| 8,891,775 | B2 | 11/2014 | Mundt al. |
| 8,898,068 | B2 | 11/2014 | Fuchs et al. |
| 9,026,451 | B1 | 5/2015 | Kleijn et al. |
| 9,123,350 | B2 | 9/2015 | Zhao et al. |
| 9,489,961 | B2 | 11/2016 | Kovesi et al. |
| 9,595,262 | B2 | 3/2017 | Guillaume et al. |
| 10,296,959 | B1 | 5/2019 | Chernikhova et al. |
| 10,726,854 | B2 | 7/2020 | Ghido et al. |
| 2001/0026327 | A1 | 10/2001 | Schreiber et al. |
| 2003/0088408 | A1 * | 5/2003 | Thyssen .................. G10L 19/26 704/226 |
| 2003/0101050 | A1 | 5/2003 | Cuperman et al. |
| 2004/0158462 | A1 | 8/2004 | Rutledge et al. |
| 2004/0162866 | A1 | 8/2004 | Malvar et al. |
| 2005/0010395 | A1 | 1/2005 | Chiu et al. |
| 2005/0015249 | A1 | 1/2005 | Chen et al. |
| 2005/0192799 | A1 | 9/2005 | Kim et al. |
| 2005/0246178 | A1 | 11/2005 | Fejzo |
| 2006/0288851 | A1 | 12/2006 | Esima et al. |
| 2007/0033056 | A1 | 2/2007 | Groeschl et al. |
| 2007/0078646 | A1 | 4/2007 | Lei et al. |
| 2007/0118361 | A1 | 5/2007 | Sinha et al. |
| 2007/0118369 | A1 | 5/2007 | Chen |
| 2007/0124136 | A1 | 5/2007 | Den Brinker et al. |
| 2007/0127729 | A1 | 6/2007 | Breebaart et al. |
| 2007/0129940 | A1 | 6/2007 | Geyersberger et al. |
| 2007/0154031 | A1 | 7/2007 | Avendano et al. |
| 2007/0276656 | A1 | 11/2007 | Solbach et al. |
| 2008/0033718 | A1 | 2/2008 | Zopf et al. |
| 2008/0091418 | A1 | 4/2008 | Laaksonen et al. |
| 2008/0126086 | A1 | 5/2008 | Kandhadai et al. |
| 2008/0126096 | A1 | 5/2008 | Choo et al. |
| 2009/0076805 | A1 | 3/2009 | Du et al. |
| 2009/0076830 | A1 | 3/2009 | Taleb |
| 2009/0089050 | A1 | 4/2009 | Mo et al. |
| 2009/0138267 | A1 | 5/2009 | Davidson et al. |
| 2009/0248424 | A1 | 10/2009 | Koishida et al. |
| 2009/0254352 | A1 | 10/2009 | Zhao |
| 2010/0010810 | A1 | 1/2010 | Morii |
| 2010/0070270 | A1 | 3/2010 | Gao |
| 2010/0094637 | A1 | 4/2010 | Vinton |
| 2010/0115370 | A1 | 5/2010 | Ramo et al. |
| 2010/0198588 | A1 | 8/2010 | Osada et al. |
| 2010/0223061 | A1 | 9/2010 | Ojanpera |
| 2010/0312552 | A1 | 12/2010 | Kandhadai et al. |
| 2010/0312553 | A1 | 12/2010 | Fang et al. |
| 2010/0324912 | A1 | 12/2010 | Choo et al. |
| 2011/0015768 | A1 | 1/2011 | Kim et al. |
| 2011/0022924 | A1 | 1/2011 | Malenovsky et al. |
| 2011/0035212 | A1 | 2/2011 | Briand et al. |
| 2011/0060597 | A1 | 3/2011 | Chen et al. |
| 2011/0071839 | A1 | 3/2011 | Budnikov et al. |
| 2011/0095920 | A1 | 4/2011 | Ashley et al. |
| 2011/0096830 | A1 | 4/2011 | Ashley et al. |
| 2011/0116542 | A1 | 5/2011 | Antonini et al. |
| 2011/0125505 | A1 | 5/2011 | Gournay et al. |
| 2011/0145003 | A1 | 6/2011 | Bessette |
| 2011/0196673 | A1 | 8/2011 | Park et al. |
| 2011/0200198 | A1 | 8/2011 | Bayer et al. |
| 2011/0238425 | A1 | 9/2011 | Lecomte et al. |
| 2011/0238426 | A1 | 9/2011 | Borsum et al. |
| 2012/0010879 | A1 | 1/2012 | Kikuiri et al. |
| 2012/0022881 | A1 | 1/2012 | Geiger et al. |
| 2012/0072209 | A1 | 3/2012 | Krishnan et al. |
| 2012/0109659 | A1 | 5/2012 | Chen et al. |
| 2012/0214544 | A1 | 8/2012 | Rodriguez et al. |
| 2012/0245947 | A1 | 9/2012 | Neuendorf et al. |
| 2012/0265540 | A1 | 10/2012 | Fuchs et al. |
| 2012/0265541 | A1 | 10/2012 | Geiger et al. |
| 2013/0030819 | A1 | 1/2013 | Carlsson et al. |
| 2013/0096912 | A1 | 4/2013 | Kjoerling et al. |
| 2013/0226594 | A1 | 8/2013 | Fuchs et al. |
| 2013/0282369 | A1 | 10/2013 | Ryu et al. |
| 2014/0052439 | A1 | 2/2014 | Nanjundaswamy et al. |
| 2014/0067404 | A1 | 3/2014 | Baumgarte |
| 2014/0074486 | A1 | 3/2014 | Dietz et al. |
| 2014/0108020 | A1 | 4/2014 | Bai et al. |
| 2014/0142957 | A1 | 5/2014 | Lee et al. |
| 2014/0172141 | A1 | 6/2014 | Mangold |
| 2014/0223029 | A1 | 8/2014 | Bhaskar et al. |
| 2014/0330556 | A1 | 11/2014 | Biswas et al. |
| 2014/0358531 | A1 | 12/2014 | Vos Koen |
| 2015/0010155 | A1 | 1/2015 | Lang et al. |
| 2015/0081312 | A1 | 3/2015 | Fuchs et al. |
| 2015/0142452 | A1 | 5/2015 | Lee et al. |
| 2015/0154969 | A1 | 6/2015 | Craven et al. |
| 2015/0170668 | A1 | 6/2015 | Kovesi et al. |
| 2015/0221311 | A1 | 8/2015 | Jeon et al. |
| 2015/0228287 | A1 | 8/2015 | Bruhn et al. |
| 2015/0255079 | A1 | 9/2015 | Huang et al. |
| 2015/0302859 | A1 | 10/2015 | Aguilar et al. |
| 2015/0302861 | A1 | 10/2015 | Salami et al. |
| 2015/0325246 | A1 | 11/2015 | Chen et al. |
| 2015/0371647 | A1 | 12/2015 | Faure et al. |
| 2016/0019898 | A1 | 1/2016 | Schreiner et al. |
| 2016/0027450 | A1 | 1/2016 | Gao |
| 2016/0078878 | A1 | 3/2016 | Ravelli et al. |
| 2016/0104488 | A1 * | 4/2016 | Schnabel ................ G10L 19/12 704/204 |
| 2016/0111094 | A1 | 4/2016 | Dietz et al. |
| 2016/0163326 | A1 | 6/2016 | Resch et al. |
| 2016/0189721 | A1 | 6/2016 | Johnston et al. |
| 2016/0225384 | A1 | 8/2016 | Kjörling et al. |
| 2016/0247506 | A1 | 8/2016 | Lecomte et al. |
| 2016/0285718 | A1 | 9/2016 | Bruhn |
| 2016/0293174 | A1 | 10/2016 | Atti et al. |
| 2016/0293175 | A1 | 10/2016 | Atti et al. |
| 2016/0307576 | A1 | 10/2016 | Doehla et al. |
| 2016/0365097 | A1 | 12/2016 | Guan et al. |
| 2016/0372125 | A1 | 12/2016 | Atti et al. |

(56) References Cited

U.S. PATENT DOCUMENTS

| | | | |
|---|---|---|---|
| 2016/0372126 | A1 | 12/2016 | Atti et al. |
| 2016/0379655 | A1 | 12/2016 | Truman et al. |
| 2017/0011747 | A1 | 1/2017 | Faure et al. |
| 2017/0053658 | A1 | 2/2017 | Atti et al. |
| 2017/0078794 | A1 | 3/2017 | Bongiovi et al. |
| 2017/0103769 | A1 | 4/2017 | Laaksonen et al. |
| 2017/0110135 | A1 | 4/2017 | Disch et al. |
| 2017/0133029 | A1 | 5/2017 | Markovic et al. |
| 2017/0140769 | A1 | 5/2017 | Ravelli et al. |
| 2017/0154631 | A1 | 6/2017 | Bayer et al. |
| 2017/0154635 | A1 | 6/2017 | Doehla et al. |
| 2017/0221495 | A1 | 8/2017 | Sung et al. |
| 2017/0236521 | A1 | 8/2017 | Atti et al. |
| 2017/0249387 | A1 | 8/2017 | Hatami-Hanza |
| 2017/0256266 | A1 | 9/2017 | Sung et al. |
| 2017/0294196 | A1 | 10/2017 | Bradley et al. |
| 2017/0303114 | A1 | 10/2017 | Johansson et al. |
| 2019/0027156 | A1 | 1/2019 | Sung et al. |
| 2020/0335118 | A1 * | 10/2020 | Markovic ............... G10L 19/26 |

FOREIGN PATENT DOCUMENTS

| | | | | |
|---|---|---|---|---|
| CN | 107103908 | A | 8/2017 | |
| EP | 0716787 | A1 | 6/1996 | |
| EP | 0732687 | B2 | 9/1996 | |
| EP | 1791115 | A2 | 5/2007 | |
| EP | 2676266 | B1 | 12/2013 | |
| EP | 2980796 | A1 | 2/2016 | |
| EP | 2980796 | A1 * | 2/2016 | ........... G10L 19/022 |
| EP | 2980799 | A1 | 2/2016 | |
| EP | 3111624 | A1 | 1/2017 | |
| FR | 2944664 | A1 | 10/2010 | |
| JP | H05-281996 | A | 10/1993 | |
| JP | H07-28499 | A | 1/1995 | |
| JP | H0811644 | A | 1/1996 | |
| JP | H9-190195 | A | 7/1997 | |
| JP | H9-204197 | A | 8/1997 | |
| JP | H10-51313 | A | 2/1998 | |
| JP | H1091194 | A | 4/1998 | |
| JP | H11-330977 | A | 11/1999 | |
| JP | 2004-138756 | A | 5/2004 | |
| JP | 2006-527864 | A | 12/2006 | |
| JP | 2007519014 | A | 7/2007 | |
| JP | 2007-525718 | A | 9/2007 | |
| JP | 2009-003387 | A | 1/2009 | |
| JP | 2009-008836 | A | 1/2009 | |
| JP | 2009-538460 | A | 11/2009 | |
| JP | 2010-500631 | A | 1/2010 | |
| JP | 2010-501955 | A | 1/2010 | |
| JP | 2012-533094 | A | 12/2012 | |
| JP | 2015-505992 | A | 2/2015 | |
| JP | 2016-523380 | A | 8/2016 | |
| JP | 2016-200750 | A | 12/2016 | |
| JP | 2017-37328 | A | 2/2017 | |
| JP | 2017-522604 | A | 8/2017 | |
| JP | 2017-528752 | A | 9/2017 | |
| KR | 100261253 | B1 | 7/2000 | |
| KR | 20030031936 | A | 4/2003 | |
| KR | 1020050007853 | A | 1/2005 | |
| KR | 1020090077951 | A | 7/2009 | |
| KR | 10-2010-0136890 | | 12/2010 | |
| KR | 1020100136899 | A | 12/2010 | |
| KR | 20130019004 | A | 2/2013 | |
| KR | 1020130054993 | A | 5/2013 | |
| KR | 1020160079056 | A | 7/2016 | |
| KR | 1020160144978 | A | 12/2016 | |
| KR | 20170000933 | A | 1/2017 | |
| RU | 2337414 | C2 | 10/2008 | |
| RU | 2376657 | C2 | 12/2009 | |
| RU | 2413312 | C2 | 2/2011 | |
| RU | 2419891 | C2 | 5/2011 | |
| RU | 2439718 | C1 | 1/2012 | |
| RU | 2483365 | C2 | 5/2013 | |
| RU | 2520402 | C2 | 6/2014 | |
| RU | 2568381 | C2 | 11/2015 | |
| RU | 2596594 | 02 | 9/2016 | |
| RU | 2596596 | C2 | 9/2016 | |
| RU | 2015136540 | A | 3/2017 | |
| RU | 2628162 | 02 | 8/2017 | |
| RU | 2016105619 | A | 8/2017 | |
| TW | 200809770 | A | 2/2008 | |
| TW | 201005730 | A | 2/2010 | |
| TW | 201126510 | A | 8/2011 | |
| TW | 201131550 | A | 9/2011 | |
| TW | 201207839 | A | 2/2012 | |
| TW | 201243832 | A | 11/2012 | |
| TW | 201612896 | A | 4/2016 | |
| TW | 201618080 | A | 5/2016 | |
| TW | 201618086 | A | 5/2016 | |
| TW | 201642246 | A | 12/2016 | |
| TW | 201642247 | A | 12/2016 | |
| TW | 201705126 | A | 2/2017 | |
| TW | 201711021 | A | 3/2017 | |
| TW | 201713061 | A | 4/2017 | |
| TW | 201724085 | A | 7/2017 | |
| TW | 201732779 | A | 9/2017 | |
| WO | 9916050 | A1 | 4/1999 | |
| WO | 2004/072951 | A1 | 8/2004 | |
| WO | 2005/086138 | A1 | 9/2005 | |
| WO | 2005/086139 | A1 | 9/2005 | |
| WO | 2007/073604 | A1 | 7/2007 | |
| WO | 2007/138511 | A1 | 12/2007 | |
| WO | 2008/025918 | A1 | 3/2008 | |
| WO | 2008/046505 | A1 | 4/2008 | |
| WO | 2008/072701 | A1 | 6/2008 | |
| WO | 2009/066869 | A1 | 5/2009 | |
| WO | 2011/048118 | A1 | 4/2011 | |
| WO | 2011/086066 | A1 | 7/2011 | |
| WO | 2011/086067 | A1 | 7/2011 | |
| WO | 2012/000882 | A | 1/2012 | |
| WO | 2012/000882 | A1 | 1/2012 | |
| WO | 2012/126893 | A | 9/2012 | |
| WO | 2014/165668 | A | 10/2014 | |
| WO | 2014/202535 | A | 12/2014 | |
| WO | 2014/202535 | A1 | 12/2014 | |
| WO | 2015/063045 | A1 | 5/2015 | |
| WO | 2015/063227 | A1 | 5/2015 | |
| WO | 2015/071173 | A1 | 5/2015 | |
| WO | 2015/174911 | A1 | 11/2015 | |
| WO | 2016/016121 | A1 | 2/2016 | |
| WO | 2016/142002 | A1 | 9/2016 | |
| WO | 2016/142337 | A1 | 9/2016 | |
| WO | WO-2019092220 | A1 * | 5/2019 | ............. G10L 19/09 |

OTHER PUBLICATIONS

P.A Volkov, "Office Action for RU Application No. 2020120251", dated Oct. 28, 2020, ROSPATENT, Russia.
P.A Volkov, "Office Action for RU Application No. 2020120256", dated Oct. 28, 2020, ROSPATENT, Russia.
D.V.Travnikov, "Decision on Grant for RU Application No. 2020118969", dated Nov. 2, 2020, ROSPATENT, Russia.
Santosh Mehtry, "Office Action for IN Application No. 202037019203", dated Mar. 19, 2021, Intellectual Property India, India.
Hiroshi Ono, "Office Action for JP Application No. 2020-526081", dated Jun. 22, 2021, JPO, Japan.
Hiroshi Ono, "Office Action for JP Application No. 2020-526084", dated Jun. 23, 2021, JPO, Japan.
Dietz, Martin et al., "Overview of the EVS codec architecture." 2015 IEEE International Conference on Acoustics, Signal Processing (ICASSP), IEEE, 2015.
Kazunori Mochimura, "Decision to Grant a Patent for JP application No. 2020-524579", dated Nov. 29, 2021, JPO, Japan.
John Tan, "Office Action for SG Application 11202004173P", dated Jul. 23, 2021, IPOS, Singapore.
Takeshi Yamashita, "Office Action for JP Application 2020-524877", dated Jun. 24, 2021, JPO, Japan.
ROSPATENT Examiner, "Decision on Grant Patent for Invention for RU Application No. 2020118949", dated Nov. 11, 2020, ROSPATENT, Russia.
Tsuyoshi Yamashita, "Office Action for JP Application No. 2020-526154", dated Aug. 25, 2021, JPO, Japan.

(56) References Cited

OTHER PUBLICATIONS

Guojun Lu et al., "A Technique towards Automatic Audio Classification and Retrieval, Forth International Conference an Signal Processing", 1998, IEEE, Oct. 12, 1998, pp. 1142 to 1145.
Hiroshi Ono, "Office Action for JP Application No. 2020-526135", dated May 21, 2021, JPO Japan.
International Telecommunication Union, "G. 729-based embedded variable bit-rate coder: An 8-32 kbit/s scalable wideband coder bitstream interoperable with G.729". ITU-T Recommendation G.729. 1., May 2006.
3GGP TS 26.445, "Universal Mobile TElecommunications System (UMTS); LTE; Codec for Enhanced Voice Services (EVS); Detailed algorithmic description (3GPP TS 26.445 version 13.4.1 Release 13)", ETSI TS 126 445 V13.4.1., Apr. 2017.
Nam Sook Lee, "Office Action for KR Application No. 10-2020-7016100", dated Jan. 13, 2022, KIPO, Republic of Korea.
Nam Sook Lee, "Office Action for KR Application No. 10-2020-7016224", dated Jan. 13, 2022, KIPO, Republic of Korea.
Mam Sook Lee, "Office Action for KR Application No. 10-2020-7015835", dated Jan. 13, 2022, KIPO, Republic of Korea.
Mao Xiaohong, "Examination Report for SG Application No. 11202004228V", dated Sep. 2, 2021, IPOS, Singapore.
Mao Xiaohong, "Search Report for SG Application No. 11202004228V", Sep. 3, 2021, IPOS, Singapore.
Nam Sook Lee, "Office Action for KR Application No. 10-2020-7015512", dated Sep. 9, 2021, KIPO, Republic of Korea.
Tomonori Kikuchi, "Office Action for JP Application No. 2020-524874", dated Jun. 2, 2021, JPO Japan.
Tetsuyuki Okumachi, "Office Action for JP Application 2020-118837", dated Jul. 16, 2021, JPO, Japan.
Tetsuyuki Okumachi, "Office Action for JP Application 2020-118838", dated Jul. 16, 2021, JPO, Japan.
O.E. Groshev, "Office Action for RU Application No. 2020118947", dated Dec. 1, 2020, ROSPATENT, Russia.
O.I. Starukhina, "Office Action for RU Application No. 2020118968", dated Dec. 23, 2020, ROSPATENT, Russia.
Khalid Sayood, "Introduction to Data Compression", Elsevier Science & Technology, 2005, Section 16.4, Figure 16. 13, p. 526.
Patterson et al., "Computer Organization and Design", The hardware/software Interface, Revised Fourth Edition, Elsevier, 2012.
ETSI TS 126 445 V13.2.0 (Aug. 2016), Universal Mobile Telecommunications System (UMTS); LTE; Codec for Enhanced Voice Services (EVS); Detailed algorithmic description (3GPP TS 26.445 version 13.2.0 Release 13) [Online]. Available: http://www.3gpp.org/ftp/Specs/archive/26_series/26.445/26445-d00.zip.
Geiger, "Audio Coding based on integer transform", Ilmenau: https://www.db-thueringen.de/receive/dbt_mods_00010054, 2004.
Henrique S Malvar, "Biorthogonal and Nonuniform Lapped Transforms for Transform Coding with Reduced Blocking and Ringing Artifacts", IEEE Transactions on Signal Processing, IEEE Service Center, New York, NY, US, (199804), vol. 46, No. 4, ISSN 1053-587X, XP011058114.
Anonymous, "ISO/IEC 14496-3:2005/FDAM 9, AAC-ELD", 82. MPEG Meeting;Oct. 22, 2007-Oct. 26, 2007 Shenzhen; (Motion Picture Expert Group or ISO/IEC JTC1/SC29/WG11),, (Feb. 21, 2008), No. N9499, XP030015994.
Virette, "Low Delay Transform for High Quality Low Delay Audio Coding", Université de Rennes 1, (Dec. 10, 2012), pp. 1-195, URL: https://hal.inria.fr/tel-01205574/document, (Mar. 30, 2016), XP055261425.
SO/IEC 14496-3:2001; Information technology—Coding of audiovisual objects—Part 3: Audio.
3GPP TS 26.403 v14.0.0 (Mar. 2017); General audio codec audio processing functions; Enhanced acPlus general audio codec; Encoder specification; Advanced Audio Coding (AAC) part; (Release 14).
ISO/IEC 23003-3; Information technology—MPEG audio technologies—Part 3: Unified speech and audio coding, 2011.
3GPP TS 26.445 V14.1.0 (Jun. 2017), 3rd Generation Partnership Project; Technical Specification Group Services and System Aspects; Codec for Enhanced Voice Services (EVS); Detailed Algorithmic Description (Release 14), http://www.3gpp.org/ftp//Specs/archive/26_series/26.445/26445-e10.zip, Section 5.1.6 "Bandwidth detection".
Eksler Vaclav et al, "Audio bandwidth detection in the EVS codec", 2015 IEEE Global Conference on Signal and Information Processing (GLOBALSIP), IEEE, (Dec, 14, 2015), doi:10.1109/GLOBALSIP.2015.7418243, pp. 488-492, XP032871707.
Oger M et al, "Transform Audio Coding with Arithmetic-Coded Scalar Quantization and Model-Based Bit Allocation", International Conference on Acoustics, Speech, and SignalProcessing, IEEE, XX,Apr. 15, 2007 (Apr. 15, 2007), p. IV-545, XP002464925.
Asad et al., "An enhanced least significant bit modification technique for audio steganography", International Conference on Computer Networks and Information Technology, Jul. 11-13, 2011.
Makandar et al., "Least Significant Bit Coding Analysis for Audio Steganography", Journal of Future Generation Computing, vol. 2, No. 3, Mar. 2018.
ISO/IEC 23008-3:2015; Information technology—High efficiency coding and media delivery in heterogeneous environments—Part 3: 3D audio.
ITU-T G.718 (Jun. 2008): Series G: Transmission Systems and Media, Digital Systems and Networks, Digital terminal equipments—Coding of voice and audio signals, Frame error robust narrow-band and wideband embedded variable bit-rate coding of speech and audio from 8-32 kbit/s.
3GPP TS 26.447 V14.1.0 (Jun. 2017), Technical Specification, 3rd Generation Partnership Project; Technical Specification Group Services and System Aspects; Codec for Enhanced Voice Services (EVS); Error Concealment of Lost Packets (Release 14).
DVB Organization, "ISO-IEC_23008-3_A3_(E)_(H 3DA FDAM3).docx", DVB, Digital Video Broadcasting, C/O EBU—17A Ancienne Route—CH-1218 Grand Saconnex, Geneva—Switzerland, (Jun. 13, 2016), XP017851888.
Hill et al., "Exponential stability of time-varying linear systems," IMA J Numer Anal, pp. 865-885, 2011.
3GPP TS 26.090 V14.0.0 (Mar. 2017), 3rd Generation Partnership Project; Technical Specification Group Services and System Aspects; Mandatory Speech Codec speech processing functions; Adaptive Multi-Rate (AMR) speech codec; Transcoding functions (Release 14).
3GPP TS 26.190 V14.0.0 (Mar. 2017), Technical Specification, 3rd Generation Partnership Project; Technical Specification Group Services and System Aspects; Speech codec speech processing functions; Adaptive Multi-Rate—Wideband (AMR-WB) speech codec; Transcoding functions (Release 14).
3GPP TS 26.290 V14.0.0 (Mar. 2017), Technical Specification, 3rd Generation Partnership Project; Technical Specification Group Services and System Aspects; Audio codec processing functions; Extended Adaptive Multi-Rate—Wideband (AMR-WB+) codec; Transcoding functions (Release 14).
Edler et al., "Perceptual Audio Coding Using a Time-Varying Linear Pre- and Post-Filter," in AES 109th Convention, Los Angeles, 2000.
Gray et al., "Digital lattice and ladder filter synthesis," IEEE Transactions on Audio and Electroacoustics, vol. vol. 21, No. No 6, pp. 491-500, 1973.
Lamoureux et al., "Stability of time variant filters," CREWES Research Report—vol. 19, 2007.
Herre et al., "Enhancing the performance of perceptual audio coders by using temporal noise shaping (TNS)." Audio Engineering Society Convention 101. Audio Engineering Society, 1996.
Herre et al., "Continuously signal-adaptive filterbank for high-quality perceptual audio coding." Applications of Signal Processing to Audio and Acoustics, 1997. 1997 IEEE ASSP Workshop on. IEEE, 1997.
Herre, "Temporal noise shaping, quantization and coding methods in perceptual audio coding: A tutorial ntroduction." Audio Engineering Society Conference: 17th International Conference: High-Quality Audio Coding. Audio Engineering Society, 1999.
Fuchs Guillaume et al., "Low delay LPC and MDCT-based audio coding in the EVS codec", 2015 IEEE International Conference on Acoustics, Speech and Signal Processing (ICASSP), IEEE, (Apr. 19, 2015), doi: 10.1109/ICASSP.2015.7179068, pp. 5723-5727, XP033187858.

(56) References Cited

OTHER PUBLICATIONS

Niamut et al., "RD Optimal Temporal Noise Shaping for Transform Audio Coding", Acoustics, Speech and Signal Processing, 2006. ICASSP 2006 Proceedings. 2006 IEEE International Conference on Toulouse, France May 14-19, 2006, Piscataway, Nj, USA,IEEE, Piscataway, NJ, USA, (Jan. 1, 2006), doi:10.1109/ICASSP.2006. 1661244, ISBN 978-1-4244-0469-8, pp. V-V, XP031015996.
ITU-T G.711 (Sep. 1999): Series G: Transmission Systems and Media, Digital Systems and Networks, Digital transmission systems— Terminal equipments—Coding of analogue signals by pulse code modulation, Pulse code modulation (PCM) of voice frequencies. Appendix I: A high quality low-complexity algorithm for packet loss concealment with G.711.
Cheveigne et al.,"YIN, a fundamental frequency estimator for speech and music." The Journal of the Acoustical Society of America 111.4 (2002): 1917-1930.
Ojala P et al, "A novel pitch-lag search method using adaptive weighting and median filtering", Speech Coding Proceedings, 1999 IEEE Workshop on Porvoo, Finland Jun. 20-23, 1999, Piscataway, NJ, USA, IEEE, US, (Jun. 20, 1999), doi:10.1109/SCFT.1999. 781502, ISBN 978-0-7803-5651-1, pp. 114-116, XP010345546.
"5 Functional description of the encoder", Dec. 10, 2014 (Dec. 10, 2014), 3GPP Standard; 26445-C10_1_S05_S0501, 3rd Generation Partnership Project (3GPP)?, Mobile Competence Centre ; 650, Route Des Lucioles ; F-06921 Sophia-Antipolis Cedex ; France Retrieved from the Internet:URL : http://www.3gpp.org/ftp/Specs/ 2014-12/Rel-12/26_series/ XP050907035.
Nam Sook Lee, "Office Action for KR Application No. 10-2020-7016424", dated Feb. 9, 2022, KIPO, Korea.
Nam Sook Lee, "Office Action for KR Application No. 10-2020-7016503", dated Feb. 9, 2022, KIPO, Korea.
Xiong-Malvar, "A Nonuniform Modulated Complex Lapped Transform", IEEE Signal Processing Letters, vol. 8, No. 9, Sep. 2001. (Year: 2001).
Raj et al., "An Overview of MDCT for Time Domain Aliasing Cancellation", 2014 International Conference on Communication and Network Technologies (ICCNT). (Year: 2014).
Malvar, "Biorthogonal and Nonuniform Lapped Transforms for Transform Coding with Reduced Blocking and Ringing Artifacts", IEEE Transactions on Signal Processing, vol. 46, No. 4, Apr. 1998. (Year: 1998).
Malvar, "Lapped Transforms for Efficient Transform/Subband Coding", IEEE Transactions on Acoustics, Speech, and Signal Processing, vol. 38, No. 6, Jun. 1990. (Year: 1990).
Malvar, "Fast Algorithms for Orthogonal and Biorthogonal Modulated Lapped Transforms", Microsoft Research, 1998. (Year: 1998).
Princen-Bradley, "Analysis/Synthesis Filter Bank Design Based on Time Domain Aliasing Cancellation", IEEE Transactions on Acoustics, Speech, and Signal Processing, vol. ASSP-34, No. 5, Oct. 1986. (Year: 1986).
Shlien, "The Modulated Lapped Transform, Its Time-Varying Forms, and Its Applications to Audio Coding Standards", IEEE Transactions on Speech and Audio Processing, vol. 5, No. 4, Jul. 1997. (Year: 1997).
ETSI TS 126 445 V12.0.0, "Universal Mobile Telecommunications System (UMTS); LTE; EVS Codec Detailed Algorithmic Description (3GPP TS 26.445 version 12.0.0 Release 12)", Nov. 2014.
ETSI TS 126 403 V6.0.0, "Universal Mobile Telecommunications System (UMTS); General audio codec audio processing functions; Enhanced aacPlus general audio codec; Encoder specification; Advanced Audio Coding (AAC) part (3GPP TS 26.403 version 6.0.0 Release 6)", Sep. 2004.
ETSI TS 126 401 V6.2.0, "Universal Mobile Telecommunications System (UMTS); General audio codec audio processing functions; Enhanced aacPlus general audio codec; General description (3GPP TS 26.401 version 6.2.0 Release 6)", Mar. 2005.
3GPP TS 26.405, "3rd Generation Partnership Project; Technical Specification Group Services and System Aspects General audio codec audio processing functions; Enhanced aacPlus general audio codec; Encoder specification parametric stereo part (Release 6)", Sep. 2004.
3GPP TS 26.447 V12.0.0, "3rd Generation Partnership Project; Technical Specification Group Services and System Aspects; Codec for Enhanced Voice Services (EVS); Error Concealment of Lost Packets (Release 12)", Sep. 2014.
ISO/IEC FDIS 23003-3:2011(E), "Information technology— MPEG audio technologies—Part 3: Unified speech and audio coding", ISO/IEC JTC 1/SC 29/WG 11, Sep. 20, 2011.
Valin et al., "Definition of the Opus Audio Codec", Internet Engineering Task Force (IETF) RFC 6716, Sep. 2012.
Nam Sook Lee, "Decision to Grant a Patent for KR Application No. 10-2020-7015511", dated Apr. 19, 2022, KIPO, Republic of Korea.
Nam Sook Lee, "Dedsion to Grant a Patent for KR Application No. 10-2020-7016100", dated Apr. 21, 2022, KIPO, Republic of Korea.
Nam Sook Lee, "Dedsion to Grant a Patent for KR Application No. 10-2020-7015836", dated Apr. 28, 2022, KIPO, Republic of Korea.
Nam Sook Lee, "Dedsion to Grant a Patent for KR Application No. 10-2020-7015512", dated Apr. 20, 2022, KIPO, Republic of Korea.
Nam Sook Lee, "Decision to Grant a Patent for KR Application No. 10-2020-7015835", dated Apr. 22, 2022, KIPO, Republic of Korea.
Nam Sook Lee, "Decision to Grant a Patent for KR Application No. 10-2020-7016224", dated Jul. 25, 2022, KIPO, Republic of Korea.
Audio codec processing functions, Extended Adaptive Multi-Rate— Wideband (AMR-WB+) codec 3GPP TS 26.290 version 9.0.0 Release 9, 2009.09.

* cited by examiner $$H(z) = \frac{1 - \alpha\beta g B(z, 0)}{1 - \beta g B(z, T_{fr})z^{-T_{int}}}$$

130

$g$ : gain value $T_{fr}$ : fractional part of pitch lag $T_{int}$ : integer part of pitch lag $B(z, T_{fr})$ : multi-tap FIR filter depending on fractional part $B(z, 0)$ : multi-tap FIR filter for a zero fractional part $\alpha$ : first scalar value $0.6 \leq \alpha < 1.0$ $\beta$ : second scalar value $0.1 \leq \beta \leq 0.5$

Fig. 13

SIGNAL FILTERING

CROSS-REFERENCE TO RELATED APPLICATIONS

This application is a continuation of copending International Application No. PCT/EP2018/080837, filed Nov. 9, 2018, which is incorporated herein by reference in its entirety, and additionally claims priority from European Application No. EP 17201105.8, filed Nov. 10, 2017, which is also incorporated herein by reference in its entirety.

The present examples relate to systems and methods for performing filtering of signals (e.g., LTP postfilter and/or a pre-filter).

BACKGROUND OF THE INVENTION

The conventional technology comprises the following disclosures:

[1] A. T. Hill and A. Ilchmann, "Exponential stability of time-varying linear systems," IMA J Numer Anal, pp. 865-885, 2011.

[2] 3GPP TS 26.090, Adaptive Multi-Rate (AMR) speech codec; Transcoding functions.

[3] 3GPP TS 26.445, Codec for Enhanced Voice Services (EVS); Detailed algorithmic description.

[4] 3GPP TS 26.190, Adaptive Multi-Rate-Wideband (AMR-WB) speech codec; Transcoding functions.

[5] 3GPP TS 26.290, Extended Adaptive Multi-Rate-Wideband (AMR-WB+) codec; Transcoding functions.

[6] B. Edler, C. Faller and G. Schuller, "Perceptual Audio Coding Using a Time-Varying Linear Pre- and Post-Filter," in AES 109th Convention, Los Angeles, 2000.

[7] A. Gray and J. Markel, "Digital lattice and ladder filter synthesis," IEEE Transactions on Audio and Electroacoustics, vol. vol. 21, no. no. 6, pp. 491-500, 1973.

[8] M. P. Lamoureux, S. Ismail and G. F. Margrave, "Stability of time variant filters," CREWES Research Report—Volume 19, 2007.

[9] P. J. Wilson and H. Chhatwal, "Adaptive Transform Coder Having Long Term Predictor". U.S. Pat. No. 5,012,517, 30 Apr. 1991.

[10] M. Tsushima, Y. Nakatoh and T. Norimatus, "Apparatus for expanding speech bandwidth". EP Patent 0 732 687 B2, 18 Sep. 1996.

[11] A. John Robinson, "Low Bit Rate Audio Coder And Decoder Operating in A Transform Domain Using Vector Quantization". U.S. Pat. No. 5,999,899, 7 Dec. 1999.

[12] J. Thyssen, C. C Lee and J.-H. Chen, "Method And Apparatus To Eliminate Discontinuities In Adaptively Filtered Signals". U.S. Pat. No. 7,353,168 B2, 28 Jun. 2002.

[13] E. Ravelli, M. Jander, G. Pietrzyk, M. Dietz and M. Gayer, "Method and apparatus for processing an audio signal, audio decoder, and audio encoder". EP Patent 2980796 A1, 28 Jul. 2014.

[14] E. Ravelli, C. Helmrich, G. Markovic, M. Neusinger, M. Jander, M. Dietz and S. Disch, "Apparatus and method for processing an audio signal using a harmonic post-filter". EP Patent 2980799 A1, 28 Jul. 2014.

[15] ITU-T Recommendation G.718, Frame error robust narrow-band and wideband embedded variable bit-rate coding of speech and audio from 8-32 kbit/s, 2008.

Audio and speech are in general time varying signals. Because the changes are relatively slow they are usually considered quasi-stationary over short period of time. Adaptive filter parameters (e.g. linear predictive coding, LPC, or long-term post filter, LTP) used for processing audio/speech signals are updated once per frame and kept constant over the frame duration, frame usually having length of 2 to 40 milliseconds. Such filtering is effectively time-varying and thus in general produces instabilities and discontinuities even if filtering with frozen filter parameters doesn't [1].

A cross-fade approach is known. The cross-fade approach may be summarized as:
- filter a portion of a signal with a set of parameters $c_0$ producing first filtered portion
- filter the same portion of the signal with a set of parameters $c_1$ producing second filtered portion; and
- perform cross-fade of the first and the second filtered portion.

The cross-fade approach has been used among others in [9], [10], [11] and [12].

Another approach to remove discontinuities is to use LP filter as in [13].

An infinite impulse response (IIR) filter can be presented in the lattice-ladder form [7]. An interpolation of stable IIR filters in the lattice-ladder form should produce stable time-varying IIR filter [8]. Thus it should be possible to generalize the interpolation of the reflection coefficients from [6] in general case of IIR filters. However such approach would be too complex for the LTP filtering as the number of the non-zero reflection coefficients would be equal to the pitch lag (e.g. if used for smoothing the LTP discontinuities in [3] this would lead to filter orders bigger than 250).

Complexity is very important aspect in a real-time codec and it is desirable to use a method for avoiding discontinuities in time varying filtering with least complexity.

A low-complexity technique is advantageous for performing filtering operations.

SUMMARY

According to an embodiment, a system for filtering an information input signal, divided into different update intervals, according to parameters varying with the update intervals, to obtain a filtered output signal may have: a first filter unit to filter a first filter input signal at least at an initial subinterval in a current update interval to obtain a first filter output signal, according to parameters associated to the preceding update interval, the first filter unit being configured to scale the parameters along at least the initial subinterval, wherein the first filter unit is configured to scale the parameters associated to the preceding update interval by a first scaling factor changing towards 0, or a value close to 0, along at least the initial subinterval; and a second filter unit to filter a second filter input signal, at the initial subinterval, according to parameters associated to the current update interval to obtain a second filter output signal, the second filter unit being configured to scale the parameters along at least the initial subinterval, wherein the second filter unit is configured to scale the parameters associated to the current update interval by a second scaling factor changing from 0, or a value close to 0, toward a value different from 0, or a value more distant from 0 than the value close to 0, along at least the initial subinterval, wherein the first filter input signal is based on the information input signal, the first filter output signal is an intermediate signal, the second filter input signal is based on the intermediate signal, and the filtered output signal is based on the second filter output signal.

According to another embodiment, a method for filtering an information input signal divided into different update intervals, according to parameters associated with the update intervals, to obtain a filtered output signal, may have the steps of: performing a first filtering at least at an initial subinterval of a current update interval according to parameters associated to the preceding update intervals, wherein the parameters along at least the initial subinterval are scaled by a first scaling factor changing towards 0, or a value close to 0, along at least the initial subinterval; and performing a second filtering at least at the initial subinterval, according to parameters associated to the current update interval, wherein the parameters along the initial subinterval are scaled by a second scaling factor changing from 0, or a value close to 0, toward a value different from 0, or a value more distant from 0 than the value close to 0, along at least the initial subinterval, wherein the first filtering is performed on the information input signal and the second filtering is performed on the signal obtained by the first filtering.

Another embodiment may have a non-transitory digital storage medium having a computer program stored thereon to perform the inventive method for filtering an information input signal divided into different update intervals when said computer program is run by a computer.

We present a low complexity technique for avoiding discontinuities, e.g., when Infinite Impulse Response (IIR) filter parameters change in consecutive frames.

In accordance to examples, there is provided a system for filtering an information input signal, divided into different update intervals, according to parameters varying with the update intervals, to obtain a filtered output signal, the system comprising:
 a first filter unit to filter a first filter input signal at least at an initial subinterval in a current update interval to obtain a first filter output signal, according to parameters associated to the preceding update interval, the first filter unit being configured to change the parameters along at least the initial subinterval from a higher-filtering status to a lower-filtering status; and
 a second filter unit to filter a second filter input signal, at the initial interval, according to parameters associated to the current update interval to obtain a second filter output signal, the second filter unit being configured to change the parameters along at least the initial subinterval from a lower-filtering status to a higher-filtering status,
 wherein the first filter input signal is based on the information input signal, the first filter output signal is an intermediate signal, the second filter input signal is based on the intermediate signal, and the filtered output signal is based on the second filter output signal.

Accordingly, discontinuities are reduced and/or avoided and the complexity is reduced, e.g., with respect to the cross-fade technique. There is no need for performing two different filter operations and, subsequently, for cross-fading the two filtered signals: simply, two filtering operations are performed, hence reducing the necessity of performing calculations.

In accordance to examples, there is provided a third filter unit to filter the information input signal, at a subsequent subinterval in the current update interval after the initial subinterval according to parameters associated to the current update interval.

Accordingly, apart from the initial subinterval, the current update interval may operate using the parameters which are most suited for it.

In accordance to examples, there is provided a selector configured to check if the distance between parameters for the current update interval is 0 or within a first threshold, so as to filter the information input signal at least in the initial subinterval using the third filter unit.

In accordance to examples, the third filter unit is configured to maintain the same filtering status along the subsequent interval and or to maintain the filter parameter constant.

In accordance to examples, at least one of the first, second and third filter units operates as long term, LTP, filter.

In accordance to examples, at least one of the first, second, and third unit has a transfer function comprising a numerator and a denominator, wherein the numerator comprises a gain value indicated by the gain information, and wherein the denominator comprises an integer part of a pitch lag indicated by the pitch lag information and a multi-tap filter depending on a fractional part of the pitch lag.

In accordance to examples, the parameters of at least one of the first, second, and third unit are obtained from harmonicity information, gain information, pitch lag information, the integer part of the pitch lag of the information input signal and/or the fractional part of the pitch lag of the information input signal.

In accordance to examples, the parameters of at least one of the first, second and/or third filter unit are parameters of a filter chosen among at least one or a combination of, linear predictive coding, LPC, filter, infinite impulse response, IIR, filter, and/or finite impulse response, FIR, filter.

In accordance to examples, the first filter unit is configured to scale parameters associated to the preceding update interval by a first scaling factor changing towards 0 along at least the initial subinterval and/or the second filter unit is configured to scale parameters associated to the current update interval by a second scaling factor changing from 0 toward a value different from 0 (or from a value close to 0 to a second value more distant from 0 than the value close to 0) along at least the initial subinterval.

In accordance to examples, the first scaling factor and the second scaling factor are non-negative values complementary with each other to a value greater than 0.

In accordance to examples, the first scaling factor is to change towards 0 towards the final extremity of at least the initial subinterval, and/or the second scaling factor is to change from 0 from the initial extremity of the current update interval towards a non-zero value (or from a value close to 0 to a second value more distant from 0 than the value close to 0).

In accordance to examples, there is provided a fourth filter unit configured to filter the information input signal, at least at the initial subinterval, using parameters obtained by interpolating the parameters associated to the current update interval and the parameters associated to the previous update interval.

In accordance to examples, there is provided a selector configured to check if the distance between parameters for the current update interval is within a second threshold, so as to filter the information input signal at least in the initial subinterval using the fourth filter unit.

The system may be further configured to actively set the second threshold on the basis of values associated to the signal.

In accordance to examples, the system may be configured to:
 set the second threshold as a pitch lag distance threshold equal to the minimum between the integer part of the pitch lag at the current update interval and the integer part of the pitch lag at the previous update interval,
 so as to use the fourth filter unit when the distance between the integer part of the pitch lag at the current update interval and the integer part of the pitch lag at the previous update interval is less than the pitch lag distance threshold; and/or so as to use the first and second filter units when the distance between the integer part of the pitch lag at the current update interval and the integer part of the pitch lag at the previous update interval is greater than the pitch lag distance threshold.

In accordance to examples, the system may be configured to:

use a condition associated to the gains of the signal at the current update interval and at the preceding interval, so as to use the fourth filter unit when both the gains of the signal at the current update interval and at the preceding interval are different from zero, and/or so as to use the first and second filter units when at least one of the gains of the signal at the current update interval and at the preceding interval is zero.

In accordance to examples, the first filter unit is to provide the first filter output signal in the form of $$y'[n] = x[n] + s_{k-1}[n]\left(\sum_{i=0}^{P} b_{k-1,i} x[n-i] - \sum_{j=1}^{Q} a_{k-1,j} y'[n-j]\right),$$

$$kT \le n < kT + T_l$$

where $s_{k-1}[n]$ changes towards a value close to 0 when n increases and second filter unit is to provide the second filter output signal in the form of:

$$y[n] = y'[n] + s_k[n]\left(\sum_{i=0}^{P} b_{k,i} y'[n-i] - \sum_{j=1}^{Q} a_{k,j} y[n-j]\right),$$

$$kT \le n < kT + T_l$$

where $s_k[n]$ changes from a value close to 0 towards a non-zero value when n increases, where T is the current $k^{th}$ update interval, $T_l$ the initial subinterval, n an instant, x[n] the information input signal, $b_{k-1,i}$ and $a_{k-1,j}$ are parameters associated to the previous $(k-1)^{th}$ update interval, $a_{k,j}$ and $b_{k,i}$ are parameters associated to the current $k^{th}$ update interval, and P and Q are associated to the type of the filter.

In accordance to examples, the first filter unit is configured to provide the first filter output signal in the form of $$\widehat{x_{ltpf}}'(n) = \hat{x}(n) - \left(1 - \frac{n}{\frac{N_F}{4}}\right)\left[\sum_{k=0}^{L_{num}} c_{num}^{mem}(k)\hat{x}(n-k) + \sum_{k=0}^{L_{den}} c_{den}^{mem}(k, p_{fr}^{mem})\widehat{x_{ltpf}}'\left(n - p_{int}^{mem} + \frac{L_{den}}{2} - k\right)\right]$$

for $n = 0 \ldots \frac{N_F}{4}$ and the second filter unit is configured to provide the filtered output signal (13) in the form of $$\widehat{x_{ltpf}}(n) = \widehat{x_{ltpf}}'(n) - \frac{n}{\frac{N_F}{4}}\left[\sum_{k=0}^{L_{num}} c_{num}(k)\widehat{x_{ltpf}}'(n-k) + \sum_{k=0}^{L_{den}} c_{den}(k, p_{fr})\widehat{x_{ltpf}}\left(n - p_{int} + \frac{L_{den}}{2} - k\right)\right]$$

for $n = 0 \ldots \frac{N_F}{4}$ wherein $$\frac{N_F}{4}$$

is the length of the initial subinterval, x̂(n) is the information input signal, $\widehat{x_{ltpf}}'$ is the intermediate signal, $\widehat{x_{ltpf}}(n)$ is the filtered output signal, n is an instant, $p_{int}^{mem}$ and $p_{fr}^{mem}$ are respectively based on the integer part and fractional part of the pitch lag associated to the preceding update interval, $p_{int}$ and $p_{fr}$ are respectively based on the integer part and fractional part of the pitch lag associated to the current update interval, $c_{num}(k)$ is a coefficient based on the gain value for the current update interval, $c_{den}(k, p_{fr})$ is a coefficient based on the gain value for the determined update interval and on the fractional part of the pitch, $c_{num}^{mem}(k)$ is a coefficient based on the gain value for preceding update interval, $c_{den}^{mem}(k, p_{fr}^{mem})$ is a coefficient based on the gain value for preceding update interval and on the fractional part of the pitch, $L_{den}$ and $L_{num}$ are fixed and/or based on the sampling rate of the input signal.

In accordance to examples, the time length of the initial subinterval is between the 5% and the 40% of the time length of the current update interval.

In accordance to examples, the system is configured to check the gain $g_k$ of the current $k^{th}$ frame and the gain $g_{k-1}$ of the previous $(k-1)^{th}$ frame, so that:

If $g_{k-1}=0$ and $g_k=0$, then there is no first, second, nor third filtering; and/or If $g_{k-1}=0$ and $g_k \ne 0$, then
  the first filtering is deactivated;
  there is second filtering in at least the initial subinterval;
  there is third filtering in the subsequent subinterval; and/or If $g_{k-1} \ne 0$ and $g_k=0$, then
  there is first filtering in at least the initial subinterval;
  the second filtering is deactivated;
  the third filtering is deactivated; and/or If $g_{k-1} \ne 0$ and $g_k \ne 0$, then the difference of the integer and fractional parts of the pitch lag are checked, so that:
  If the integer and fractional parts of the pitch lag in the current $k^{th}$ frame and in the previous $(k-1)^{th}$ frame are the same, then:
    there is no first filtering nor second filtering;
    there is third filtering along the 100% of the current update interval;
  else if there is a difference in the integer or in the fractional part of the pitch lag:
    there is first filtering in at least the initial subinterval;
    there is second filtering by 52 in at least the initial subinterval
    there is third filtering by 53 in the subsequent subinterval.

In accordance to examples, the system comprises an encoder side and a decoder side, wherein at least one of the first, second, third, and/or fourth filter units is at the decoder side.

In accordance to examples, the system comprises an encoder side and a decoder side, wherein at least one of the first, second, third, and/or fourth filter units is at the encoder side.

In accordance to examples, the system comprises a converter for converting a first representation of the information signal into a second representation of the information signal.

In accordance to examples, the system is configured to:
 determine if the first and/or second filter unit will operate as an identity filter; and
 in case of determination, bypass the first and/or second filter.

In accordance to examples, there is provided a method for filtering an information input signal, including different update intervals, according to parameters corresponding to the update intervals, to obtain a filtered output signal, the method comprising:
 performing a first filtering at least at an initial subinterval of a current update interval according to parameters associated to the preceding update intervals, wherein the parameters along at least the initial subinterval are changed from a higher-filtering status to a lower-filtering status; and
 performing a second filtering at least at the initial subinterval, according to parameters associated to the current update interval, wherein the parameters along the initial subinterval are changed from a lower-filtering status to a higher-filtering status,
 wherein the first filtering is performed on the information input signal and the second filtering is performed on the signal obtained by the first filtering.

In accordance to examples, there is provide a non-transitory storage unit storing instructions which, when executed by a processor, cause the processor to perform one of the methods above or below and/or to implement a system as above or below and/or a component of such a system.

The information input signal may be, for example, an audio signal.

In some examples, the interval is the entire frame. In other examples, the interval is smaller than the frame.

Accordingly, the technique above may be only performed for an initial interval or final interval of the determined frame: in the subsequent interval, the parameters for the determined frame may be used, further reducing the computation complexity.

Accordingly, there is no modification of the output in the subsequent interval.

In examples, the interpolation of coefficients may be used instead of the technique discussed above. This may be controlled on the basis of a selection, to better adapt the filtering operations to the signal conditions.

In examples, it is possible to set the second threshold to the minimum between the integer part of the pitch lag at the determined frame and the integer part of the pitch lag at the previous frame (or the subsequent frame), and/or to set the second threshold to the maximum between the gain at the determined frame and the gain at the previous frame or the subsequent frame. Accordingly, it is possible to use the fourth filter unit when the distance between the gain at the determined frame and the gain at the previous frame is less than the second threshold and/or to use the first and second filter units when the distance between the integer part of the pitch lag at the determined frame and the integer part of the pitch lag at the previous frame or subsequent frame is less than the second threshold.

In examples, it is possible to define a condition associated to the gains of the signal at the determined frame and at the preceding or subsequent frame. Accordingly, it is possible to use the fourth filter unit when at least one of the gains of the signal at the determined frame and at the preceding or subsequent frame is zero. In examples, it is possible to use the first and second filter units when both the gains of the signal at the determined frame and at the preceding or subsequent frame are different from zero.

Accordingly, the parameters associated to the previous frame or the subsequent frame and the parameters associated to the determined frame are modified (e.g., sample-by-sample) to perform a graceful filter which avoids and/or reduces the discontinuity between the frames.

Accordingly, the input signals of the first and the second filter units may be easily and coherently damped.

In examples, the first filter unit is configured to provide the first filter output signal (13) in the form of $$\widetilde{x_{ltpf}}'(n) = \hat{x}(n) - \left(1 - \frac{n}{\frac{N_F}{4}}\right)\left[\sum_{k=0}^{L_{num}} c_{num}^{mem}(k)\hat{x}(n-k) + \sum_{k=0}^{L_{den}} c_{den}^{mem}(k, p_{fr}^{mem})\widetilde{x_{ltpf}}'\left(n - p_{int}^{mem} + \frac{L_{den}}{2} - k\right)\right]$$

for $n = 0 \ldots \frac{N_F}{4}$ and the second filter unit (14) is configured to provide the filtered output signal (13) in the form of $$\widetilde{x_{ltpf}}(n) = \widetilde{x_{ltpf}}'(n) - \frac{n}{\frac{N_F}{4}}\left[\sum_{k=0}^{L_{num}} c_{num}(k)\widetilde{x_{ltpf}}'(n-k) + \sum_{k=0}^{L_{den}} c_{den}(k, p_{fr})\widetilde{x_{ltpf}}\left(n - p_{int} + \frac{L_{den}}{2} - k\right)\right]$$

for $n = 0 \ldots \frac{N_F}{4}$ wherein $\frac{N_F}{4}$ is the length of the initial subinterval, $\hat{x}(n)$ is the information input signal (11), $\widetilde{x_{ltpf}}'$ is the intermediate signal, $\widetilde{x_{ltpf}}(n)$ is the filtered output signal (15), n is an instant, $p_{int}^{mem}$ and $p_{fr}^{mem}$ are respectively based on the integer part and fractional part of the pitch lag associated to the preceding frame, $p_{int}$ and $p_{fr}$ are respectively based on the integer part and fractional part of the pitch lag associated to the determined frame, $c_{num}(k)$ and $c_{den}(k, p_{fr})$ are coefficients based on the gain value for the determined frame, $c_{num}^{mem}(k)$ and $c_{den}(k, p_{fr})$ are coefficients based on the gain value for preceding frame, $L_{den}$ and $L_{num}$ are fixed and/or based on the sampling rate of the input signal.

In examples, in the lower filtering status the parameters of a same filter are modified so as to have a value closer to 0 than in the higher filtering status. For example, the parameters may be scaled by scaling factors which gradually vary.

The present invention may be used, for example, for Long Term Post Filtering (LTPF). It is a tool for transform-based audio coding that helps at reducing the inter-harmonic noise. It relies on a post-filter that is applied on the time-domain signal after transform decoding. This post-filter is essentially an infinite impulse response (IIR) filter with a comb-like frequency response controlled by one parameter (pitch lag) or two parameters (pitch lag and gain). For better robustness, the post-filter parameters (a pitch lag and a gain per frame) are estimated at the encoder-side and encoded in a bitstream when the gain is non-zero.

BRIEF DESCRIPTION OF THE DRAWINGS

Embodiments of the present invention will be detailed subsequently referring to the appended drawings, in which:

FIG. 13 shows a transfer function according to an example.

DETAILED DESCRIPTION OF THE INVENTION

In the approach presented here, filtering parameters (also referred to as filter parameters or parameters) are in general different for different update intervals. Two consecutive update intervals may have different parameters. In examples, the update interval may be signal adaptive and its length may be changed or shifted over time.

In some examples, the signal is divided into frames. For example, the frame may be associated to a fixed number of samples and/or a fixed time length (e.g., 20 ms). When transmitted or stored, the frame may be associated to particular parameters, e.g., filtering parameters. Within the same frame, the parameters may be in general constant.

In some examples, the update interval may correspond to a frame. Therefore, when transmitted or stored, the signal may comprise parameters (e.g., filtering parameters) associated to the frame (which is also the update interval), e.g., by data encoded in association with a particular frame.

In some examples, the update interval does not correspond to a pre-defined frame. When transmitted or stored, the signal may comprise parameters associated to the update interval even if they are signalled as being associated to the frame. In some cases, a new frame (with the new parameters) anticipates the new update interval, and the old update interval is still associated to the old parameters. When the update intervals are adaptive (e.g., their length is determined on the fly, on the basis of the characteristics of the signal, for example), of course they in general do not correspond with fixed-length frames. Hence, it is possible to associate parameters to a particular update interval (which in some cases, is associated to a frame).

Figure 1:
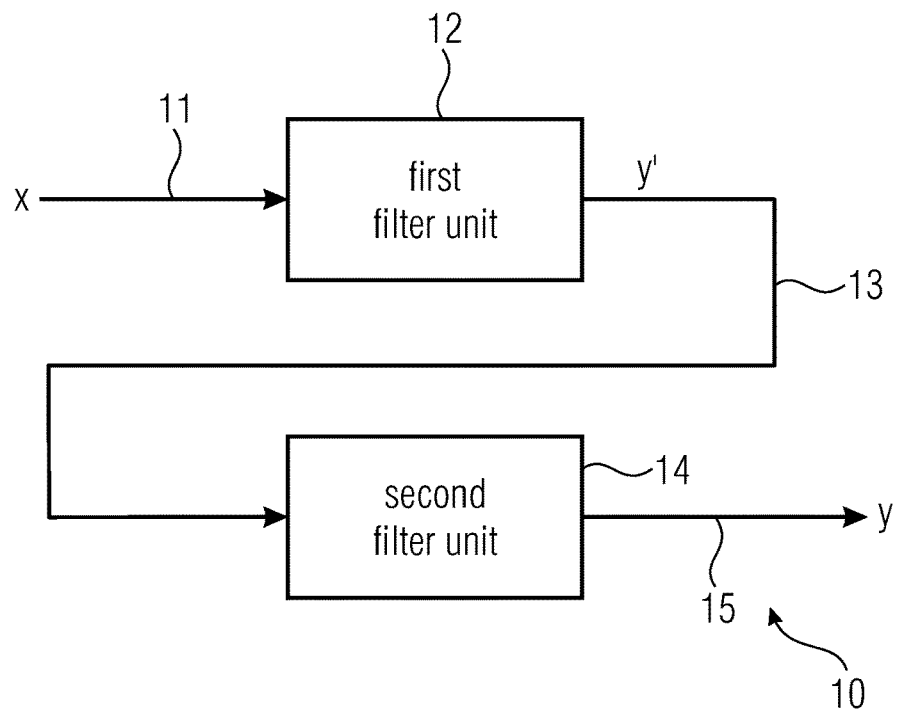
FIGS. 1, 1a, 2, 3, 4, 5a and 5b show systems according to examples.

FIG. 1 shows a system 10 which may be a system for filtering an input signal 11 (indicated as "x" or "x[n]", where "n" refers to the particular sample).

The signal 11 may be an information signal, such as an audio signal. A digital representation of an information signal may be used. The signal may comprise a succession of samples, each acquired at a different time instant (e.g., discrete time instants). The signal may be divided into different frames and/or update intervals (e.g., a succession of samples). Each frame and/or update interval may be constituted by a plurality of samples (e.g., 1, 2, . . . , n, . . . ), e.g., each associated to a discrete time instant). Each frame and/or update interval may be subdivided into an initial subinterval and a subsequent subinterval (the subinterval may be a proper subinterval, as its length may be smaller than the length of the update interval). In general, samples of the initial subinterval precede (are before) the samples of the subsequent subinterval of the same frame and/or update interval. A determined (current, presently processed) frame precedes a subsequent frame and/or update interval and is preceded by a preceding (previous, old) frame. A determined (current, present) update interval precedes a subsequent update interval and is preceded by a preceding (previous, old) update interval. The initial subinterval of an update interval may have a time length which is between 1% and 99%, more in particular 20% and 30% (e.g., one quarter), of the time length of the current update interval. The subsequent subinterval may have a time length which is between 1% and 99%, more in particular 70% and 80% (e.g., three quarters), of the time length of the current update interval.

For some examples, it is referred to "at least one initial subinterval" of the update interval, implying that also the 100% of the update interval may be covered in some examples.

The system 10 may filter the information input signal 11 (x) according to parameters varying with the update intervals (e.g., parameters which, in general, vary in time according to the particular update interval they are associated to, e.g., by virtue of the parameters being encoded and associated to a particular frame). The system 10 may provide a filtered output signal 15 (y or y[n]). The system 10 may provide post-filtered audio signal (e.g., a time domain, TD, representation of a post-filtered audio signal).

The system 10 may comprise a first filter unit 12 to filter the information input signal 11 (first filter input signal). The first filter unit 12 may operate with samples of at least an initial subinterval of a current update interval (a present update interval, such as an update interval which is currently processed), to obtain a first filter output signal which is an intermediate signal 13 (y' or y' [n]). (The at least an initial subinterval may refer, in examples, to only the initial subinterval or, in examples, to an interval bigger than the initial subinterval, such as the update interval). The intermediate signal 13 may be obtained using parameters associated to the preceding update interval (e.g., the update interval preceding the current update interval). The first filter unit 12 is configured to change (e.g., gradually, e.g., by fading, e.g., monotonically) the parameters along at least the initial subinterval from a higher-filtering status to a lower-filtering status. For example, the parameters may be less reduced and/or less damped (hence implying a higher-filtering status) in correspondence to the first samples in the initial subinterval. The parameters may be more reduced and/or more damped (hence implying a lower-filtering status) in correspondence to the last samples in the at least the initial subinterval (where the parameters may be processed to be closer to 0).

The system 10 may comprise a second filter unit 14. The second filter unit 14 may have a second filter input signal and a second filter output signal. The second filter unit 14 may filter the intermediate signal 13 (which is the second filter input signal). The second filter unit 14 may operate with samples of at least the initial subinterval of the current update interval (e.g., the same at least initial subinterval on which the filter unit 12 operates). The second filter unit 14 may filter the intermediate signal according to parameters associated to the current update interval. The second filter unit 14 may be configured to change (e.g., gradually, e.g., by fading, e.g., monotonically) the parameters along at least the initial subinterval from a lower-filtering status to a higher-filtering status. For example, the parameters may be more reduced and/or more damped (hence implying a lower-filtering status) for the first samples in the at least an initial subinterval (where the parameters may be processed to be 0 or close to 0). The parameters may be less reduced and/or less damped (hence implying a higher-filtering status) for the last samples in the at least an initial subinterval.

The lower-filtering status may be such that the impulse response is closer to the impulse response of the identity filter than the impulse response in the higher-filtering status. In some examples, the lower-filtering status and the higher-filtering status may be such that the lower-filtering status implies an increased energy of the impulse response with respect to the energy of the impulse response of the higher-filtering status. In some examples, the lower-filtering status and the higher-filtering status may be such that the lower-filtering status implies a reduced energy of the impulse response with respect to the energy of the impulse response of the higher-filtering status. When the first filter unit 12 operates at the lower-filtering status, it implies an impulse response which is different from (e.g., lower or higher than) the energy implied by the same first filter unit 12 when it operates at higher filtering-status. The same applies to the second filter unit 14. In the lower-filtering status the parameters may be closer to 0 than in the higher-filtering status.

In examples, the first filtering unit 12 may change from the higher-filtering status towards a lower-filtering status, and/or the second filtering unit 14 may change from the lower-filtering status to a higher-filtering status.

In general terms, when changing from the higher-filtering status to the lower-filtering status, the parameters may be modified (e.g., gradually and/or monotonically and/or by fading and/or by damping). In the lower-filtering status, the parameters may be processed to be 0, or may be processed to be closer to 0 than the parameters in the higher-filtering status. For example, in the higher-filtering status the parameters may be less reduced and/or less damped and/or more distant from 0 than in the lower-filtering status.

In lower-filtering status, a filtering effect may be reduced (e.g., the same effect of or an effect close to the effect of the identity filter may be obtained). In higher-filtering status, a strong filtering effect may be obtained.

In higher-filtering status, the input signal is strongly filtered. In lower-filtering status the input signal is not strongly filtered. In examples, the more the parameters are dampened, the lower the filtering status.

The first and/or second filter units 12, 14 may be configured to damp and/or reduce the parameters so that in the higher-filtering status the reduced and/or damped parameters are less damped (e.g., more distant from 0) and/or less reduced than in the lower-filtering status (e.g., close to 0).

The first filtering unit 12 may be configured to scale (e.g., downscale) the parameters using a first damping factor or scaling factor, and/or the second filtering unit 14 may be configured to scale (e.g., downscale) the parameters using a second damping factor or scaling factor. The first damping factor or scaling factor and/or second damping factor or scaling factor may be closer to 0 in the lower-filtering status than in the higher-filtering status.

The first and/or second filter unit 12, 14 may be configured to damp and/or reduce and/or downscale the parameters so that the parameters are damped and/or reduced by first damping factors and/or scaling factors which are closer to 0 in the lower-filtering status than in the higher-filtering status.

The first filter unit 12 may be configured to change the parameters from the higher-filtering status to the lower-filtering status by gradually damping and/or reducing the parameters associated to the preceding update interval, and/or the second filter unit 14 may be configured to change the parameters by gradually increasing and/or enlarging from parameters close to 0 to the parameters associated with the current update interval.

The first filter unit 12 may be configured to change the parameters from the higher-filtering status to the lower-filtering status by using decreasing damping factors and/or scaling factors (e.g., by using damping factors and/or scaling factors which, e.g. gradually, go towards 0). The second filter unit 14 may be configured to change (e.g., gradually) the parameters from the lower-filtering status to the higher-filtering status by enlarging (e.g., gradually) damping factors and/or scaling factors (e.g., by using damping factors and/or scaling factors which, e.g. gradually, depart from 0).

The first filter unit 12 may be configured to change the parameters from the higher-filtering status to the lower-filtering status by applying a decreasing windowing function to the parameters (e.g., a windowing function which goes towards 0, e.g. gradually), and/or the second filter unit 14 may be configured to change the parameters from the lower-filtering status to the higher-filtering status by applying an enlarging windowing function to the parameters (e.g., a windowing function which departs from 0, e.g. gradually).

The parameters may be provided, for example, as control data in the input signal 11. The filters may be, for example, Liner Time Invariant (LTI) Infinite impulse response (IIR) filters (e.g., for LTP postfiltering). The parameters may be or comprise, for example, gain information and/or pitch information.

In particular, the first and second filter units 12 and 14 may be part of an LTP filter (or postfilter), e.g., at a decoder (e.g., an audio decoder). For example, the parameters may be obtained from harmonicity-based measurements. For example, the parameters may be based on a pitch lag T, on an integer part $T_{int}$ of the pitch lag, on a fractional part $T_{fr}$ of a pitch lag, and/or on a gain g, as obtained, for example, at an audio decoder. The parameters may be associated, for example, to an update interval (which in some examples is a frame of a fixed length or may have an adaptive length).

Each of the first and second filter unit may therefore be associated to particular parameters and/or to a particular transfer function. In particular, the transfer function may be of the type having a numerator and a denominator, wherein the numerator comprises a gain value indicated by the gain information, and wherein the denominator comprises an integer part of a pitch lag indicated by the pitch lag information and a multi-tap filter depending on a fractional part of the pitch lag. For example, a transfer function may be:

$$H(z) = \frac{1 - \alpha\beta g B(z, 0)}{1 - \beta g B(z, T_{fr})z^{-T_{int}}}$$

whose parameters may be determined from parameters estimated at the encoder-side and/or decoded from a bitstream. g may be the decoded gain, $T_{int}$ and $T_{fr}$ integer and fractional part of a decoded pitch-lag, α and β two scalars that weight the gain, and $B(z,T_{fr})$ a low-pass FIR filter whose coefficients depend on the fractional part of the decoded pitch-lag. The order and the coefficients of $B(z, T_{fr})$ can also depend on the bitrate and the output sampling rate. A different frequency response can be designed and tuned for each combination of bitrate and output sampling rate. An example of the transfer function 130 is provided in FIG. 13 (other types of filters and/or transfer functions are notwithstanding possible).

Notably, parameters and the transfer function may change for each update interval (which may be one frame according to which the original signal may be subdivided). Therefore, the $k^{th}$ update interval may be associated to an $H_k(z)$ transfer function and parameters such as $T_{int,k}$, $T_{fr,k}$, $g_k$, while the $(k-1)^{th}$ update interval may be associated to an $H_{k-1}(z)$ transfer function and parameters such as $T_{int,k-1}$, $T_{fr,k-1}$, $g_{k-1}$. Therefore, at the $k^{th}$ frame or update interval, the first filter unit 12 may operate using the old parameters $T_{int,k-1}$, while the second filter unit 14 may operated using the updated parameters $T_{int,k}$, $T_{fr,k}$, $g_k$. This process may be performed for at least the initial subinterval (or, in some examples, for the 100%) of the $k^{th}$ updated interval.

More in general, each or at least one of the filters at elements 10 and 12 may be an LTI IIR filter (which may also be represented as H(z)) represented in the form:

$$H(z) = \frac{1 + \Sigma_{i=0}^{P} b_i z^{-i}}{1 + \Sigma_{j=1}^{Q} a_j z^{-j}}$$

or using a linear difference equation:

$$y[n] = x[n] + \sum_{i=0}^{P} b_i x[n-i] - \sum_{j=1}^{Q} a_j y[n-j]$$

The coefficients $b_i$ and $a_j$ may be filter parameters. Notably, the coefficients $b_i$ and $a_j$ may vary, in general, for different frames and/or update intervals.

It has been noted that the filtered signal 15 results in a smooth transition between the preceding $(k-1)^{th}$ update interval and the current $k^{th}$ update interval. Discontinuities between different update intervals are therefore avoided and/or reduced.

Moreover, the processes to perform the filtering functions have a particularly reduced complexity. This kind of system may be used, for example, for a long term post filter (LTPF).

The first and second filter units 12 and 14 may be considered as being connected in series (or cascade, or "one after other").

Figure 1A:
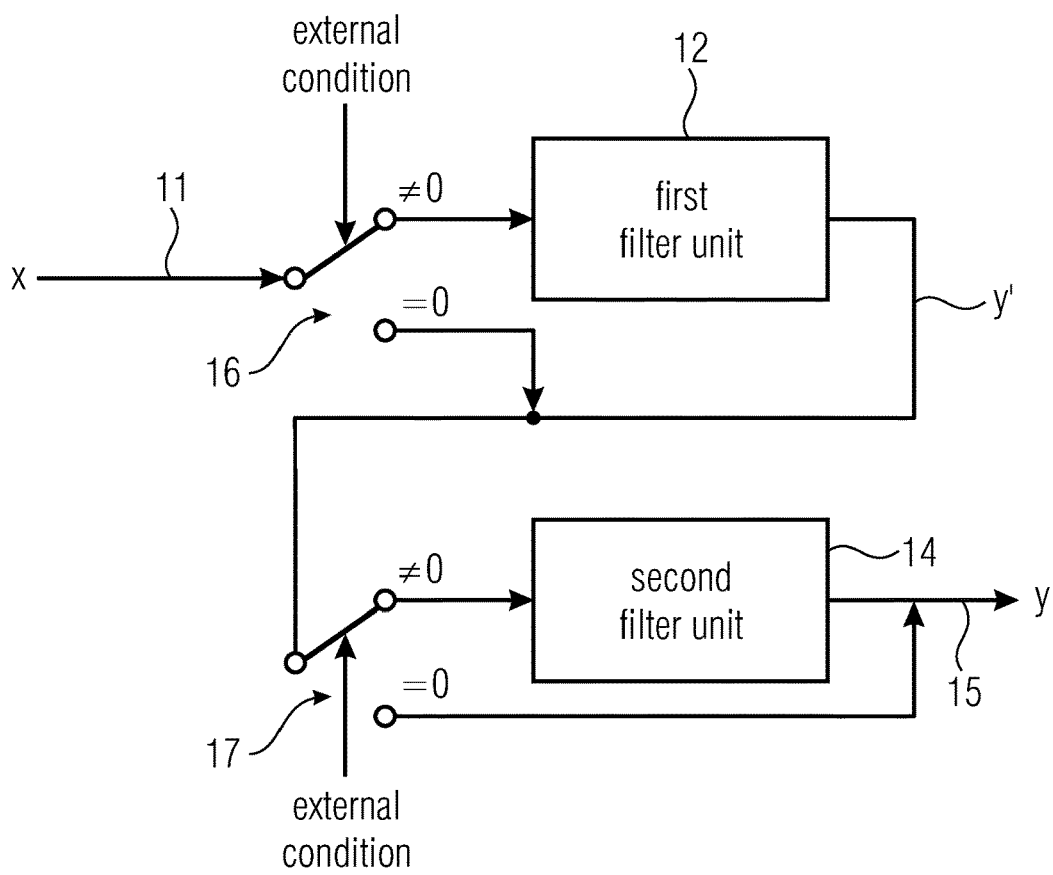

FIG. 1a shows a variant 10' of the system 10 in which the first filter unit 12 and the second filter unit 14 may be bypassed at selectors 16 and 17, respectively. The selectors 16 and 17 may be controlled, for example, by parameters (in FIG. 1a there is shown that an external condition may cause the bypass of a filter unit).

Figure 2:
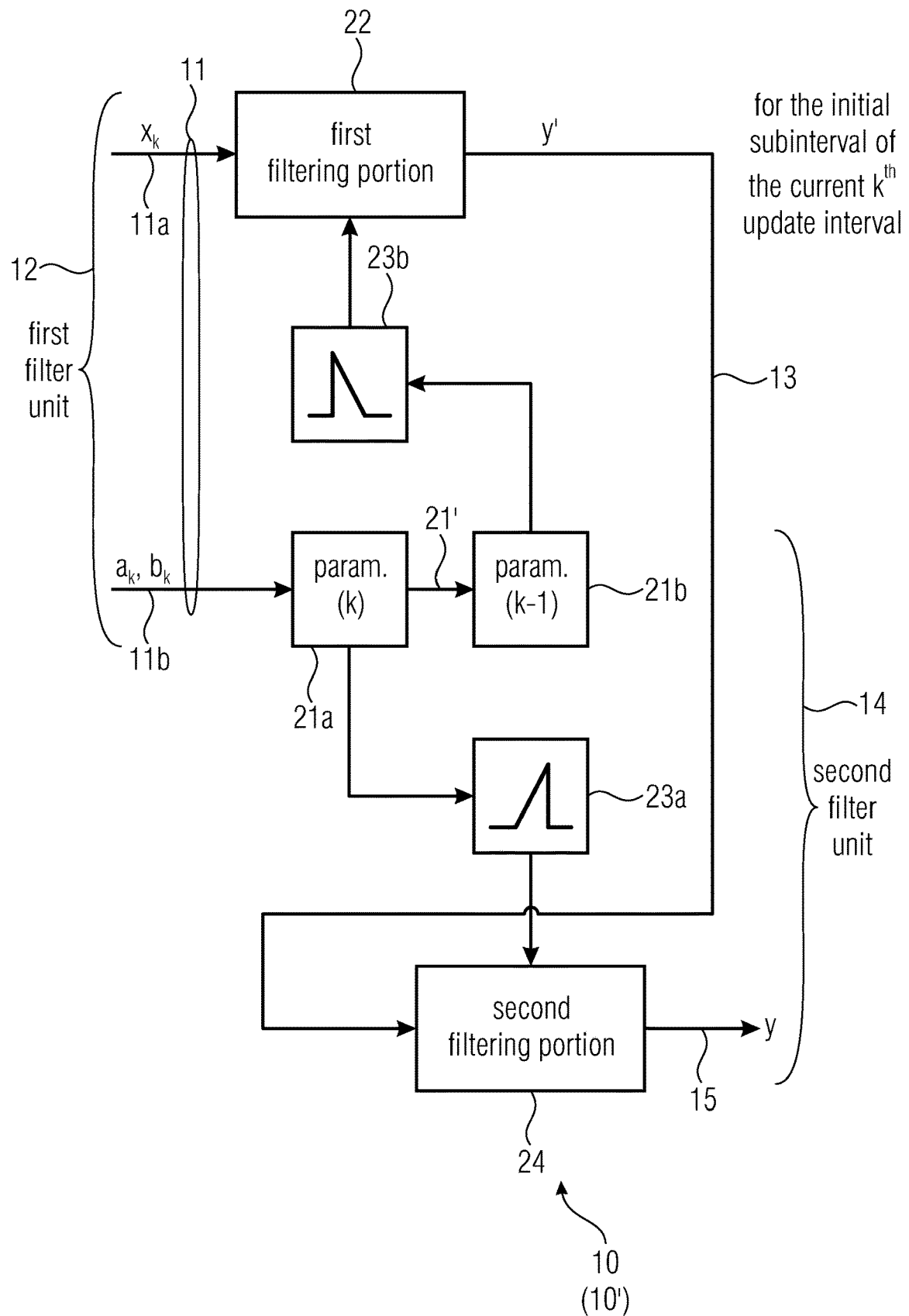

FIG. 2 shows a system 10 which may implement the system of FIG. 1 (also the variant 10' is possible, even if the bypass connections of FIG. 1a here not shown in FIG. 2 for the sake of clarity). The information regarding the current $k^{th}$ update interval of the information input signal (first filter input signal) 11 may comprise a signal representation 11a (e.g., actual values of samples in different instants in the time domain which constitute "x") and control data 11b (which may be, for example, encoded in a bitstream and transmitted from a transmitter or is stored in a memory). The control data 11b may comprise parameters associated to the filtering at the $k^{th}$ frame or update interval (e.g., estimated pitch lag and/or gain values or similar values or processed versions thereof). The parameters for the current $k^{th}$ frame or update interval may be stored in the parameter storage element 21a (e.g., a memory unit, such as a register). A parameter storage element 21b may contain the parameters of the preceding $(k-1)^{th}$ frame or update interval. The arrow 21' refers to the fact that the parameters for a preceding $(k-1)^{th}$ frame or update interval (previously stored at the storage element 21a) become "parameters of the preceding frame or update interval" and are stored at the storage element 21b when the new $k^{th}$ frame or update interval is processed.

The parameters stored in the storage element 21b (which had been prepared for the preceding $(k-1)^{th}$ frame) may be applied to a first filtering portion 22 (which may implement functions of the first filter unit 12) for at least the initial subinterval of the current $k^{th}$ frame or update interval. The parameters stored in the storage element 21a (prepared for the current $k^{th}$ frame) may be applied to a second filtering portion 24 (which may implement functions of the second filter unit 14) for at least the initial subinterval of the current $k^{th}$ frame or update interval.

However, the parameters stored in the storage element 21b (originally prepared for the preceding $(k-1)^{th}$ update interval) may be changed, e.g., by a block 23b, to cause the first filtering portion 22 to move (e.g., gradually, e.g., monotonically) from a higher-filtering status to a lower-filtering status within the initial subinterval of the current $k^{th}$ update interval. For example, the parameters may be scaled (e.g., downscaled, damped) using a damping factor which goes to 0, e.g., a decreasing damping factor (e.g., damping by multiplication). Block 23b may apply a windowing function. The windowing function may change towards 0 and/or decrease in at least the initial subinterval (e.g., from a highest positive value, e.g. 1, at the first sample of the $k^{th}$ current update interval, to a lowest value, e.g. 0, at the last sample of the at least initial subinterval).

For example, the reduction of the filtering effect (e.g., from the higher-filtering status to the lower-filtering status) may be obtained by gradually reducing the damping factor (e.g., from a maximum value, e.g. 1, to a minimum or negligible value, e.g. 0). When the damping factor is negligible (or 0), the parameters are modified to a negligible (or 0) value and the output 13 (y') of the first filtering portion 22 is almost similar to (or the same of) the information input signal 11 (x).

The parameters stored in the storage element 21a (associated to the current $k^{th}$ frame or update interval) may be changed by a block 23a to cause the second filtering portion 24 to move (e.g., gradually, e.g., monotonically) from a lower-filtering status to a higher-filtering status within at least the initial subinterval of the current $k^{th}$ frame or update interval. For example, the parameters may be scaled (e.g., downscaled, damped) by an increasing damping factor (e.g., by multiplication), which may enlarge from 0 or a value close to 0 to a value more distant to 0. Block 23a may apply a windowing function. The windowing function may increase or otherwise change (e.g., from a lower-filtering status towards a higher-filtering status) from an initial time instant of the initial subinterval to a final time instant of the initial subinterval (e.g., from a value close to 0 to a value more distant from 0, and/or from a lowest value at the first sample of the initial subinterval to a positive highest value, e.g. 1, at the last sample of the initial subinterval of the $k^{th}$ current frame or update interval or at the last sample of the frame or update interval).

For example, the increase of the filtering effect (e.g., from a lower-filtering status towards a higher-filtering status) may be obtained by gradually enlarging from 0 or a value close to 0 to a value more distant from 0, e.g., by enlarging or increasing (e.g., monotonically or strictly monotonically) the damping factor (e.g., from a value close to 0 to a value more distant from 0, and/or from a minimum or negligible value, e.g. 0, to a maximum value, e.g. 1). When the damping factor is negligible (or 0), the parameters are modified to a negligible (or 0) value and the output of the second filtering portion 24 is almost similar to (or the same of) its input (which is the intermediate signal y' or 13).

In examples, the parameters for the first and/or second filter units 12, 14 may be modified during the succession of the samples of at least the initial subinterval, by factors (e.g., the scaling factors of blocks 23a, 23b) which are complementary with each other to a constant value (e.g., a positive value, such as 1), so that their sum is constant. In examples, the variation of the factors may be linear (e.g., describable with a $1^{st}$-degree equation).

In examples, the first filtering portion 22 and the second filtering portion 24 may share the same hardware/software structure, whose output changes only by virtue of the input of different inputs and/or parameters and/or factors.

Notably, the parameters may be associated, in the storage elements 21a and 21b, to a particular length of the subinterval or to the 100% of update interval. Therefore, it may be known which percentage (or in any case which portion) of the update interval or frame is to be smoothed. In some cases, a user selection (e.g., set during a configuration session) may define the length of the at least a subinterval.

Figure 3:
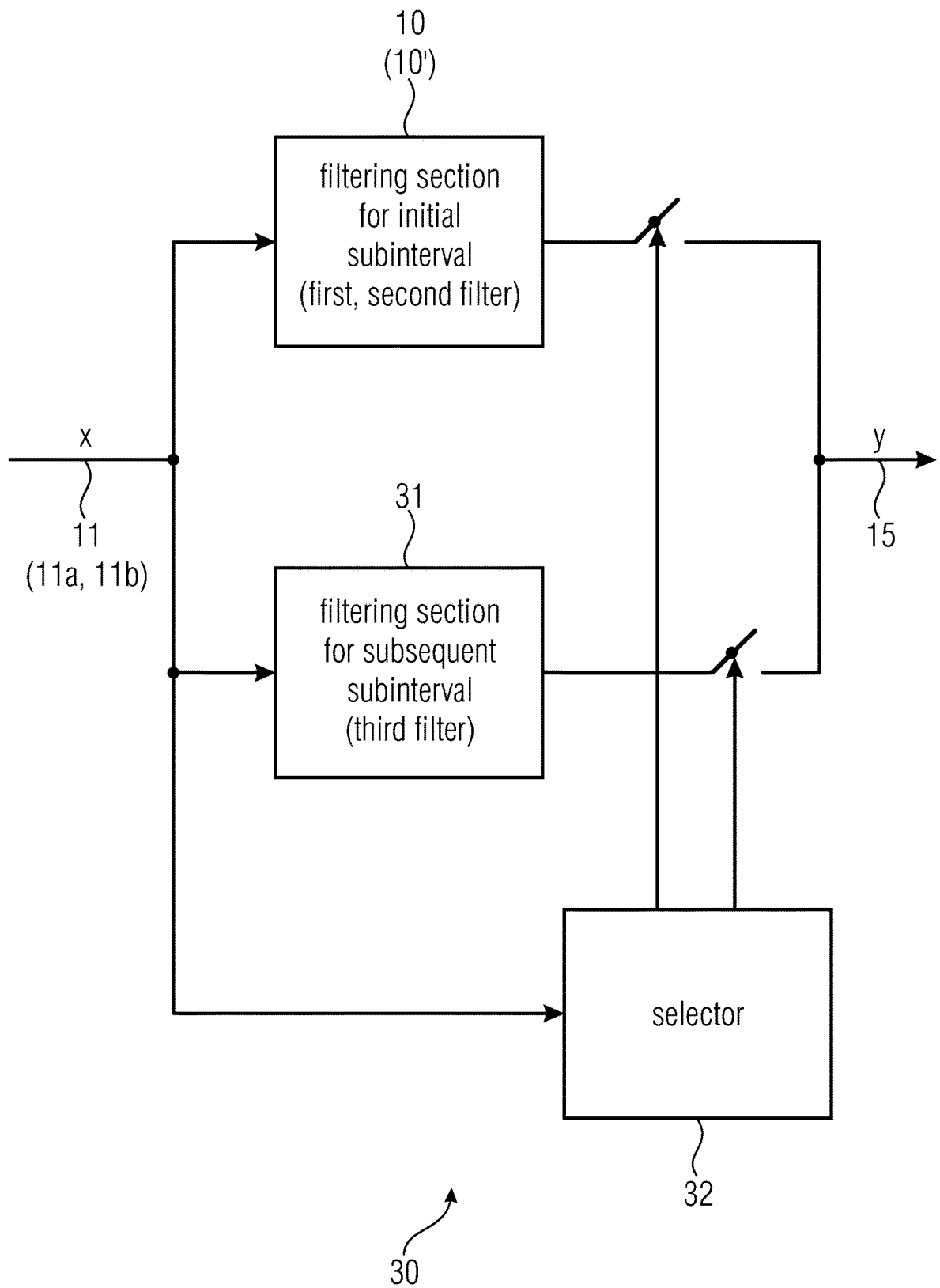

FIG. 3 shows a system 30 which may comprise a filtering section 10 (or 10', even if the bypass connections are not shown in FIG. 3) for the at least initial subinterval and a filtering section 31 for the subsequent subinterval (where the double-filtering technique of FIGS. 1 and 2 is used in the 100% of the update interval, the "filtering section for the subsequent subinterval" does not operate). The filtering section for the initial subinterval may be the same of the system 10. The filtering section 31 for the subsequent subinterval may be configured for filtering the signal in the current $k^{th}$ update interval after the end of the part filtered by the filtering section 10 for at least the initial subinterval (which may be the subsequent interval following the initial subinterval). The filtering section 31 for the subsequent interval may be a third filter lacking of damping parameters. Therefore, the third filtering section 31 may simply apply the parameters originally prepared for the current update interval.

A selector 32 may monitor the information input signal 11 and change between the use of filtering section 10 for the initial subinterval and use of the filtering section 31 for the subsequent interval. Notably, the filtering section 31 for the subsequent interval (third filter) may be made of structural and/or functional blocks used for the first and/or second filters 12 and 14.

In addition or in alternative, the selector 32 may decide if, during the initial subinterval, the filtering section 10 (with the first and second filters 12, 14) is to be used for the initial subinterval or if the filtering section 31 is to be used for at least the initial subinterval (besides using the filtering section 31 for the subsequent subinterval, in case). The decision may be based on particular conditions, which may, for example, be based on the parameters (e.g., on comparisons between parameters' values associated to the current update interval and parameters' values associated to the previous update interval). Some examples of this decision are provided in following passages.

The filters at elements 22, 24, and 31 may be LTP postfilter as discussed above or more in general LTI IIR filters (which may also be represented as H(z)) and can be presented in the form:

$$H(z) = \frac{1 + \sum_{i=0}^{P} b_i z^{-i}}{1 + \sum_{j=1}^{Q} a_j z^{-j}}$$

or using a linear difference equation:

$$y[n] = x[n] + \sum_{i=0}^{P} b_i x[n-i] - \sum_{j=1}^{Q} a_j y[n-j]$$

Figure 10:
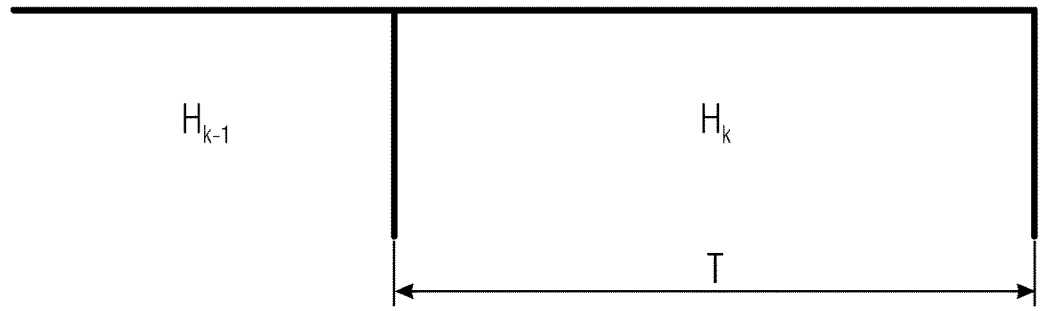
FIGS. 10 and 11 show temporal diagrams according to examples.
Figure 11:
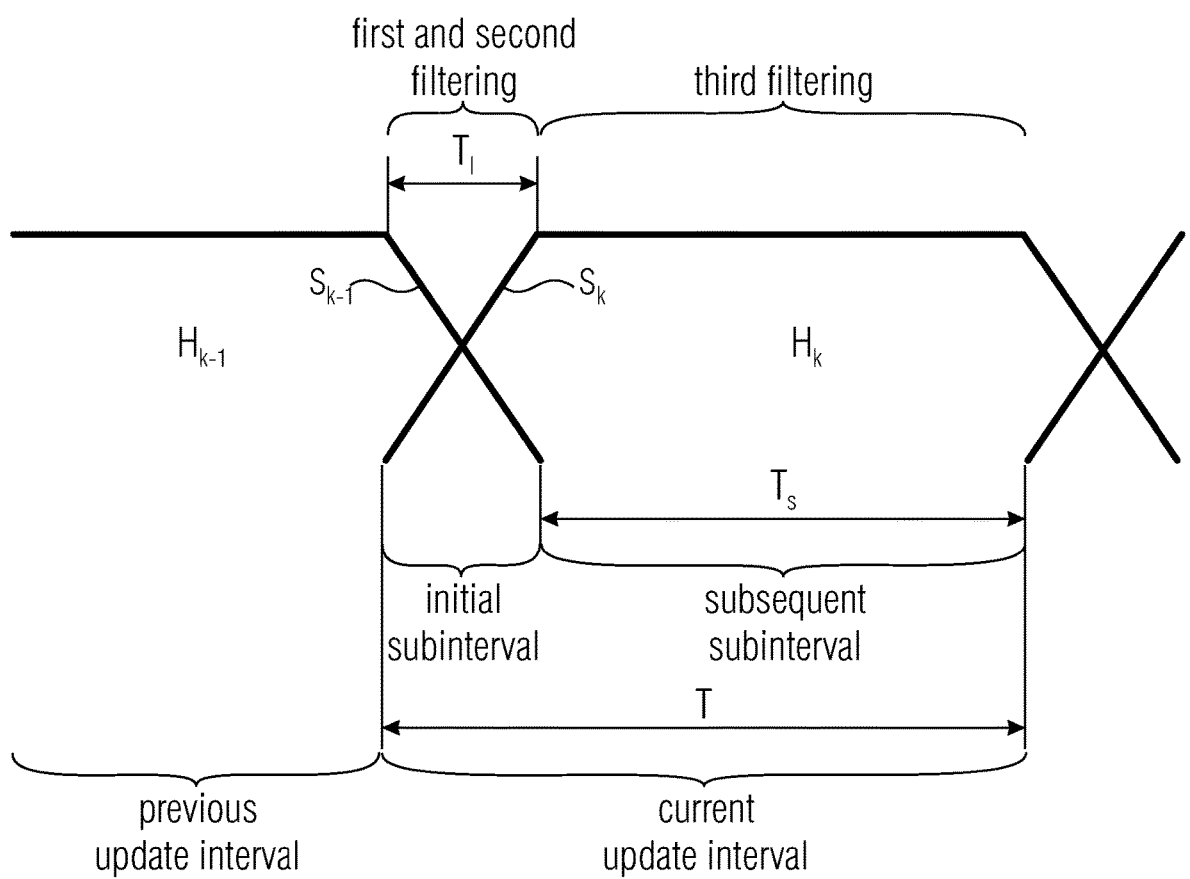

The coefficients $b_i$ and $a_j$ may be filter parameters. FIG. 10 shows the update interval T in association with a filter $H_k$ (e.g., at the current $k^{th}$ update interval) and a preceding interval in association with the filter $H_{k-1}$ (e.g., at the previous $(k+)^{th}$ date interval). Notably, FIG. 11 shows the update interval (or frame) T, initial subinterval $T_I$ in which both the filters are used, and the subsequent subinterval $T_s = T - T_I$, in which only the filtering section 31 for the subsequent interval is used. (In the examples in which the 100% of the update interval (or frame) T is filtered twice by elements 12 and 14, it may be understood that $T = T_I$, i.e., the subinterval is the same as the interval and the subsequent interval does not exist.)

We consider a time varying filter that is in update interval k equal to the LTI IIR filter $H_k$ (which may be an LTP postfilter):

$$H_k(z) = \frac{1 + \sum_{i=0}^{P} b_{k,i} z^{-i}}{1 + \sum_{j=1}^{Q} a_{k,j} z^{-j}}$$

$$y[n] = x[n] + \sum_{i=0}^{P} b_{k,i} x[n-i] - \sum_{j=1}^{Q} a_{k,j} y[n-j], \, kT \leq n < (k+1)T$$

where T relates to the update interval (and may consist in a discrete number of samples) and k is its index, k−1 being associated to the preceding $(k-1)^{th}$ update interval. The third filtering section 31 may be of this type. P and Q may be specific to the filter (e.g., feedforward filter order and feedback filter order, respectively). Q may be for example related to the maximum possible value for $T_{int}$.

The first filter elements 12 and/or 22 may output an intermediate signal y' in the form:

$$y'[n] = x[n] + s_{k-1}[n]\left(\sum_{i=0}^{P} b_{k-1,i} x[n-i] - \sum_{j=1}^{Q} a_{k-1,j} y'[n-j]\right),$$

$$kT \leq n < kT + T_I$$

where $s_{k-1}[n]$ changes towards 0 when n increases for $kT-T_l \leq n < (k+1)T$ $$e.g., s_{k-1}[n] = 1 - \frac{n-kT}{T_l}, kT \leq n < kT + T_l$$

where $T_l$ relates to the initial subinterval.

The second filter elements 14 and/or 24 may output a filtered output signal y in the form:

$$y[n] = y'[n] + s_k[n]\left(\sum_{i=0}^{P} b_{k,i} y'[n-i] - \sum_{j=1}^{Q} a_{k,j} y[n-j]\right), kT \leq n < kT + T_l$$

$$s_k[n] = \frac{n-kT}{T_l} = 1 - s_{k-1}[n], kT \leq n < kT + T_l$$

Notably, the filtered output value y[n] has an input based on the intermediate filter output y'[n] provided by the first filter.

Figure 4:
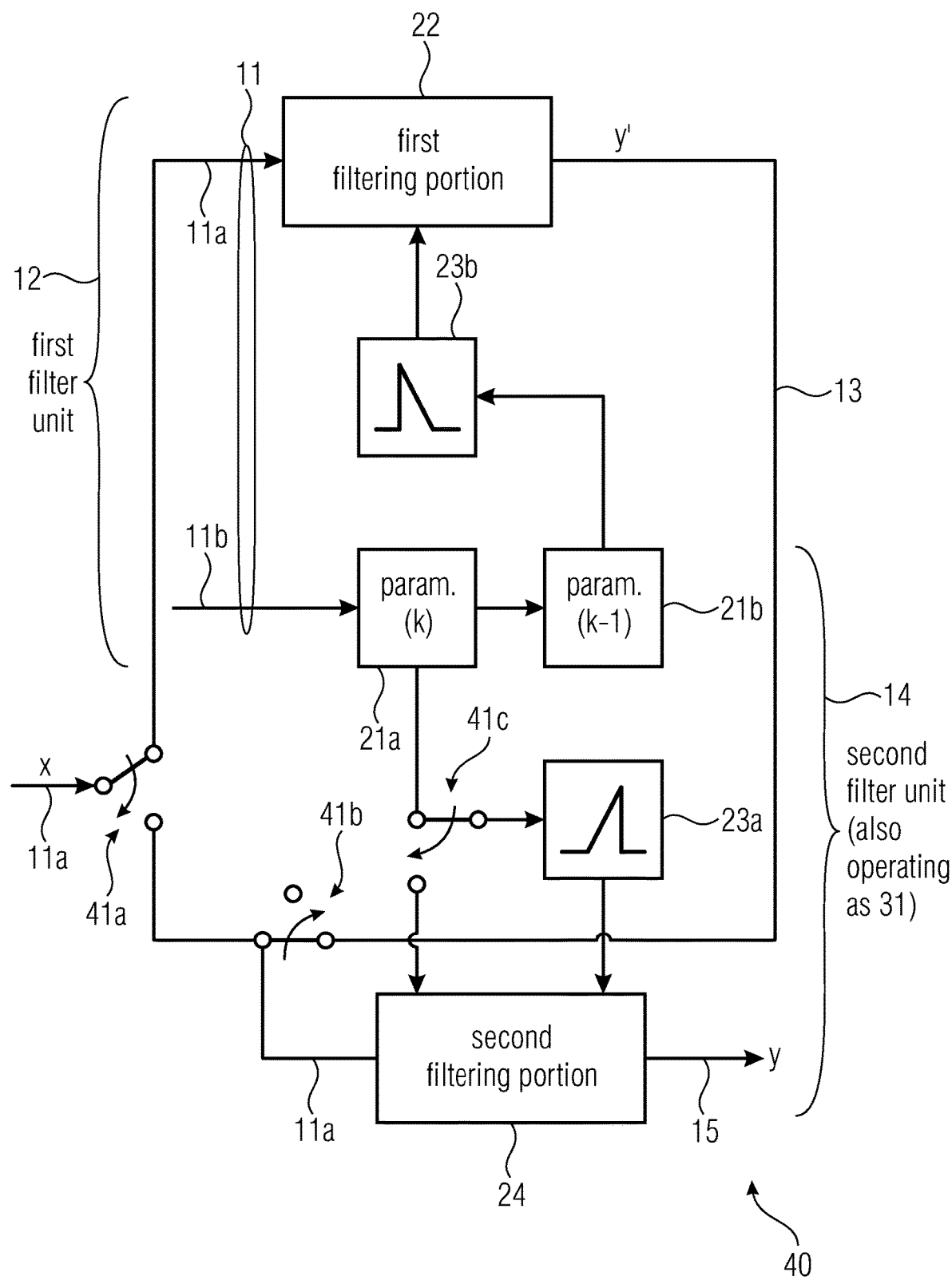

FIG. 4 shows a system 40 as a modification of the system of FIG. 2. A selector (not shown) may change from the use of a first mode in which the initial subinterval ($T_l$) is filtered (as by system 10) and the use of a second mode in which the subsequent subinterval of the current update interval is filtered. As represented by the deviator 41a and the switch 41b, after having filtered the information input signal x at the initial subinterval as in FIG. 2, the first filtering portion 22 may be bypassed by deviator 41a. Accordingly, the second filtering portion 24 may be directly fed with the representation 11a of the information input signal x. As represented by the deviator 41c, the parameters stored in the storage element 21a may be directly used at the second filtering portion 24 without being damped, i.e., bypassing the block 23a. In FIG. 4, therefore, the role of the third filter unit 31 for filtering the subsequent interval of the current interval is taken by the second filtering portion 24. (In the examples, in which the 100% of the update interval is filtered twice by elements 22 and 24, the deviators are in the same status of permitting both the elements 22 and 24 to perform the filtering.)

Figure 5A:
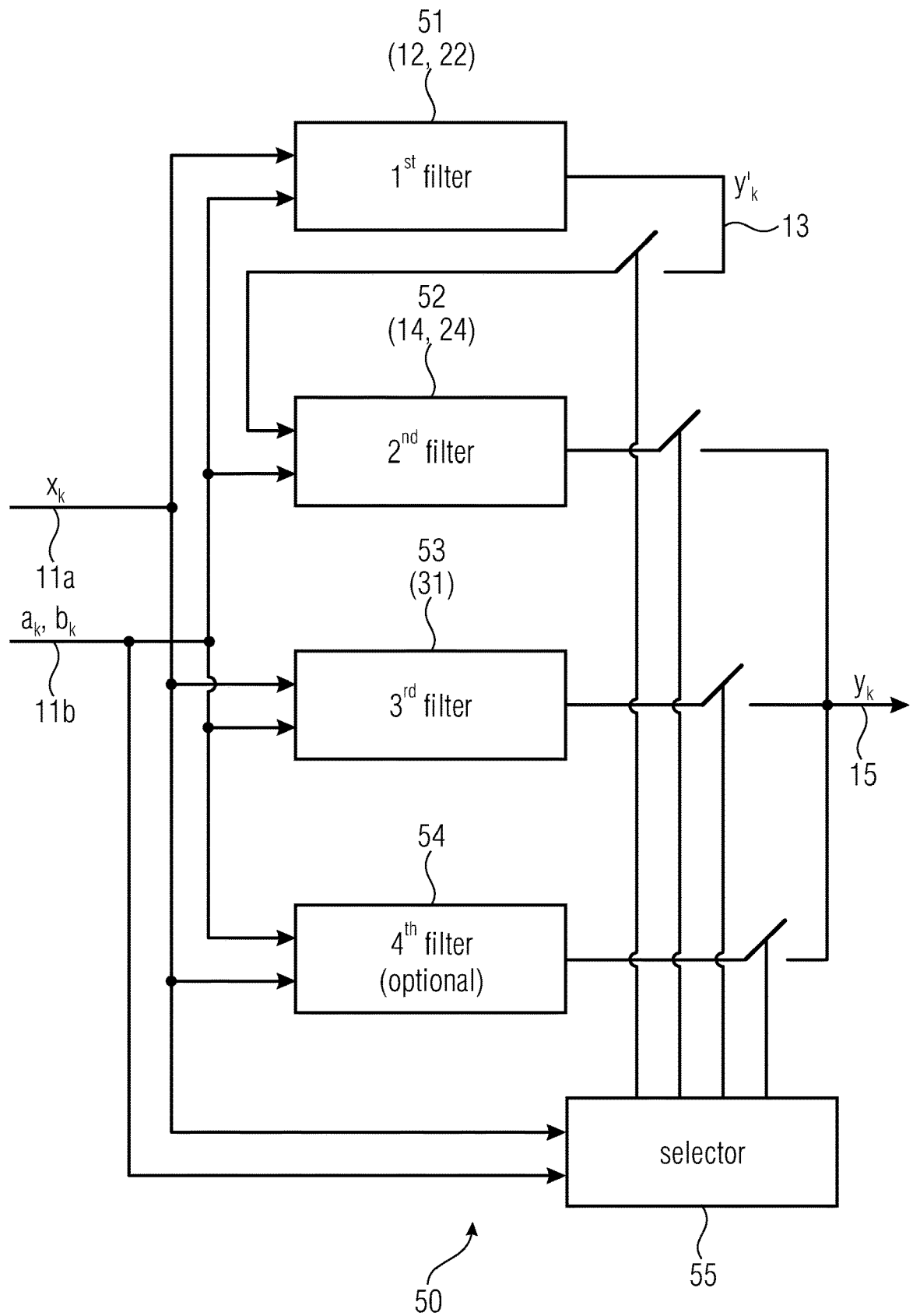

FIG. 5a shows a system 50. The system 50 may comprise a first filter unit 51 (which may be, for example, the unit 12 configured as in FIG. 1 or 1a), a second filter unit 52 (which may be, for example, the unit 14 configured as in FIG. 1 or 1a), and/or a third filter unit 53, and/or a fourth filter unit 54 (which may be optional). In examples, some of these filter units may be the same (e.g., obtained with the same hardware) and be distinguished from each other only by the input and/or the parameters. A selector 55 may direct the signal representation 11a of the information input signal 11 to any of the filter units 51-54 on the basis of the values of the signal representation 11a and/or the control data 11b.

In some examples, the first, second and third filter units 51, 52, and 53 are obtained as in FIG. 4. Therefore, second filter unit 52 may also perform the activities of the third filter unit 53.

The first filter unit 51 may implement the first filter unit 12 and/or the first filtering portion 22 and be used for filtering the initial subinterval of a current $k^{th}$ update interval with parameters (originally associated to the preceding $(k-1)^{th}$ update interval) which move from a higher-filtering status to a lower-filtering status. The second filter unit 52 may implement the second filter unit 14 and/or the second filtering portion 24 and be used for filtering the initial subinterval of the current update interval with parameters (actually associated to the current $k^{th}$ update interval) which move from a lower-filtering status to a higher-filtering status. The third filter unit 53 may implement the third filtering section 31 for the subsequent interval of the current update interval.

The fourth filter unit 54 may implement a filter for filtering the initial subinterval of a current $k^{th}$ update interval with parameters obtained by interpolating the parameters for the preceding $(k-1)^{th}$ update interval and the parameters for the current $k^{th}$ update interval.

The selector 55 may operate:
in the initial subinterval ($T_l$), by choosing among:
 a filtering operation based on the combined action of the first filter unit 51 and second filter unit 52;
 a filtering operation based on the third filter unit 53; and
 a filtering operation based on the fourth filter unit 54;
in the subsequent interval, by using the third filter unit 53.

With reference to the decision for the initial subinterval, the selector 55 may operate, for example, by using a first and/or one second threshold and/or conditions (e.g., conditions on the gain of the signal in subsequent update intervals). For example, the selector 55 may choose:
 the combined action of the first filter unit 51 and second filter unit 52 when the distance between the parameters of the current $k^{th}$ update interval and those of the preceding $(k-1)^{th}$ update interval is high, e.g., over a second threshold;
 the action of the fourth filter unit 54 only when the distance between the parameters of the current $k^{th}$ update interval and those of the preceding $(k-1)^{th}$ update interval is smaller (e.g., under the second threshold); and/or
 the action of the third filter unit 53 only when the distance between the parameters is less than a first threshold (which may be less than the second threshold) and/or when the parameters of the current $k^{th}$ update interval are the same of the parameters of the preceding $(k-1)^{th}$ update interval.

The second threshold may be actively set, for example, as the minimum between the integer part of the pitch lag at the current update interval and the integer part of the pitch lag at the previous update interval.

In addition or in alternative, it is also possible to use a condition based on the gain of the signal at the previous update interval, so as to use the fourth filter unit 54 when the distance between the gain at the determined (current) update interval and the gain at the previous update interval is less than the first and/or second threshold. Accordingly, the second threshold as well as the condition on the gain may be modified in real time, e.g., to obtain a better filtering behaviour.

Figure 5B:
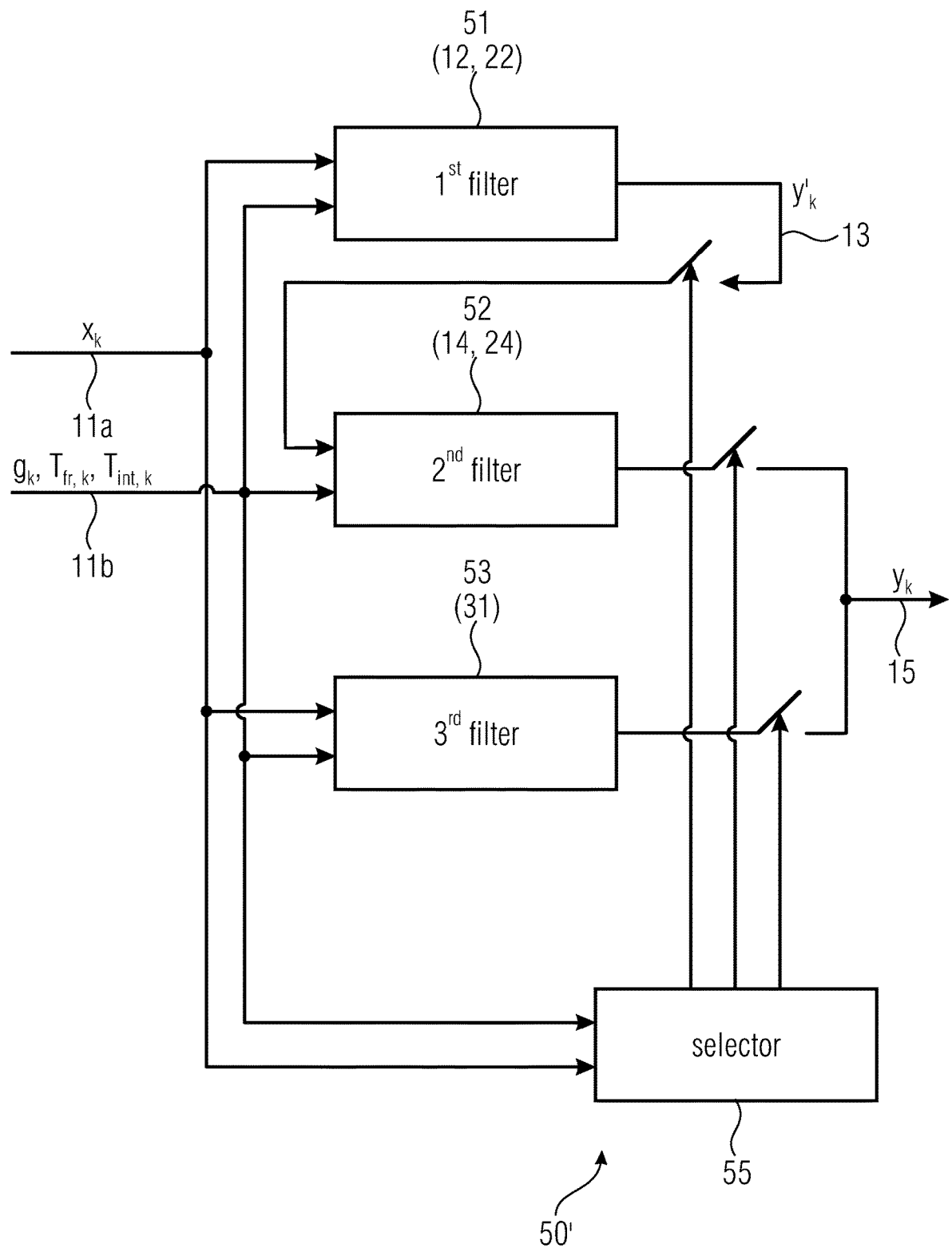

FIG. 5b shows an implementation for LTP postfilter in which the fourth filter 54 is not used (it may comprise, for example, the units 12 and 14 configured as in FIG. 1 or 1a).

Figure 6:
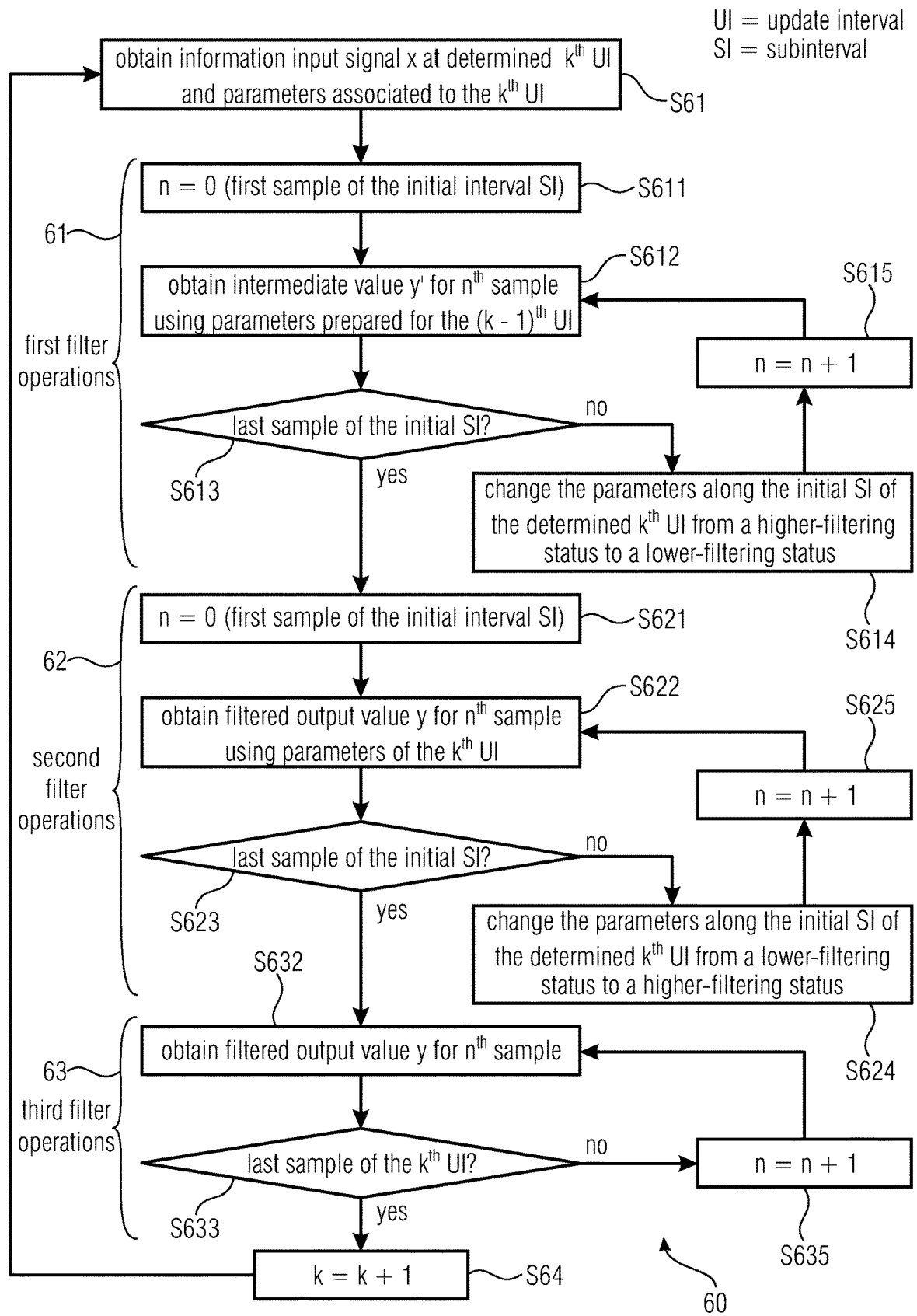
FIGS. 6, 7, and 7a show methods according to examples.

FIG. 6 shows a method 60 in which "UI" refers to an "update interval" and "SI" to a "subinterval". According to the method 60, an information input signal 11 (x) may be obtained (e.g., from an encoder). In particular, the signal 11 may comprise a signal representation 11a (associated, for example, to an audio signal to be filtered) and control data 11b (which may comprise, for example, filter parameters associated to a current update interval).

At step S61, an input information signal (e.g., x, 11) may be obtained for a (determined) current $k^{th}$ update interval together with parameters associated to the current $k^{th}$ update interval.

Then, first filter operations 61 may be performed (e.g., by any of the components 12, 22, 51) for the initial subinterval of the current $k^{th}$ update interval, by cycling the value (index) n among a plurality of samples of the initial subinterval. At S611, the first sample of the initial subinterval may be taken into consideration by initializing the variable n (as n=0). At S612, an intermediate value y' [n] is obtained using parameters associated to the preceding $(k-1)^{th}$ update interval. At 613 ("last sample of the initial SIT"), it is checked whether n has reached the value associated to the last sample of the initial subinterval (e.g., it is checked whether n is the last index of the initial subinterval). If n has reached the last value (index) of the initial subinterval, the first filter operations 61 are concluded and the second filter operations 62 are initiated. Otherwise, at S614 ("change the parameters along the initial SI of the current $k^{th}$ UI from a higher-filtering status to a lower-filtering status"), the parameters are changed so as to move from a higher-filtering status to a lower filtering status (e.g., by reducing the factors at block 23b of FIG. 2). At S615, a new sample is taken into consideration (by updating the index, e.g., by n=n+1) and step S612 is repeated for the new index n.

The second filter operations 62 may be performed (e.g., by any of the components 14, 24, 52) for the initial subinterval of the current $k^{th}$ update interval, by cycling the value (index) n among a plurality of samples of the initial subinterval. At S621, the first sample (of r n=0) of the initial subinterval may be taken into consideration by initializing the variable n to 0. At S622, a filtered output value y[n] is obtained using parameters associated to the current $k^{th}$ update interval. At S623 ("last sample of the initial SI?"), it is checked whether the index n has reached the value associated to the last sample of the initial subinterval (e.g., it is checked whether n is the last index of the initial subinterval). If the index n has reached the last value of the initial subinterval, the second filter operations 62 are concluded and the third filter operations 63 are initiated. Otherwise, at S624 ("change the parameters along the initial SI of the current $k^{th}$ UI from a lower-filtering status to a higher-filtering status"), the parameters are changed so as to move from a lower-filtering status to a higher filtering status (e.g., enlarging the values from 0 or a value close to 0 to a value more distant from 0, e.g. by increasing the values of the factors at block 23a). At S625, a new sample is taken into consideration (n=n+1) and step S612 is invoked.

The third filter operations 63 are performed (e.g., by any of the components 31, 24, 53) for the subsequent (e.g., final) subinterval of the current $k^{th}$ update interval, by cycling the value (index) n among a plurality of samples of the subsequent interval. At S632, a filtered output value y[n] is obtained using parameters associated to the current $k^{th}$ update interval. At 633, it is determined whether the index n has reached the value associated to the last sample of the current $k^{th}$ update interval (e.g., it is checked whether if n is the last index of the update interval). If n has reached the last value of the update interval, the third filter operations 63 are concluded. Otherwise, at S635, a new sample is taken into consideration (e.g., by updating the index by n=n+1) and step S632 is repeated with the new index n.

At the end of the method, all the values y[n] of the filtered output signal have been obtained. The value of the index k may be updated at S64. Step S61 may be invoked again for a $(k+1)^{th}$ update interval.

It is noted that it is not strictly needed for step S61 to be after any of steps S611-S63. In some examples, the information input signal at a current $k^{th}$ update interval may also have been obtained during the processing of the operations 61-63. In examples, the information input signal at a current $k^{th}$ update interval may have been obtained a priori.

In the examples in which the first and second filtering operations are performed for the 100% of the update interval, the third filtering operations 63 are not performed.

Figure 7:
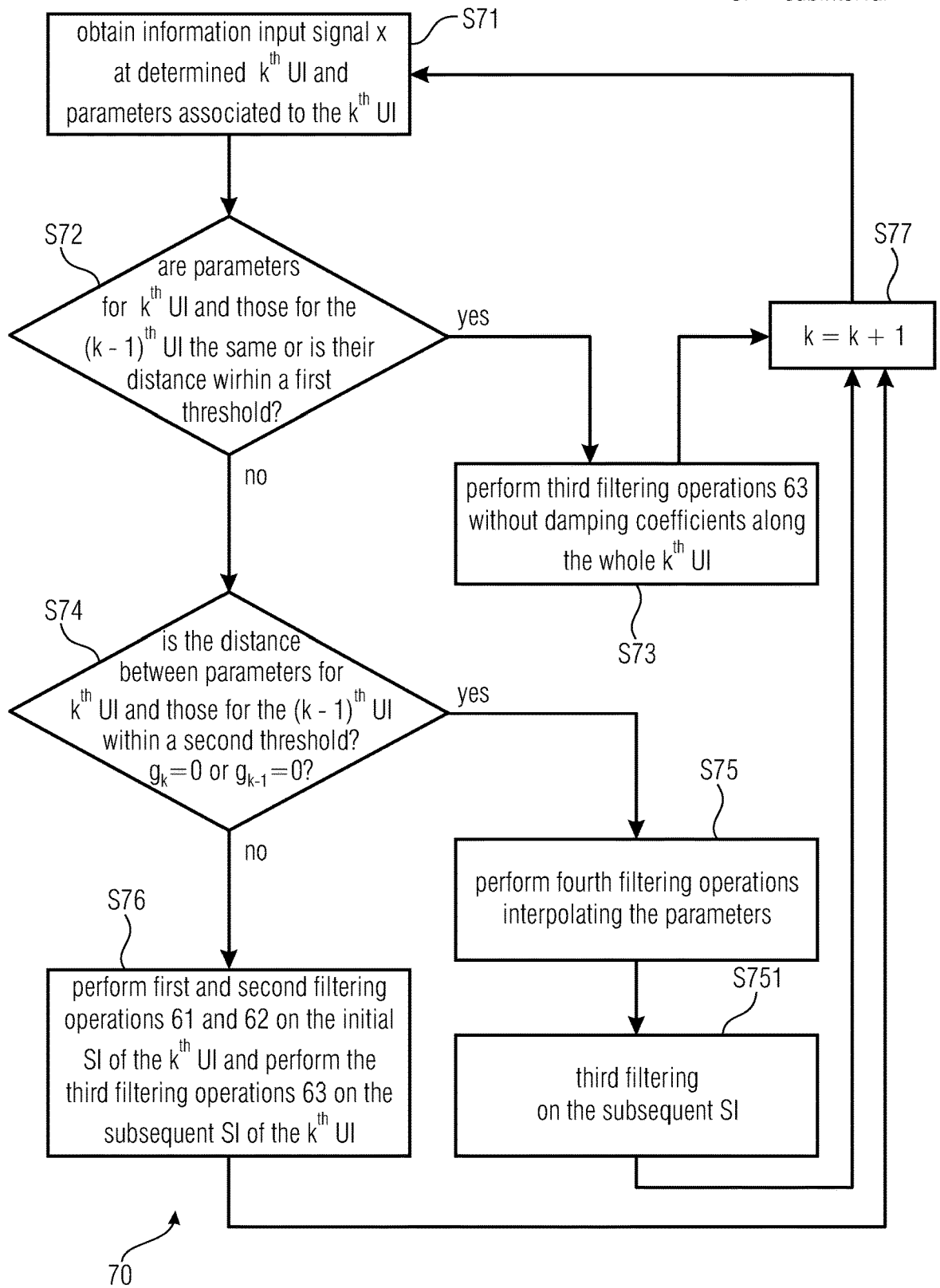

FIG. 7 shows a method 70 ("UI" refers to an "update interval" and "SI" to a "subinterval"). The method 70 may comprise a step S71 ("Obtain information input signal x at $k^{th}$ UI and parameters associated to the $k^{th}$ UI") in which, for the current $k^{th}$ update interval, the signal x and the parameters associated to the signal x at the current $k^{th}$ update interval are obtained.

At step S72 ("Are parameters for $k^{th}$ UI and those for the $(k-1)^{th}$ UI the same or is their distance within a first threshold?"), a first comparison is performed: the parameters for the current $k^{th}$ update interval are compared to the parameters for the preceding $(k-1)^{th}$ update interval (e.g., by selector 55). If the parameters are the same or a distance between a parameter of the $k^{th}$ update interval and a parameter of the $(k-1)^{th}$ update interval is within a first (low) threshold, at S73 ("Perform third filtering operations 63 without damping coefficients along the whole $k^{th}$ UI") third filtering operations 63 are performed using, for the current $k^{th}$ update interval (both the initial subinterval and the subsequent subinterval), the parameters associated to the current $k^{th}$ update interval (as these parameters are the same or almost the same for the two consecutive update intervals, it is not needed to damp or smooth them: therefore, it is possible to apply the third filter 31 or 53 to the whole update interval, without distinguishing the initial subinterval from the subsequent subinterval). Subsequently, at S77, the value of k is updated and the new $(k+1)^{th}$ update interval may now be filtered. This decision may be taken, for example, by any of the selectors shown in FIGS. 4 and 5. for example.

If the distance between the parameters is over the first threshold, a second check may be performed: for example, at S74 ("Is the distance between parameters for $k^{th}$ UI and those for the $(k-1)^{th}$ UI within a second thresholds? $g_k=0$ or $g_{k-1}=0$?") the parameters for the current $k^{th}$ update interval are compared to the parameters for the preceding $(k-1)^{th}$ update interval (e.g., at selector 55). The parameters checked at S74 may also be different from those checked at S72. If the distance between the parameters for the current $k^{th}$ update interval and those for the preceding $(k-1)^{th}$ update interval is within a second threshold (which may be higher than the first threshold), at S75 ("Perform fourth filtering operations interpolating the parameters") a fourth filtering operation (e.g., by the fourth filter unit 54) may be operated at the initial subinterval of the current $k^{th}$ update interval. In this case, the parameters to be applied to the initial subinterval may be obtained by interpolating (and/or averaging) the parameters for the preceding $(k-1)^{th}$ update interval and those for the current $k^{th}$ update interval. After that, a third filtering 63 may be operated at S75' ("$3^{rd}$ filtering on the subsequent SI") for the subsequent interval. Subsequently, at S77 ("k=k+1"), k is updated and the new $(k+1)^{th}$ update interval may now be filtered.

If at S74 it is verified that the distance between the parameters for the current $k^{th}$ update interval and those for the preceding $(k-1)^{th}$ update interval is over the second threshold, at step S76 ("Perform first and second filtering operations 61 and 62 on the initial SI of the $k^{th}$ UI and perform the third filtering operations 63 on the subsequent SI of the $k^{th}$ UI") the first, second, and third filtering operations 61, 62, 63 may be operated (e.g., by the elements 12, 14, 22, 24, 31, 51, 52, and/or 53): therefore, the first subinterval of the current update interval may be first filtered by any of 12, 22, 51, and/or 61 and then by any of 14, 24, 52 and/or 62, and the subsequent subinterval is filtered using any of 31, 53, and/or 63. Subsequently, at S77, k is updated and the new $(k+1)^{th}$ update interval may be filtered.

In examples, at least another condition may be set, in addition or in alternative (in some cases, at step S74). In some examples it is provided that, in order to initiate step S76, the condition has to be verified. In examples, the condition at S74 may comprise at least one of:

- If the gain of the determined (current) update interval is zero ($g_k=0$), then the first filter is used, the second filter is not used and third filter is not used (and, where provided, the fourth filter is not used).
- If the gain of the previous update interval is zero ($g_{k-1}=0$), then the first filter is not used, the second filter is used, the third filter is used (and, where provided, the fourth filter is not used).
- If both the gains of the previous and the current update intervals are different from zero ($g_{k-1} \neq 0$ and $g_k \neq 0$) then what is used is dependent on other parameters (e.g., we may look, in some examples, to the difference of the integer and/or fractional parts of the pitch lags).

In some examples, step S74 may be performed before step S72.

In some examples, only one comparison is performed. Therefore, there are examples, which do not have the steps S72 and S73 and there are examples which do not have the steps S74 and S75.

In some examples, only one comparison is performed. Therefore, there are examples, which do not have the steps S72 and S73 and there are examples which do not have the steps S74 and S75.

In examples, the first and/or second threshold(s) is(are) (or other conditions on the parameters, e.g., on the gain) for the first and/or second steps S72, S74, may be obtained in real time, e.g., from values of the parameters.

In some examples relating to an LTP filter, a second threshold may be a pitch lag distance threshold defined so as to use the fourth filter unit 54 (and/or interpolation) when the distance (e.g., modulo difference) between parameters of the current $k^{th}$ update interval and parameters of the preceding $(k-1)^{th}$ update interval is less than the minimum between the integer part of the pitch lag associated to the $k^{th}$ update interval and the integer part of the pitch lag associated to the $(k-1)^{th}$ update interval. Therefore, the second comparison at step S74 may be:

$$|T_{int,k} - T_{int,k-1}| < \min(T_{int,k}, T_{int,k-1})$$

where $T_{int,k}$ and $T_{int,k-1}$ are the integer parts of the pitch lag at update intervals k and k−1, respectively. Accordingly, the second comparison at S74 may, in some examples, check if both the two following conditions apply:

$$T_{int,k} < 2 T_{int,k-1}$$

$$T_{int,k} > \tfrac{1}{2} T_{int,k-1},$$

Hence, the second comparison at S74 be such that, in order to perform the filtering with the fourth filter unit 54, it is needed that the integer pitch is not increasing (from the $(k-1)^{th}$ update interval to the $k^{th}$ update interval) for more than 100% nor decreasing for more than 50%: i.e., that there is no pitch doubling or halving between the previous update interval and the current update interval.

Analogously, the second comparison at S74 be such that the first and second filtering (e.g., using any of the elements 12, 14, 51, 52, etc.) may be triggered when it is verified that $$|T_{int,k} - T_{int,k-1}| \geq \min(T_{int,k}, T_{int,k-1})$$

which is how to say that at least one of the two following conditions is verified:

$$T_{int,k} \geq 2 T_{int,k-1}$$

$$T_{int,k} \geq \tfrac{1}{2} T_{int,k-1},$$

Hence, the first and second filter units may be activated (e.g., by the selector 55) when the integer part of the pitch lag at the current $k^{th}$ update interval varies extremely with respect to the integer part of the pitch lag at the previous $(k-1)^{th}$ update interval.

Another condition may be set. For example, step S74 may provide that, in order to perform the first and second filtering operations 61 and 62 (e.g., with the first and second filter unit 12 and 14), at least one the following conditions is to be verified:

$$g_k=0$$

$$g_{k-1}=0$$

When $g_{k-1}=0$ an effect may be obtained which is the same of skipping the first filter. When $g_k=0$ an effect may be obtained which is the same of skipping the second filter.

A condition may be that, if both the following conditions is verified:

$$g_k \neq 0$$

$$g_{k-1} \neq 0$$

in that case, the difference between the integer parts of the pitch lags (of the current and the previous frames) is checked at S74 (e.g., as discussed above).

In this example it may be seen that:
1) if the parameters between the current update interval and the preceding interval are the same, for the current update interval it is used the same filter of the previous update interval (third filter unit 53);
2) if the parameters of the current update interval and the parameters of the preceding update interval are the extremely different or if at least one of the gains is zero, it is advantageous to use the first and second filters (12, 24, 14, 24, 51, 52, 61, 62);
3) if the gains of the current and the previous update interval are both different from 0, then it is determined from the pitch lag which filter should be used.

Notably, (2) increases quality as compared to (1) and (3). (2) has lower complexity then conventional technology.

In some examples, the fourth filter unit 54 is not used and, therefore, the second verification at S74 are not performed and only a comparison with an extremely small threshold (or a comparison on the exact value) may be performed.

Other examples (e.g., non-LTP filters) may be based on other parameters. However, the present method performs for any IIR filter.

In general terms, if there is a parameter difference, then the first and the second filter are used. Otherwise the third filter is used in the initial subinterval.

The present solution may be used for example when LPC parameters change in a Code-Excited Linear Prediction (CELP) codec. That way discontinuities, that exist even after subframe based line spectral frequencies (LSF) interpolation, in CELP may be handled. Another example where this technique can be used is filtering for formant enhancement in CELP codecs.

Figure 8:
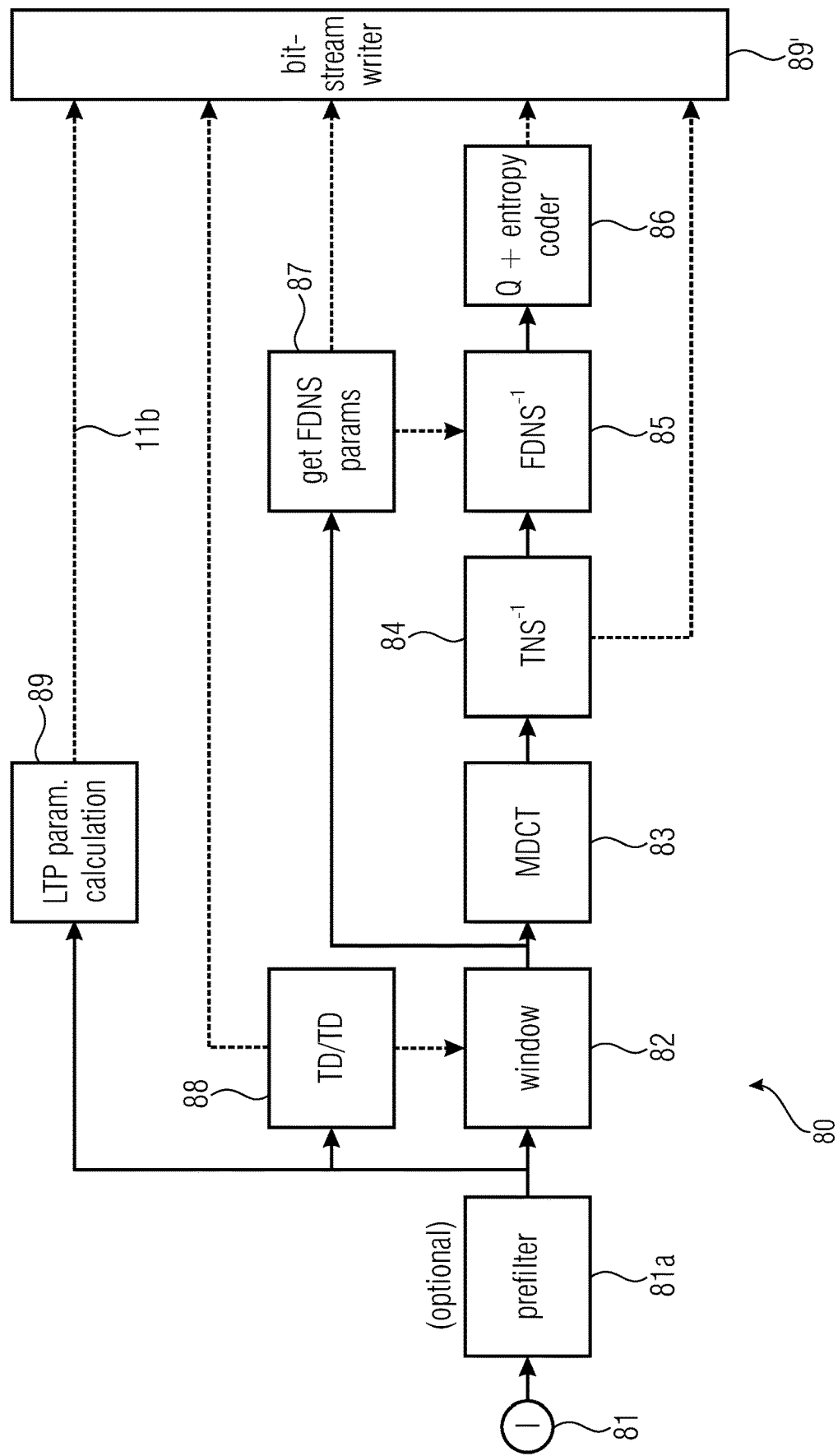
FIGS. 8 and 9 show systems according to examples.
Figure 9:
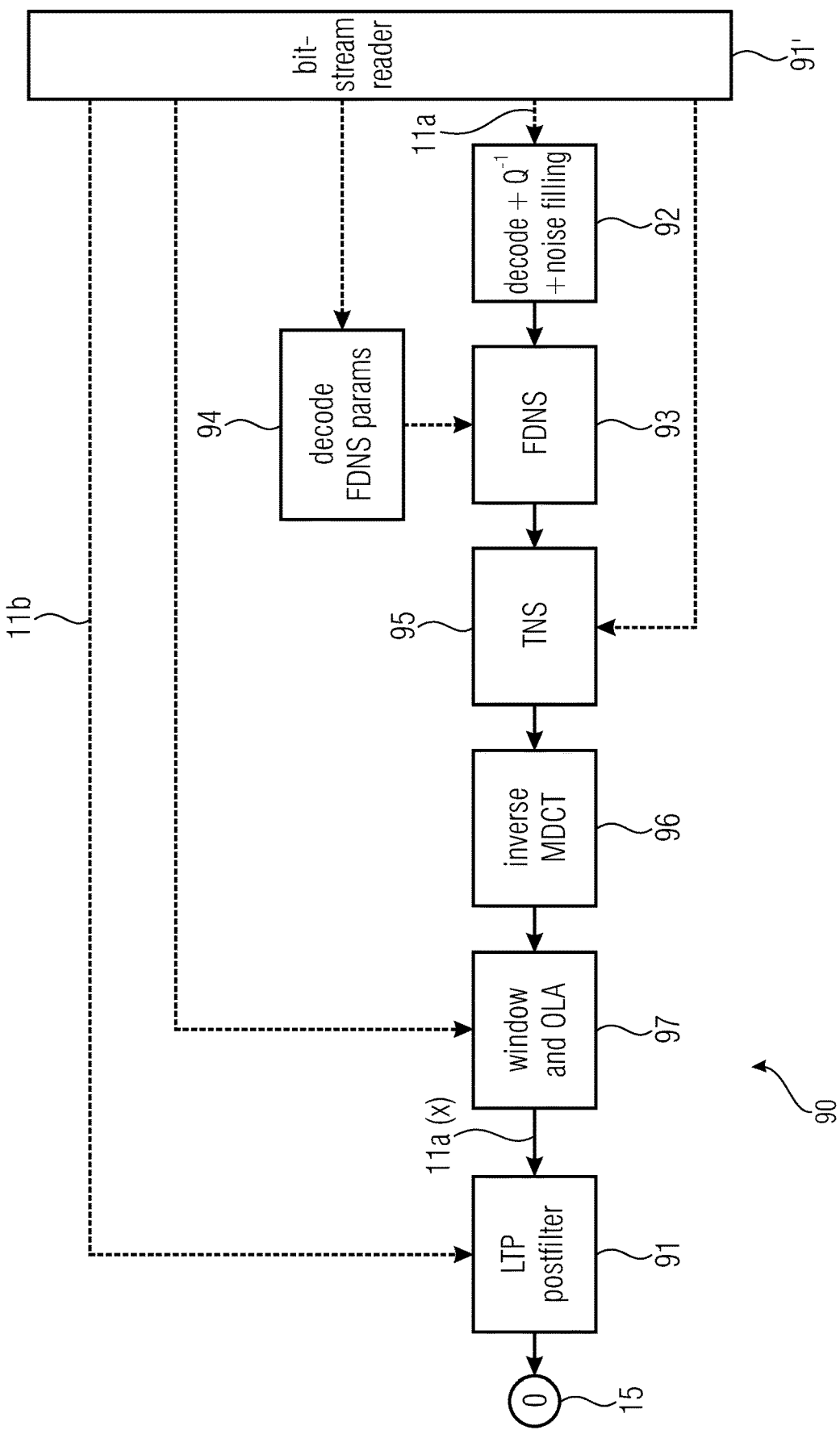

FIGS. 8 and 9 show elements of an encoding/decoding system(s).

FIG. 8 shows an example of apparatus 80 for encoding an information signal in a digital format from an audio signal 81.

The apparatus 80 may comprise, for example, an optional prefilter 81a which may be operated, for example, as any of the systems 10, 30, 40, and 50, and which may perform any of the methods above and/or below. In other examples, the apparatus 80 may be avoided.

The apparatus 80 may comprise a windowing block 82. The apparatus 80 may comprise a domain converter 83 which may convert TD (time domain) representation of the information signal into an FD (frequency domain) representation) of the information signal. For example, the converter 83 may be a Modified Discrete Cosine Transform (MDCT) block or Modified Discrete Sine Transform (MDST) block 83 (or a block associated to another lapped transformation), downstream to the windowing block 82, e.g., for a conversion into the frequency domain (FD). The apparatus 80 may comprise a Temporal Noise Shaping (TNS) block 84 to control temporal shape of quantization noise within a window of a transform. The apparatus 80 may comprise a frequency domain noise shaper (FDNS) block 85. The apparatus 80 may comprise a block 87 for obtaining FDNS parameters downstream to the windowing block 82. The apparatus 80 may comprise a quantization block 86 which may also include an entropy coder. The apparatus 80 may comprise a TD/TD (Time Domain Transient Detector) block 88.

The apparatus 80 may comprise an LTP block 89 for obtaining LTP parameters (e.g., harmonicity information, gain information, pitch information such as pitch lag, etc.). At least some of the parameters obtained by the LTP block 89 may be used by devices 10, 30, 40, 50, and/or by methods 60 and/or 70 for each $k^{th}$ update interval of the signal. For example, the parameters for the $k^{th}$ update interval may be the pitch lag and the gain (which is some cases is optional and may be estimated at the decoder side) associated to the signal at the $k^{th}$ update interval. The operations of the LTP block 89 may be independent from the operations of the prefilter 81a: the prefilter 81a may also not to be present, but the LTP block 89 may operate correctly by providing parameters to the decoder side.

The signal may be encoded by a bitstream writer 89' and may be stored in a memory and/or transmitted to a decoder (e.g., wirelessly, e.g., using a standard protocol such as Bluetooth).

FIG. 9 shows an apparatus 90 for encoding signal information which may obtain a digital audio signal (e.g., using a bitstream reader 91' transmitted from or stored by from an encoder, such as the apparatus 80). The apparatus 90 may comprise at least one of the elements 10, 12, 14, 20, 22, 24, 31, 40, 50, and/or implement any of methods 60 and/or 70 for each $k^{th}$ update interval of the signal to provide a decoded and filtered output signal 15. In particular, the apparatus 90 may comprise an LTP postfilter 91 which may implement perform any of the filtering actions associated to elements 12, 14, 22, 24, 31, 40, 51-54, 61-63, and 70. The apparatus 90 may comprise a dequantization block 92 which may also include an entropy decoder. The apparatus 90 may comprise an FDNS block 93, which may receive parameters from an FDNS parameter decoder 94. The apparatus 90 may comprise a TNS block 95 downstream to the FDNS block 93. The apparatus 90 may comprise a domain converter 96 which may convert a first domain representation (e.g., an FD domain representation) of the information signal into a second domain representation (e.g., a TD representation) of the information signal. The converter 96 may be an inverse MDCT or an inverse MDST block (or a block associated to another lapped transformation) for a conversion to the time domain from the frequency domain. The apparatus 90 may comprise a windowing and overlap and add (OLA) block 97 which may receive parameters from the TD/TD block 88.

The LTP postfilter 91 may obtain the digital representation 11a (x) of the signal to be filtered from the block 97, for example. The LTP postfilter 91 may obtain the coefficients 11b from the bitstream, for example.

At least one of the systems 80 and/or 90 may perform an analysis operation (e.g., at the block 89) for obtaining the parameters associated to the $k^{th}$ and/or $(k+1)^{th}$ update interval.

A digital input information signal x[n] (11a) may be filtered with a time varying filter, whose parameters change at update interval T (e.g., the current $k^{th}$ update interval), producing the filtered output signal y[n]. The update interval T can also be signal adaptive and thus T can change over time. We may consider filters that can be represented as a liner time invariant (LTI) Infinite impulse response (IIR) filter during a time interval T. Time interval T may be the frame (e.g., the current filter discussed above) or a sub-frame of the digital signal. We may use the term frame and/or update interval for both a frame and a sub-frame.

The LTI IIR filter (which may also be represented as H(z)) can be presented in the form:

$$H(z) = \frac{1 + \sum_{i=0}^{P} b_i z^{-i}}{1 + \sum_{j=1}^{Q} a_j z^{-j}}$$

or using a linear difference equation:

$$y[n] = x[n] + \sum_{i=0}^{P} b_i x[n-i] - \sum_{j=1}^{Q} a_j y[n-j]$$

The coefficients $b_i$ and $a_j$ are filter parameters (e.g., parameters to be stored in memory elements 21a and 21b, for example). The LTI IIR filter may be uniquely defined by its coefficients (parameters). FIG. 10 shows the update interval T in association with a filter $H_k$ (e.g., at the current $k^{th}$ update interval) and a preceding interval in association with the filter $H_{k-1}$.

We consider a time varying filter that is in update interval k equal to the LTI IIR filter $H_k$:

$$H_k(z) = \frac{1 + \sum_{i=0}^{P} b_{k,i} z^{-i}}{1 + \sum_{j=1}^{Q} a_{k,j} z^{-j}}$$

$$y[n] = x[n] + \sum_{i=0}^{P} b_{k,i} x[n-i] - \sum_{j=1}^{Q} a_{k,j} y[n-j], kT \leq n < (k+1)T$$

Instead of instantly changing the filter parameters at border between update intervals k−1 and k, we process a portion at the beginning of the update interval k with new set of time varying filters:

1. If (step S72) the filter parameters are the same (of the difference is extremely small), filtering with the filter $H_k$ is performed (step S73);
2. If (step S74) the distance between the filter parameters is small (e.g., within the second threshold checked at S74), the filter parameters are interpolated (S75) sample-by-sample and the beginning portion of update interval k is filtered using the interpolated parameters;
3. If (step S74) the distance between the filter parameters is big (e.g., bigger than the second threshold), (step S76) the beginning portion of length $T_l$ is first filtered with the filter $H'_{k-1}$ (e.g., at elements such as 12, 22, 51) and subsequently by $H'_k$ (e.g., at elements such as 14, 24, 52) defined by:

$$y'[n] = x[n] + s_{k-1}[n]\left(\sum_{i=0}^{P} b_{k-1,i} x[n-i] - \sum_{j=1}^{Q} a_{k-1,j} y'[n-j]\right),$$
$$kT \le n < kT + T_l$$

$$s_{k-1}[n] = 1 - \frac{n-kT}{T_l}, kT \le n < kT + T_l$$

$$y[n] = y'[n] + s_k[n]\left(\sum_{i=0}^{P} b_{k,i} y'[n-i] - \sum_{j=1}^{Q} a_{k,j} y[n-j]\right),$$
$$kT \le n < kT + T_l$$

$$s_k[n] = \frac{n-kT}{T_l} = 1 - s_{k-1}[n], kT \le n < kT + T_l$$

y'[n] may be the intermediate output of the first filter unit 12 of FIG. 1, for example. $s_{k-1}[n]$ may be the scaling factors of element 23b (FIG. 2) for reducing the parameter values $a_{k-1,i}$ and $b_{k-1,i}$ (which are stored in the storage element 21b). $s_k[n]$ may be the scaling factors stored in element 23a for reducing the parameter values of element 23a (FIG. 2) for reducing the parameter values $a_k$ and $b_k$ (which are stored in the storage element 21b).

An example of $s_k[n]$ and $s_{k-1}[n]$ is provided in FIG. 11, where T refers to the current $k^{th}$ update interval. The first and second filtering operations 61 and 62 may be applied to at least the initial subinterval $T_l$, while the third filtering operation 63 is applied to $T_S$. As may be seen, in $T_l$ $s_{k-1}[n]$ decreases, while $s_k[n]$ progressively increases: this is because the parameters of the previous $(k-1)^{th}$ update interval applied to the input signal are progressively decreased, while the parameters of the present $k^{th}$ update interval T are progressively increased to a maximum value which, at the subsequent interval $T_S$, is constant. Accordingly, it is possible to obtain a smooth transition from the $(k-1)^{th}$ update interval to the $k^{th}$ update interval.

In FIG. 11 it is also possible to see where the third filtering 62 (e.g., operated by the third unit 53) may be implemented. The third filtering may be defined by:

$$y[n] = x[n] + \sum_{i=0}^{P} b_{k,i} x[n-i] - \sum_{j=1}^{Q} a_{k,j} y[n-j], kT + T_l \le n < (k+1)T$$

The system as described in [3] may be used as a basis, including Time Domain Transient Detector (TD TD), Windowing, MDCT, TNS, FDNS, OLA, Quantization, Arithmetic Coder and LTP postfiltering (see blocks 82-89 and 92-97 above). The modification may be realized in the LTP post-filter and thus the details of the LTP will be described.

In general terms, the LTP may be seen as a harmonic post-filter for filtering a representation of an information signal. It may be based on a transfer function comprising a numerator and a denominator, wherein the numerator may comprise a gain value indicated by the gain information, and the denominator may comprise an integer part of a pitch lag indicated by the pitch lag information and a multi-tap filter depending on a fractional part of the pitch lag. In examples, the transfer function of the post-filter comprises, in the numerator, a further multi-tap FIR filter for a zero fractional part of the pitch lag. In examples, the denominator comprises a product between the multi-tap filter and the gain value. In examples, the numerator may further comprise a product of a first scalar value and a second scalar value, wherein the denominator comprises the second scalar value and not the first scalar value, wherein the first and second scalar values are predetermined and have values greater than or equal to 0 and lower than or equal to 1, and wherein the second scalar value may be lower than the first scalar value.

An example of LTP filter is provided hereinbelow (see also FIG. 13).

At the encoder side (e.g. apparatus 80), LTP parameter calculation may be used as described in [14]:

1. Pitch Estimation
  One pitch lag (integer part+fractional part) per frame is estimated (frame size e.g. 20 ms).
  One frame may be, for example, one update interval. This may be done in two steps to reduce complexity and improves estimation accuracy.
  a. First Estimation of the Integer Part of the Pitch Lag
  A pitch analysis procedure that produces a smooth pitch evolution contour is used (e.g. Open-loop pitch analysis described in [15], sec. 6.6). This analysis is generally done on a subframe basis (subframe size e.g. 10 ms), and produces one pitch lag estimate per subframe. Note that these pitch lag estimates do not have any fractional part and are generally estimated on a downsampled signal (sampling rate e.g. 6400 Hz). The signal used can be any audio signal, e.g. the input signal or an LPC weighted audio signal as described in [15], sec. 6.5.
  b. Refinement of the Integer Part of the Pitch Lag
  The final integer part of the pitch lag is estimated on an audio signal x[n] running at the core encoder sampling rate, which is generally higher than the sampling rate of the downsampled signal used in a. (e.g. 12.8 kHz, 16 kHz, 32 kHz . . . ). The signal x[n] can be any audio signal e.g. an LPC weighted audio signal.
  The integer part of the pitch lag is then the lag $d_m$ that maximizes the autocorrelation function $$C(d) = \sum_{n=0}^{N} x[n]x[n-d]$$

with d around a pitch lag T estimated in step 1.a.

$$T-\delta_1 \le d \le T+\delta_2$$

c. Estimation of the Fractional Part of the Pitch Lag
  The fractional part may be found by interpolating the autocorrelation function C(d) computed in step 1.b. and selecting the fractional pitch lag which maximizes the interpolated autocorrelation function. The interpolation can be performed using a low-pass Finite impulse response, FIR, filter as described in e.g. [15], sec. 6.6.7.

2. Gain Estimation and Quantization

The gain may be estimated on the input audio signal at the core encoder sampling rate, but it can also be any audio signal like the LPC weighted audio signal. This signal is noted y[n] and can be the same or different than x[n].

The prediction $y_P[n]$ of y[n] may be first found by filtering y[n] with the following filter $$P(z) = B(z, T_{fr}) z^{-T_{int}}$$

with $T_{int}$ the integer part of the pitch lag (estimated in 1.b.) and $B(z, T_{fr})$ a low-pass FIR filter whose coefficients depend on the fractional part of the pitch lag $T_{fr}$ (estimated in 1.c.).

One example of B(z) when the pitch lag resolution is ¼:

$$T_{fr} = 0/4 \; B(z) = 0.0000 z^{-2} + 0.2325 z^{-1} + 0.5349 z^0 + 0.2325 z^1$$

$$T_{fr} = 1/4 \; B(z) = 0.0152 z^{-2} + 0.3400 z^{-1} + 0.5094 z^0 + 0.1353 z^1$$

$$T_{fr} = 2/4 \; B(z) = 0.0609 z^{-2} + 0.4391 z^{-1} + 0.4391 z^0 + 0.0609 z^1$$

$$T_{fr} = 3/4 \; B(z) = 0.1353 z^{-2} + 0.5094 z^{-1} + 0.3400 z^0 + 0.0152 z^1$$

The gain g is then computed as follows:

$$g = \frac{\sum_{n=0}^{N-1} y[n] y_P[n]}{\sum_{n=0}^{N-1} y_P[n] y_P[n]}$$

and limited between 0 and 1.

Finally, the gain is quantized e.g. with two bits, using e.g. uniform quantization.

The LTP postfilter from [14] may be used (an example of the transfer function is provided in FIG. 13.):

$$H(z) = \frac{1 - \alpha \beta g B(z, 0)}{1 - \beta g B(z, T_{fr}) z^{-T_{int}}}$$

whose parameters are determined from the parameters estimated at the encoder-side and decoded from the bitstream. g is the decoded gain, $T_{int}$ and $T_{fr}$ the integer and fractional part of the decoded pitch-lag, α and β two scalars that weight the gain, and $B(z, T_{fr})$ a low-pass FIR filter whose coefficients depends on the fractional part of the decoded pitch-lag. The order and the coefficients of $B(z, T_{fr})$ can also depend on the bitrate and the output sampling rate. A different frequency response can be designed and tuned for each combination of bitrate and output sampling rate.

Difference in the LTP postfilter to [14] may be the transition from one frame to the next. LTP postfilter used in the end portion of the frame k−1 is $H_{k-1}$:

$$H_{k-1}(z) = \frac{1 - \alpha \beta g_{k-1} B(z, 0)}{1 - \beta g_{k-1} B(z, T_{fr,k-1}) z^{-T_{int,k-1}}}$$

$$y[n] = x[n] - \beta g_{k-1} \left( \alpha \sum_{i=-1}^{2} b_i^0 x[n-i] - \sum_{j=-1}^{2} b_j(T_{fr,k-1}) y[n - T_{int,k-1} - j] \right)$$

and in the end portion of the frame k is $H_k$:

$$H_k(z) = \frac{1 - \alpha \beta g_k B(z, 0)}{1 - \beta g_k B(z, T_{fr,k}) z^{-T_{int,k}}}$$

$$y[n] = x[n] - \beta g_k \left( \alpha \sum_{i=-1}^{2} b_i^0 x[n-i] - \sum_{j=-1}^{2} b_j(T_{fr,k}) y[n - T_{int,k} - j] \right)$$

| | |
|---|---|
| $b_{-1}^0$ | 0.0000 |
| $b_0^0$ | 0.2325 |
| $b_1^0$ | 0.5349 |
| $b_2^0$ | 0.2325 |

With $b_j(T_{fr})$ defined in the following table:

| $T_{fr}$ | 0/4 | 1/4 | 2/4 | 3/4 |
|---|---|---|---|---|
| $b_{-1}(T_{fr})$ | 0.0000 | 0.0152 | 0.0609 | 0.1353 |
| $b_0(T_{fr})$ | 0.2325 | 0.3400 | 0.4391 | 0.5094 |
| $b_1(T_{fr})$ | 0.5349 | 0.5094 | 0.4391 | 0.3400 |
| $b_2(T_{fr})$ | 0.2325 | 0.1353 | 0.0609 | 0.0152 |

In the beginning portion of the frame k (current $k^{th}$ frame or update interval) there may be three possibilities:

1. (step S73): If parameters are the same, namely: $g_k = g_{k-1}$, $T_{int,k} = T_{int,k-1}$, $T_{fr,k} = T_{fr,k-1}$, the beginning portion of the frame k is filtered with $H_k$;
2. (step S75): If the difference between parameters is small, for example $|T_{int,k} - T_{int,k-1}| < \min(T_{int,k}, T_{int,k-1})$ and $|g_k - g_{k-1}| < \max(g_k, g_{k-1})$, the beginning portion of length L of the frame k is filtered with the time varying filter using interpolated parameters:

$$y[n] = x[n] - \beta g_k'[n] \left( \alpha \sum_{i=-1}^{2} b_i^0 x[n-i] - \sum_{j=-1}^{2} b_j(T_{fr,k}'[n]) y[n - T_{int,k}'[n] - j] \right)$$

$$g_k'[n] = \left(1 - \frac{n}{L}\right) g_{k-1} + \frac{n}{L} g_k$$

$$T_{k-1} = T_{int,k-1} + T_{fr,k-1}/4$$

$$T_k = T_{int,k} + T_{fr,k}/4$$

$$T_k'[n] = \left(1 - \frac{n}{L}\right) T_{k-1} + \frac{n}{L} T_k$$

$$T_{int,k}'[n] = \lfloor T_k'[n] \rfloor$$

$$T_{fr,k}'[n] = T_k'[n] - T_{int,k}'[n]$$

$$0 \leq n < L$$

3. (step S76): If the difference between the parameters is big, the beginning portion of length L of the frame k is first filtered with the filter $H'_{k-1}$:

$$y'[n] = x[n] - \left(1 - \frac{n}{L}\right) \beta g_{k-1} \left( \alpha \sum_{i=-1}^{2} b_i^0 x[n-i] - \sum_{j=-1}^{2} b_j(T_{fr,k-1}) y'[n - T_{int,k-1} - j] \right)$$

$$0 \leq n < L$$

and subsequently by $H'_k$:

$$y[n] = x[n] - \frac{n}{L} \beta g_k \left( \alpha \sum_{i=-1}^{2} b_i^0 y'[n-i] - \sum_{j=-1}^{2} b_j(T_{fr,k}) y[n - T_{int,k} - j] \right)$$

$$0 \leq n < L$$

For cases where complexity is more important than the quality, the 3. possibility is used whenever at least one of $g_k \neq g_{k-1}$, $T_{int,k} \neq T_{int,k-1}$, $T_{fr,k} \neq T_{fr,k-1}$ is satisfied. Some of these conditions may be more important than some other ones, according to specific examples. In some examples, the difference in the pitch is the most important condition to be verified, for the choice between the 2. and 3. possibilities.

Figure 7A:
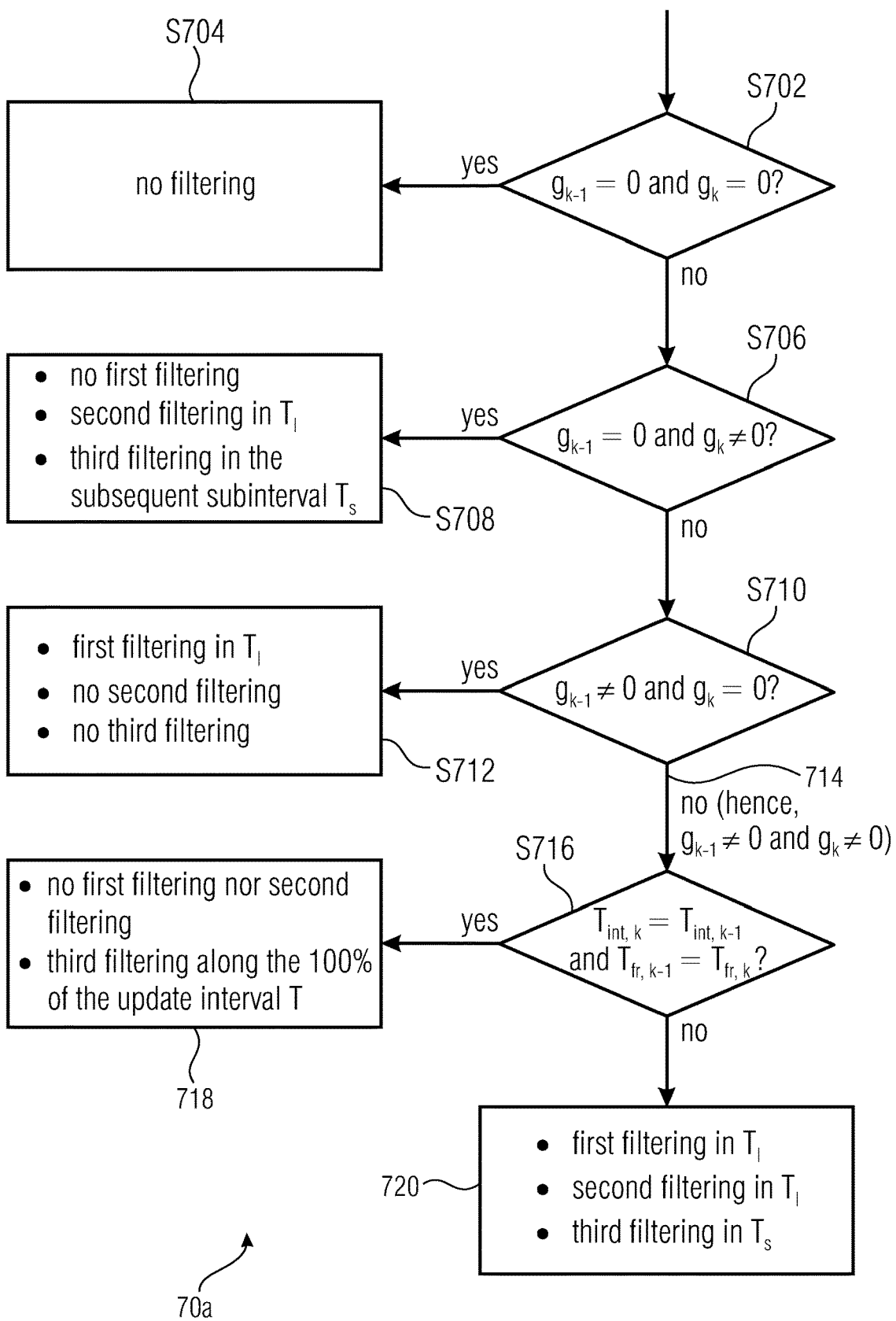

An example of the applications of the equations above for LTP postfilter is provided below with reference to FIG. 7a and method 700. The parameters may comprise the gain $g_k$, the integer part of the pitch $T_{int,k}$ and the fractional part of the pitch $T_{fr,k}$. In some of these examples, the selector 55 may operate so that:

If $g_{k-1}$ (gain) is zero and $g_k$ is also zero (S702), then there is no filtering (S704), because:
y'[n]−=x[n]
by virtue of $g_{k-1}$=0; and
y[n]=x[n]−=x[n], by virtue of $g_k$=0;
(with reference to FIG. 1a, both the first and second filter units 12 and 14 may be bypassed)

If $g_{k-1}$=0 and $g_k \neq 0$ (S706), then (S708)
there is no first filtering, because y'[n]=x[n]−=x[n] by virtue of $g_{k-1}$=0;
there is second filtering in $T_l$ in the form of $$y[n] = x[n] - \frac{n}{L}\beta g_k \left( \alpha \sum_{i=-1}^{2} b_i^0 y'[n-i] - \sum_{j=-1}^{2} b_j(T_{fr,k}) y[n - T_{int,k} - j] \right)$$

there is third filtering in the subsequent subinterval $T_s$ (where $T_l \neq T$) in the form of; y[n]=x[n]−$\beta g_k$ ($\alpha \Sigma_{i=-1}^{2} b_i^0 x[n-i] - \Sigma_{j=-1}^{2} b_j(T_{fr,k}) y[n-T_{int,k}-j]$)
(with reference to FIG. 1a, only the first filter unit 12 is bypassed);

If $g_{k-1} \neq 0$ and $g_k$=0 (S710), then (S712)
there is first filtering in $T_l$ in the form of $$y'[n] = x[n] - \left(1 - \frac{n}{L}\right)\beta g_{k-1} \left( \alpha \sum_{i=-1}^{2} b_i^0 x[n-i] - \sum_{j=-1}^{2} b_j(T_{fr,k-1}) y'[n - T_{int,k-1} - j] \right)$$

there is no second filtering, because y'[n]=x[n]−=x[n], by virtue of $g_k$=0;
there is no third filtering, because
y[n]=x[n]=x[n],
by virtue of $g_k$=0;
(with reference to FIG. 1a, only the second filter unit 14 is bypassed);

If $g_{k-1} \neq 0$ and $g_k \neq 0$ (714), then the difference of the integer and fractional part of the pitch lag are examined (S716, "$T_{int,k}$=$T_{int,k-1}$ and $T_{fr,k-1}$=$T_{fr,k}$?"):
If the integer and fractional part of the pitch lag in k−1 and k are the same ($T_{int,k}$=$T_{int,k}$ and $T_{fr,k-1}$=$T_{fr,k}$) then (S718):
there is no first filtering nor second filtering by virtue of a selection operated by the selector (e.g., at step S72);
there is third filtering along the 100% of the update interval T, in the form of y[n]=x[n]−$\beta g_k(\alpha \Sigma_{i=-1}^{2} b_i^0 x[n-i] - \Sigma_{j=-1}^{2} b_j(T_{fr,k}) y[n-T_{int,k}-j])$;
else if there is a difference in the integer or in the fractional part of the pitch lag (S720):

there is first filtering in $T_l$ in the form of $$y'[n] = x[n] - \left(1 - \frac{n}{L}\right)\beta g_{k-1} \left( \alpha \sum_{i=-1}^{2} b_i^0 x[n-i] - \sum_{i=-1}^{2} b_j(T_{fr,k-1}) y'[n - T_{inL,k-1} - j] \right);$$

there is second filtering in $T_l$ in the form of $$y[n] = x[n] - \frac{n}{L}\beta g_k \left( \alpha \sum_{i=-1}^{2} b_i^0 y'[n-i] - \sum_{j=-1}^{2} b_j(T_{fr,k}) y[n - T_{int,k} - j] \right);$$

(with reference to FIG. 1a, none of the filter units 12 and 14 is bypassed)
there is third filtering in the subsequent subinterval $T_s$ (where $T_l \neq T$) in the form of y[n]=x [n]−$\beta g_k$ ($\alpha \Sigma_{i=-1}^{2} b_i^0 x[n-i] - \Sigma_{j=-1}^{2} b_j(T_{fr,k}) y[n-T_{int,k}-j]$).

Notably, when it is determined (e.g., by the selector 55) that the first and/or second filtering will not be performed (or will provide, as the output, the same value of the input, basically operating as "identity filter", which is in general useless), it is possible to bypass the useless filtering unit and/or section (e.g., as in FIG. 1a). Accordingly, the number of computations is reduced.

A discussion is here provided on the operation of the filters for an LTP postfilter. The decoded signal after MDCT or MDST (or any other lapped transform) synthesis may be postfiltered in the time-domain using an IIR filter whose parameters depend on the LTPF bitstream data may be, for example, "pitch_index" and/or "ltpf_active" (the latter activating/deactivating an LTP postfilter operation). To avoid discontinuity when the parameters change from one frame to the next, a transition mechanism may be applied on the first quarter of the current frame.

An LTPF IIR postfilter can be implemented using (see also above):

$$x_{\overline{iLpf}}(n) = \hat{x}(n) - \sum_{k=0}^{L_{num}} c_{num}(k)\hat{x}(n-k) + \sum_{k=0}^{L_{den}} c_{den}(k, p_{fr}) x_{\overline{iLpf}}\left(n - Pint + \frac{L_{den}}{2} - k\right)$$

with $\hat{x}(n)$ is the filter input signal (i.e. the decoded signal after MDCT or MDST synthesis) and $\overline{x_{ltpf}}(n)$ is the filter output signal.

The integer part $p_{int}$ and the fractional part $p_{fr}$ of the LTPF pitch-lag may be computed as follows. First the pitch-lag (e.g., at 12.8 kHz) may be recovered using $$\text{pitch\_int} = \begin{cases} \text{pitch\_index} - 283 & \text{if pitch\_index} \geq 440 \\ \left\lfloor \frac{\text{pitch\_index}}{2} \right\rfloor - 63 & \text{if } 440 > \text{pitch\_index} \geq 380 \\ \left\lfloor \frac{\text{pitch\_index}}{4} \right\rfloor + 32 & \text{if } 380 > \text{pitch\_index} \end{cases}$$

$$\text{Pitch\_fr} = \begin{cases} 0 & \text{if pitch\_index} \geq 440 \\ 2*\text{pitch\_index} - 4*\text{pitch\_int} + 508 & \text{if } 440 > \text{pitch\_index} \geq 380 \\ \text{pitch\_index} - 4*\text{pitch\_int} + 128 & \text{if } 380 > \text{pitch\_index} \end{cases}$$

$$\text{pitch} = \text{pitch\_int} + \frac{\text{pitch\_fr}}{4}$$

The pitch-lag may then be scaled to the output sampling rate f, and converted to integer and fractional parts using $$pitch_{f_S} = pitch * \frac{f_s}{12800} \quad (1)$$

$$p_{up} = nint(pitch_{f_S} * 4)$$

$$c = \left\lfloor \frac{p_{up}}{4} \right\rfloor$$

$$p_{fr} = p_{up} - 4 * p_{int}$$

wherein Fs is the sampling rate.

The filter coefficients $c_{num}(k)$ and $c_{den}(k, p_{fr})$ may be computed as follows $$c_{num}(k) = 0.85 * gain_{ltpf} * tab\_ltpf\_num\_fs[k]$$
for $k = 0 \ldots L_{num}$ $$c_{den}(k, p_{fr}) = gain_{ltpf} * tab\_ltpf\_den\_fs\_[p_{fr}][k]$$
for $k = 0 \ldots L_{den}$ with $$L_{den} = \max\left(4, \frac{f_s}{4000}\right)$$

$$L_{num} = L_{den} - 2$$

and $gain_{ltpf}$ and $gain_{ind}$ may be obtained, in some examples, according to procedures such as:

```
fs_idx = min(4,(f_s/8000-1));
if (nbits < 320 + fs_idx*80)
{
    gain_ltpf = 0.4;
    gain_ind = 0;
}
else if (nbits < 400 + fs_idx*80)
{
    gain_ltpf = 0.35;
    gain_ind = 1;
}
else if (nbits < 480 + fs_idx*80)
{
    gain_ltpf = 0.3;
    gain_ind = 2;
}
else if (nbits < 560 + fs_idx*80)
{
    gain_ltpf = 0.25;
    gain_ind = 3;
}
else
{
    gain_ltpf = 0;
}
``` the tables tab_ltpf_num_fs[k] and tab_ltpf_den_fs[$p_{fr}$][k] are predetermined. Some examples may be (instead of "fs", an actual bandwidth is used):

```
double tab_ltpf_num_8000[4][3] = {
{6.023618207009578e−01, 4.197609261363617e−01, −1.883424527883687e−02},
{5.994768582584314e−01, 4.197609261363620e−01, −1.594928283631041e−02},
{5.967764663733787e−01, 4.197609261363617e−01, −1.324889095125780e−02},
{5.942410120098895e−01, 4.197609261363618e−01, −1.071343658776831e−02}};
double tab_ltpf_num_16000[4][3] = {
{6.023618207009578e−01, 4.197609261363617e−01, −1.883424527883687e−02},
{5.994768582584314e−01, 4.197609261363620e−01, −1.594928283631041e−02},
{5.967764663733787e−01, 4.197609261363617e−01, −1.324889095125780e−02},
{5.942410120098895e−01, 4.197609261363618e−01, −1.071343658776831e−02}};
double tab_ltpf_num_24000[4][5] = {
{3.989695588963494e−01, 5.142508607708275e−01, 1.004382966157454e−01,
−1.278893956818042e−02, −1.572280075461383e−03},
{3.948634911286333e−01, 5.123819208048688e−01, 1.043194926386267e−01,
−1.091999960222166e−02, −1.347408330627317e−03},
{3.909844475885914e−01, 5.106053522688359e−01, 1.079832524685944e−01,
−9.143431066188848e−03, −1.132124620551895e−03},
{3.873093888199928e−01, 5.089122083363975e−01, 1.114517380217371e−01,
−7.450287133750717e−03, −9.255514050963111e−04}};
double tab_ltpf_num_32000[4][7] = {
{2.982379446702096e−01, 4.652809203721290e−01, 2.105997428614279e−01,
3.766780380806063e−02, −1.015696155796564e−02, −2.535880996101096e−03,
−3.182946168719958e−04},
{2.943834154510240e−01, 4.619294002718798e−01, 2.129465770091844e−01,
4.066175002688857e−02, −8.693272297010050e−03, −2.178307114679820e−03,
−2.742888063983188e−04},
{2.907439213122688e−01, 4.587461910960279e−01, 2.151456974108970e−01,
4.350104772529774e−02, −7.295495347716925e−03, −1.834395637237086e−03,
−2.316920186482416e−04},
{2.872975852589158e−01, 4.557148886861379e−01, 2.172126950911401e−01,
4.620088878229615e−02, −5.957463802125952e−03, −1.502934284345198e−03,
−1.903851911308866e−04}};
double tab_ltpf_num_48000[4][11] = {
{1.981363739883217e−01, 3.524494903964904e−01, 2.513695269649414e−01,
1.424146237314458e−01, 5.704731023952599e−02, 9.293366241586384e−03,
−7.226025368953745e−03, −3.172679890356356e−03, −1.121835963567014e−03,
−2.902957238400140e−04, −4.270815593769240e−05},
{1.950709426598375e−01, 3.484660408341632e−01, 2.509988459466574e−01,
1.441167412482088e−01, 5.928947317677285e−02, 1.108923827452231e−02,
−6.192908108653504e−03, −2.726705509251737e−03, −9.667125826217151e−04,
−2.508100923165204e−04, −3.699938766131869e−05},
{1.921810055196015e−01, 3.446945561091513e−01, 2.506220094626024e−01,
1.457102447664837e−01, 6.141132133664525e−02, 1.279941396562798e−02,
−5.203721087886321e−03, −2.297324511109085e−03, −8.165608133217555e−04,
−2.123855748277408e−04, −3.141271330981649e−05},
```

```
{1.894485314175868e−01, 3.411139251108252e−01, 2.502406876894361e−01,
1.472065631098081e−01, 6.342477229539051e−02, 1.443203434150312e−02,
−4.254449144657098e−03, −1.883081472613493e−03, −6.709619060722140e−04,
−1.749363341966872e−04, −2.593864735284285e−05}};
double tab_ltpf_den_16000[4][5] = {
{0.000000000000000e+00, 2.098804630681809e−01, 5.835275754221211e−01,
2.098804630681809e−01, 0.000000000000000e+00},
{0.000000000000000e+00, 1.069991860896389e−01, 5.500750019177116e−01,
3.356906254147840e−01, 6.698858366939680e−03},
{0.000000000000000e+00, 3.967114782344967e−02, 4.592209296082350e−01,
4.592209296082350e−01, 3.967114782344967e−02},
{0.000000000000000e+00, 6.698858366939680e−03, 3.356906254147840e−01,
5.500750019177116e−01, 1.069991860896389e−01}};
double tab_ltpf_den_24000[4][7] = {
{0.000000000000000e+00, 6.322231627323796e−02, 2.507309606013235e−01,
3.713909428901578e−01, 2.507309606013235e−01, 6.322231627323796e−02,
0.000000000000000e+00},
{0.000000000000000e+00, 3.459272174099855e−02, 1.986515602645028e−01,
3.626411726581452e−01, 2.986750548992179e−01, 1.013092873505928e−01,
4.263543712369752e−03},
{0.000000000000000e+00, 1.535746784963907e−02, 1.474344878058222e−01,
3.374259553990717e−01, 3.374259553990717e−01, 1.474344878058222e−01,
1.535746784963907e−02},
{0.000000000000000e+00, 4.263543712369752e−03, 1.013092873505928e−01,
2.986750548992179e−01, 3.626411726581452e−01, 1.986515602645028e−01,
3.459272174099855e−02}};
double tab_ltpf_den_32000[4][9] = {
{0.000000000000000e+00, 2.900401878228730e−02, 1.129857420560927e−01,
2.212024028097570e−01, 2.723909472446145e−01, 2.212024028097570e−01,
1.129857420560927e−01, 2.900401878228730e−02, 0.000000000000000e+00},
{0.000000000000000e+00, 1.703153418385261e−02, 8.722503785537784e−02,
1.961407762232199e−01, 2.689237982237257e−01, 2.424999102756389e−01,
1.405773364650031e−01, 4.474877169485788e−02, 3.127030243100724e−03},
{0.000000000000000e+00, 8.563673748488349e−03, 6.426222944493845e−02,
1.687676705918012e−01, 2.587445937795505e−01, 2.587445937795505e−01,
1.687676705918012e−01, 6.426222944493845e−02, 8.563673748488349e−03},
{0.000000000000000e+00, 3.127030243100724e−03, 4.474877169485788e−02,
1.405773364650031e−01, 2.424999102756389e−01, 2.689237982237257e−01,
1.961407762232199e−01, 8.722503785537784e−02, 1.703153418385261e−02}};
double tab_ltpf_den_48000[4][13] = {
{0.000000000000000e+00, 1.082359386659387e−02, 3.608969221303979e−02,
7.676401468099964e−02, 1.241530577501703e−01, 1.627596438300696e−01,
1.776771417779109e−01, 1.627596438300696e−01, 1.241530577501703e−01,
7.676401468099964e−02, 3.608969221303979e−02, 1.082359386659387e−02,
0.000000000000000e+00},
{0.000000000000000e+00, 7.041404930459358e−03, 2.819702319820420e−02,
6.547044935127551e−02, 1.124647986743299e−01, 1.548418956489015e−01,
1.767122381341857e−01, 1.691507213057663e−01, 1.352901577989766e−01,
8.851425011427483e−02, 4.499353848562444e−02, 1.557613714732002e−02,
2.039721956502016e−03},
{0.000000000000000e+00, 4.146998467444788e−03, 2.135757310741917e−02,
5.482735584552816e−02, 1.004971444643720e−01, 1.456060342830002e−01,
1.738439838565869e−01, 1.738439838565869e−01, 1.456060342830002e−01,
1.004971444643720e−01, 5.482735584552816e−02, 2.135757310741917e−02,
4.146998467444788e−03},
{0.000000000000000e+00, 2.039721956502016e−03, 1.557613714732002e−02,
4.499353848562444e−02, 8.851425011427483e−02, 1.352901577989766e−01,
1.691507213057663e−01, 1.767122381341857e−01, 1.548418956489015e−01,
1.124647986743299e−01, 6.547044935127551e−02, 2.819702319820420e−02,
7.041404930459358e−03}};
```

Five different cases may be considered:

1. First case: ltpf_active=0 and mem_ltpf_active=0 ("mem_ltpf_active" referring to the activation/deactivation status in the preceding frame):

$$x_{ltpf}^{\hat{}}(n) = \hat{x}(n) \text{ for } n = 0 \ldots \frac{N_F}{4}$$

wherein $N_F$ refers to the number of samples processed in one frames, a.k.a. frame size.

2. Second case: ltpf_active=1 and mem_ltpf_active=0

$$x_{ltpf}^{\hat{}}(n) = \hat{x}(n) - \frac{n}{\frac{N_F}{4}} \left[ \sum_{k=0}^{L_{num}} c_{num}(k)\hat{x}(n-k) + \sum_{k=0}^{L_{den}} c_{den}(k, p_{fr}) x_{ltpf}^{\hat{}}\left(n - p_{\text{int}} + \frac{L_{den}}{2} - k\right) \right]$$

for $n = 0 \ldots \frac{N_F}{4}$

3. Third case: ltpf_active=0 and mem_ltpf_active=1

$$x_{ltpf}^{\hat{}}(n) = \hat{x}(n) - \left(1 - \frac{n}{\frac{N_F}{4}}\right)$$

$$\left[\sum_{k=0}^{L_{num}} c_{num}^{mem}(k)\hat{x}(n-k) + \sum_{k=0}^{L_{den}} c_{den}^{mem}(k, p_{fr}^{mem})x_{ltpf}^{\hat{}}\left(n - p_{int}^{mem} + \frac{L_{den}}{2} - k\right)\right]$$

for $n = 0 \ldots \frac{N_F}{4}$ with $c_{num}^{mem}$, $c_{den}^{mem}$, $p_{int}^{mem}$ and $p_{fr}^{mem}$ are the filter parameters computed in the previous frame 4. Fourth case: ltpf_active=1 and mem_ltpf_active=1 and $p_{int} = p_{int}^{mem}$ and $$p_{fr} = p_{fr}^{mem}$$

$$x_{ltpf}^{\hat{}}(n) =$$

$$\hat{x}(n) - \sum_{k=0}^{L_{num}} c_{num}(k)\hat{x}(n-k) + \sum_{k=0}^{L_{den}} c_{den}(k, p_{fr})x_{ltpf}^{\hat{}}\left(n - p_{int} + \frac{L_{den}}{2} - k\right)$$

for $n = 0 \ldots \frac{N_F}{4}$

5. Fifth case: ltpf_active=1 and mem_ltpf_active=1 and ($P_{int} \neq p_{int}^{mem}$ or $p_{fr} \neq p_{fr}^{mem}$)

$$x_{ltpf}^{\hat{}}{}'(n) = \hat{x}(n) - \left(1 - \frac{n}{\frac{N_F}{4}}\right)$$

$$\left[\sum_{k=0}^{L_{num}} c_{num}^{mem}(k)\hat{x}(n-k) + \sum_{k=0}^{L_{den}} c_{den}^{mem}(k, p_{fr}^{mem})x_{ltpf}^{\hat{}}{}'\left(n - p_{int}^{mem} + \frac{L_{den}}{2} - k\right)\right]$$

$$x_{ltpf}^{\hat{}}(n) = x_{ltpf}^{\hat{}}{}'(n) -$$

$$\frac{n}{\frac{N_F}{4}}\left[\sum_{k=0}^{L_{num}} c_{num}(k)x_{ltpf}^{\hat{}}{}'(n-k) + \sum_{k=0}^{L_{den}} c_{den}(k, p_{fr})x_{ltpf}^{\hat{}}\left(n - p_{int} + \frac{L_{den}}{2} - k\right)\right]$$

for $n = 0 \ldots \frac{N_F}{4}$

Advantages of the invention are here discussed. The examples above are less complex than the previously used implementations. For example in the exemplary case of the LTP postfilter, the complexity advantage over the LPC method used in [13] is clear. Comparing to the cross-fade methods used in [9], [10], [11] and [12] there is one operation less per sample. To see this, notice that $$\left(1 - \frac{n}{L}\right)\beta g_{k-1} \text{ and } \frac{n}{L}\beta g_k$$

can be realized by subtracting constant $$\frac{1}{L}\beta g_{k-1}$$

from $\beta g_{k-1}$ and adding constant $$\frac{1}{L}\beta g_k \text{ to } \beta g_k$$

sample wise. Together with the filtering using H'$_{k-1}$ and H'$_k$ this is equivalent number of operations to filtering with H$_{k-1}$ and H$_k$ followed by weighting of the filtered signals as used in the cross-fade method. The cross-fade method then is continued with the addition of the weighted signals, while the proposed method already has already produced the output.

When it is determined that the first and/or second filtering will not be performed (or will provide, as the output, the same value of the input, basically operating as "identity filter", which is in general useless), it is possible to bypass the useless filtering unit and/or section (e.g., as in FIG. 1a). Accordingly, the number of computations is reduced.

In general, discontinuities are avoided when filter changes at a frame border from H$_{k-1}$:

$$y[n] = x[n] + \sum_{i=0}^{P} b_{k-1,i} x[n-i] - \sum_{j=1}^{Q} a_{k-1,j} y[n-j]$$

to H$_k$:

$$y[n] = x[n] + \sum_{i=0}^{P} b_{k,i} x[n-i] - \sum_{j=1}^{Q} a_{k,j} y[n-j],$$

by filtering the beginning portion with length L of the frame k with time-varying filter H'$_{k-1}$:

$$y'[n] = x[n] + s_{k-1}[n]\left(\sum_{i=0}^{P} b_{k-1,i} x[n-i] - \sum_{j=1}^{Q} a_{k-1,j} y'[n-j]\right)$$

$$s_{k-1}[n] = 1 - \frac{n}{L}, 0 \leq n < L$$

followed by filtering the intermediate output y'[n] of the time-varying filter H'$_{k-1}$ with the time-varying filter H'$_k$:

$$y[n] = y'[n] + s_k[n]\left(\sum_{i=0}^{P} b_{k,i} y'[n-i] - \sum_{j=1}^{Q} a_{k,j} y[n-j]\right)$$

$$s_k[n] = \frac{n}{L} = 1 - s_{k-1}[n], 0 \leq n < L$$

H'$_{k-1}$ is time-varying filter that changes from full filtering with H$_{k-1}$ to no filtering. H'$_k$ is time-varying filter that changes from no filtering to full filtering with H$_k$.

A first example (based on the example of FIG. 5b above) is here provided in pseudocode:

---

If $g_{k-1} = g_k$ and $g_k = 0$ then there is no filtering.
Else If $g_{k-1} = 0$ and $g_k \neq 0$ then
{
 - there is no first filtering

```
- there is second filtering in T₁
- there is third filtering in the subsequent subinterval (where T₁ != T)
}
Else If g_{k-1}!=0 and g_k ==0 then
{
- there is first filtering in T₁
- there is no second filtering
- there is no third filtering in the subsequent subinterval
}
Else If g_{k-1}!=0 and g_k!=0 then the difference of the integer and fractional part of the pitch lag is
examined
{
    If the integer and fractional part of the pitch lag in k-1 and k are the same (pitch_int(k-
1)== pitch_int(k) && pitch_fr(k-1)== pitch_fr(k)) then
    {
        o there is no first filtering nor second filtering
        o there is third filtering in T₁ and in T_s (i.e., along the whole T)
    }
    else if there is a difference in the integer or in the fractional part of the pitch lag
    {
        o there is first filtering in T₁
        o there is second filtering in T₁
        o there is third filtering in the subsequent subinterval (where if T₁ != T)
    }
}
```

A second example is here provided in pseudocode: 2.

```
If g_{k-1}==g_k and g_k ==0 then there is no filtering.
Else If g_{k-1} ==0 and g_k!=0 then
{
- there is no first filtering
- there is second filtering in T₁
- there is third filtering in the subsequent subinterval (where T₁ != T)
}
Else If gk -1!=0 and g_k ==0 then
{
- there is first filtering in T₁
- there is no second filtering
- there is no third filtering
}
Else If g_{k-1}!=0 and g_k!=0 then we look at the difference of the integer part of the pitch
{
    If the absolute difference between the integer part of the pitch in k-1 and k is below a
threshold then
    {
        o there is fourth filtering in T₁
        o there is third filtering in T (where T₁ != T)
    }
    else if the absolute difference between the integer part of the pitch in k-1 and k is above a
threshold then
    {
        o there is first filtering in T₁
        o there is second filtering in T₁
        o there is third filtering in the subsequent subinterval (of course only if T₁ != T)
    }
}
```

In this 2. implementation we could also include the fractional part of the pitch in addition to checking the difference between the integer part of the pitch.

Figure 12A:
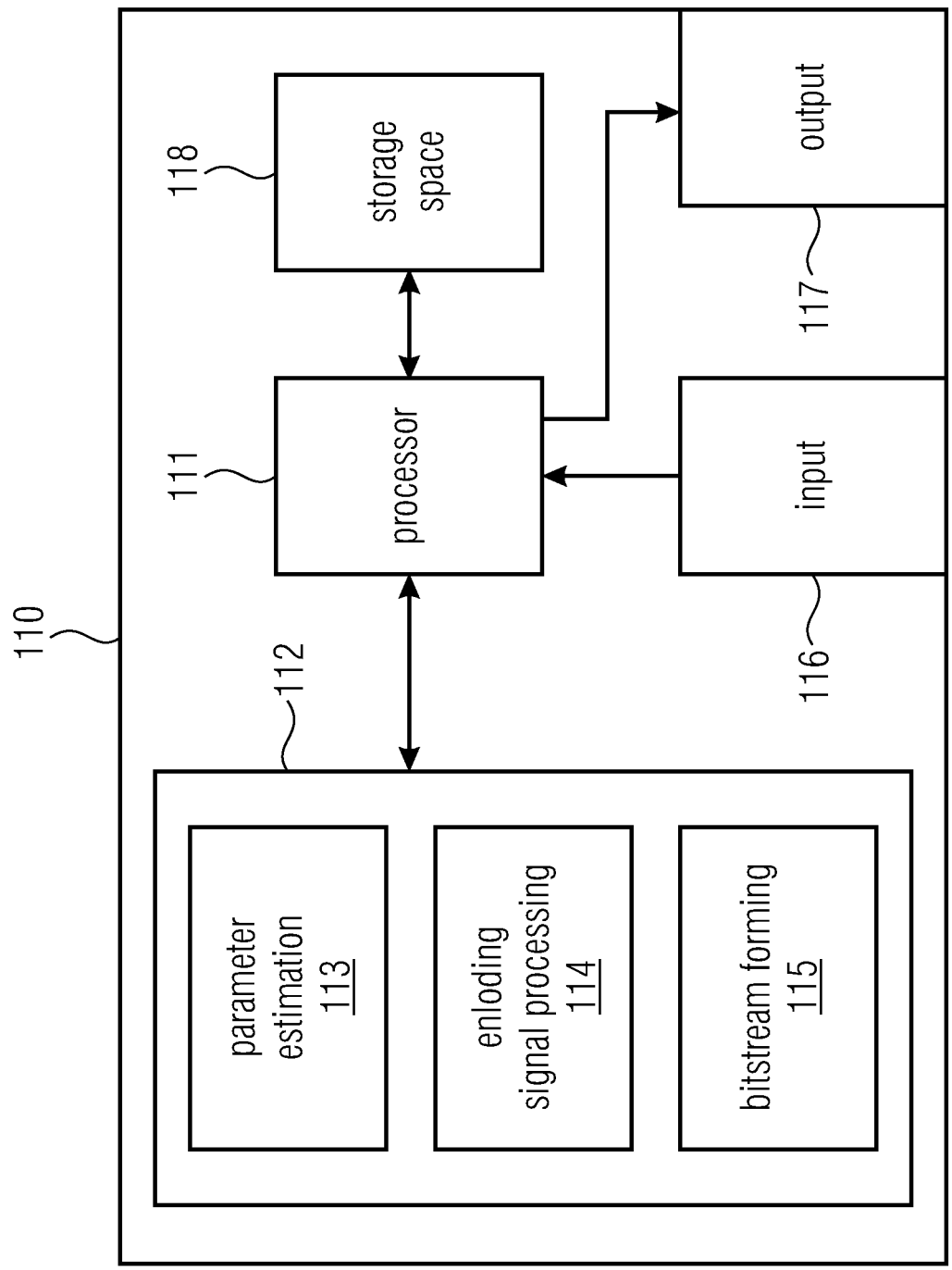
FIGS. 12a and 12b show systems according to examples.

FIG. 12a shows a system 110 which may implement the encoding apparatus 80, for example. The system 110 may comprise a processor 111 and a non-transitory memory unit 112 storing instructions which, when executed by the processor 111, may cause the processor 111 to perform a parameter estimation 113 (e.g., as in block 89), an encoding signal processing 114 (e.g., to implement elements 82-86), and a bitstream forming 115 (e.g., to implement the bitstream writer 89'). The system 110 may comprise an input unit 116, which may obtain an audio signal (e.g., the audio signal 89). The processor 111 may therefore perform processes to obtain an encoded representation (e.g., in the format 11a) of the audio signal. This encoded representation may be provided to external units using an output unit 117. The output unit 117 may comprise, for example, a communication unit to communicate to external devices (e.g., using wireless communication, such as Bluetooth) and/or external storage spaces. The processor 111 may save the encoded representation of the audio signal in a local storage space 118.

Figure 12B:
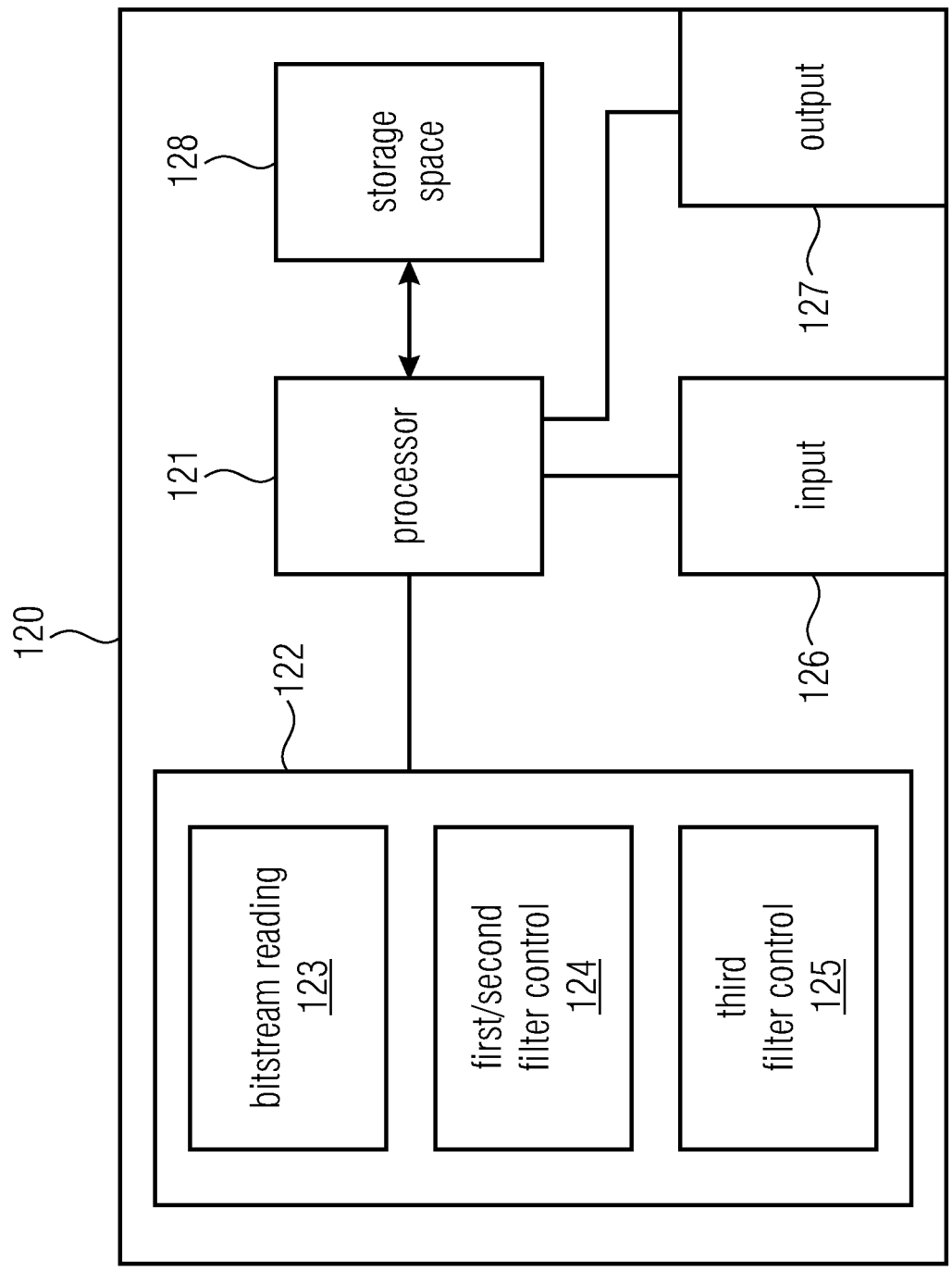

FIG. 12b shows a system 120 which may implement the apparatus 10, 30, 40, 50, 90, and/or perform the method 60 or 70. The system 120 may comprise a processor 121 and a non-transitory memory unit 122 storing instructions which, when executed by the processor 121, may cause the processor 121 to perform a bitstream reading 123 (e.g., to implement the bitstream reader 91'), a first/second filter control 124 (e.g., any of the elements 12, 14, 22, 24, 51, 52 and/or the filter operations 61, 62 and/or steps of method 70), and/or a third filter control 125 (e.g., to implement the third filter 31, 53, and/or the filter operations 63 and/or steps of method 70). The system 120 may comprise an input unit 126, which may obtain a decoded representation of an audio signal (e.g., in the form of 11a). The processor 121 may therefore perform processes to filter the signal (e.g., using an LTP filter). This filtered representation may be provided to external units using an output unit 127. The output unit 127 may comprise, for example, a communication unit to communicate to external devices (e.g., using wireless communication, such as Bluetooth) and/or external storage spaces. The processor 121 may store the filtered representation of the audio signal in a local storage space 128.

In examples, the systems 110 and 120 may be the same device.

Depending on certain implementation requirements, examples may be implemented in hardware. The implementation may be performed using a digital storage medium, for example a floppy disk, a Digital Versatile Disc (DVD), a Blu-Ray Disc, a Compact Disc (CD), a Read-only Memory (ROM), a Programmable Read-only Memory (PROM), an Erasable and Programmable Read-only Memory (EPROM), an Electrically Erasable Programmable Read-Only Memory (EEPROM) or a flash memory, having electronically readable control signals stored thereon, which cooperate (or are capable of cooperating) with a programmable computer system such that the respective method is performed. Therefore, the digital storage medium may be computer readable.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine readable carrier. In other words, an example of method is, therefore, a computer program having a program instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example comprises a processing unit, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A system for filtering an information input signal, divided into different update intervals, according to coefficients varying with the update intervals, to output a filtered output signal, wherein the information input signal is an audio signal, the system comprising:
   a first filter unit to filter a first filter input signal at least at an initial subinterval in a current update interval to output a first filter output signal, according to coefficients associated to a preceding update interval, the first filter unit being configured to scale the coefficients along at least the initial subinterval—, wherein the first filter unit is configured to scale the coefficients associated to the preceding update interval by a first scaling factor changing towards 0, or a value close to 0, along at least the initial subinterval; and
   a second filter unit to filter a second filter input signal, at the initial subinterval, according to coefficients associated to the current update interval to output a second filter output signal, the second filter unit being configured to scale the coefficients along at least the initial subinterval, wherein the second filter unit is configured to scale the coefficients associated to the current update interval by a second scaling factor changing from 0, or a value close to 0, toward a value different from 0, or a value more distant from 0 than the value close to 0, along at least the initial subinterval,
   wherein the first filter input signal is the information input signal, the first filter output signal is the second filter input signal, and the filtered output signal is the second filter output signal.

2. The system of claim 1, further comprising:
   a third filter unit to filter the information input signal, at a subsequent subinterval in the current update interval after the initial subinterval according to the coefficients associated to the current update interval.

3. The system of claim 2, further comprising:
   a selector configured to check if a distance between a parameters for the current update interval and a parameter for the preceding update interval is 0 or within a first threshold, so as to filter the information input signal at least in the initial subinterval using the third filter unit, wherein the parameter for the current update interval and the parameter for the preceding update interval are taken from one of harmonicity information, gain information, pitch lag information, an integer part of a pitch lag of the information input signal and a fractional part of the pitch lag of the information input signal.

4. The system of claim 2, wherein the third filter unit is configured, along the subsequent interval, to maintain a filter coefficients constant.

5. The system of claim 2, wherein the third filter unit operates as a long term prediction (LTP) pre-filter, a LTP post-filter, a harmonic LTP pre-filter, or a harmonic LTP post-filter.

6. The system of claim 2, further configured to check a gain $g_k$ of the current $k^{th}$ update interval and a gain $g_{k-1}$ of a previous $(k-1)^{th}$ update interval, so that:
if $g_{k-1}=0$ and $g_k=0$, then the filtering at the first, second, and third filter units is deactivated; and/or
if $g_{k-1}=0$ and $g_k\neq 0$, then
the filtering at the first filter unit is deactivated;
there is filtering at the second filter unit in at least the initial subinterval;
there is filtering at the third filter unit in the subsequent subinterval; and/or
if $g_{k-1}\neq 0$ and $g_k=0$, then
there is filtering at the first filter unit in at least the initial subinterval;
the filtering at the second filter unit is deactivated;
the filtering at the third filter unit is deactivated; and/or
if $g_{k-1}\neq 0$ and $g_k\neq 0$, then a difference of integer and fractional parts of a pitch lag are checked, so that:
if the integer and fractional parts of the pitch lag in the current $k^{th}$ update interval and in the previous $(k-1)^{th}$ update interval are the same, then:
the filtering at the first filter unit and the second filter units is deactivated;
there is filtering at the third filter unit along the whole current update interval;
else if there is a difference in the integer or in the fractional part of the pitch lag:
there is filtering at the first filter unit in at least the initial subinterval;
there is filtering at the second filter unit in at least the initial subinterval;
there is filtering at the third filter unit in the subsequent subinterval.

7. The system of claim 1, wherein at least one of the first and second filter units operates as a long term prediction (LTP) pre-filter, a LTP post-filter, a harmonic LTP pre-filter, or a harmonic LTP post-filter.

8. The system of claim 1, wherein at least one of the first and second filter unit comprises a transfer function comprising a numerator and a denominator, wherein the numerator comprises a gain value indicated by gain information, and wherein the denominator comprises an integer part of a pitch lag indicated by pitch lag information and a multi-tap filter depending on a fractional part of the pitch lag.

9. The system of claim 1, wherein:
the coefficients of the first filter unit and second filter unit are derived from parameters chosen among harmonicity information, gain information, pitch lag information, an integer part of a pitch lag of the information input signal and/or a fractional part of the pitch lag of the information input signal.

10. The system of claim 1, wherein:
the first and/ second filter unit are chosen among linear predictive coding (LPC) filters, infinite impulse response (IIR) filters, and/or finite impulse response (FIR), filters.

11. The system of claim 1, wherein:
the first scaling factor and the second scaling factor are non-negative values complementary with each other to a value greater than 0.

12. The system of claim 1, wherein:
the first scaling factor changes towards 0 towards the final extremity of at least the initial subinterval, and/or the second scaling factor changes from 0, or a value close to 0, from the initial extremity of the current update interval towards a non-zero value, or a value which is more distant from 0 than the value close to 0.

13. The system of claim 1, further comprising:
a fourth filter unit configured to filter the information input signal, at least at the initial subinterval, using coefficient acquired by interpolating parameters associated to the current update interval and parameters associated to a previous update interval.

14. The system of claim 13, wherein the fourth filter unit operates as a long term prediction (LTP) pre-filter, a LTP post-filter, a harmonic LTP pre-filter, or a harmonic LTP post-filter.

15. The system of claim 13, further comprising:
a selector configured to check if a distance between parameters for the current update interval is within a second threshold, so as to filter the information input signal at least in the initial subinterval using the fourth filter unit.

16. The system of claim 15, further configured to actively set the second threshold on a basis of values associated to the information input signal.

17. The system of claim 16, further configured to:
set the second threshold as a pitch lag distance threshold equal to the minimum between an integer part of a pitch lag at the current update interval and an integer part of a pitch lag at the previous update interval,
so as to use the fourth filter unit when a distance between the integer part of the pitch lag at the current update interval and the integer part of the pitch lag at the previous update interval is less than the pitch lag distance threshold; and/or
so as to use the first and second filter units when the distance between the integer part of the pitch lag at the current update interval and the integer part of the pitch lag at the previous update interval is greater than the pitch lag distance threshold.

18. The system of claim 16, further configured to:
use a condition associated to gains of the signal at the current update interval and at the preceding interval,
so as to use the fourth filter unit when both the gains of the signal at the current update interval and at the preceding interval are different from zero, and/or
so as to use the first and second filter units when at least one of the gains of the signal at the current update interval and at the preceding interval is zero.

19. The system of claim 1, wherein the first filter unit is to provide the first filter output signal as:

$$y'[n] = x[n] + s_{k-1}[n]\left(\sum_{i=0}^{P} b_{k-1,i} x[n-i] - \sum_{j=1}^{Q} a_{k-1,j} y'[n-j]\right),$$

$$kT \leq n < kT + T_l$$

where the scaling factor $s_{k-1}[n]$ changes towards a value close to 0 when n increases,
and the second filter unit is to provide the second filter output signal as:

$$y[n] = y'[n] + s_k[n]\left(\sum_{i=0}^{P} b_{k,i} y'[n-i] - \sum_{j=1}^{Q} a_{k,j} y[n-j]\right),$$

$$kT \leq n < kT + T_l$$

where the scaling factor $s_k[n]$ changes from a value close to 0 towards a non-zero value when n increases, where T is the current $k^{th}$ update interval, $T_I$ is the initial subinterval, n is an instant, x[n] is the information input signal, $b_{k-1,i}$ and $a_{k-1,j}$ are coefficients associated to the previous $(k-1)^{th}$ update interval, $a_{k,j}$ and $b_{k,i}$ are coefficients associated to the current $k^{th}$ update interval, and P and Q are associated to the type of the filter.

20. The system of claim 1, wherein the first filter unit is configured to provide the first filter output signal in the form of $$\widehat{x_{ltpf}}'(n) = \hat{x}(n) - \left(1 - \frac{n}{\frac{N_F}{4}}\right)\left[\sum_{k=0}^{L_{num}} c_{num}^{mem}(k)\hat{x}(n-k) + \sum_{k=0}^{L_{den}} c_{den}^{mem}(k, p_{fr}^{mem})\widehat{x_{ltpf}}'\left(n - p_{int}^{mem} + \frac{L_{den}}{2} - k\right)\right]$$

$$n = 0 \ldots \frac{N_F}{4}$$

and the second filter unit is configured to provide the filtered output signal in the form of $$\widehat{x_{ltpf}}(n) = \widehat{x_{ltpf}}'(n) - \frac{n}{\frac{N_F}{4}}\left[\sum_{k=0}^{L_{num}} c_{num}(k)\widehat{x_{ltpf}}'(n-k) + \sum_{k=0}^{L_{den}} c_{den}(k, p_{fr})\widehat{x_{ltpf}}\left(n - p_{int} + \frac{L_{den}}{2} - k\right)\right]$$

for $n = 0 \ldots \frac{N_F}{4}$ wherein $$\frac{N_F}{4}$$

is the length of the initial subinterval, $\hat{x}(n)$ is the information input signal, $\widehat{x_{ltpf}}'$ is the first filter output signal, $\widehat{x_{ltpf}}(n)$ is the filtered output signal, n is an instant, $p_{int}^{mem}$ and $p_{fr}^{mem}$ are respectively based on integer part and -fractional part of a pitch lag associated to the preceding update interval, $P_{int}$ and $p_{fr}$ are respectively based on integer part and fractional part of a pitch lag associated to the current update interval, $c_{num}(k)$ is a coefficient based on a gain value for the current update interval, $c_{den}(k,p_{fr})$ is a coefficient based on the gain value for the determined update interval and on the fractional part of the pitch, $c_{num}^{mem}(k)$ is a coefficient based on a gain value for preceding update interval, $c_{den}^{mem}(k, p_{fr}^{mem})$ is a coefficient based on a gain value for preceding update interval and on the fractional part of the pitch, $L_{den}$ and $L_{num}$ are fixed and/or based on a sampling rate of the information input signal.

21. The system of claim 1, wherein a time length of the initial subinterval is between 5% and 40% of a time length of the current update interval.

22. The system of claim 1, comprising an encoder side and a decoder side, wherein at least one of the first and second filter units is at the decoder side.

23. The system of claim 1, comprising an encoder side and a decoder side, wherein at least one of the first and second filter units is at the encoder side.

24. The system of claim 9, comprising an encoder side which comprises:
a parameter estimator configured to estimate the parameters for at least one of the first and second filter unit.

25. The system of claim 1, further comprising a converter for converting a first representation of the information input signal into a second representation of the information input signal.

26. The system of claim 1, wherein the at least a subinterval is the update interval.

27. The system of claim 1, further configured to:
determine if the first and/or second filter unit will operate as an identity filter; and
in case of determination, bypass the first and/or second filter.

28. The system of claim 1, wherein the first filter unit is configured to scale the coefficients gradually by fading and/or monotonically or strictly monotonically the coefficients along at least the initial subinterval.

29. The system of claim 1, wherein the second filter unit is configured to scale the coefficients gradually by fading and/or monotonically or strictly monotonically the coefficients along at least the initial subinterval.

30. A method for filtering an information input signal divided into different update intervals, according to coefficients associated with the update intervals, to output a filtered output signal, wherein the information input signal is an audio signal, the method comprising:
performing a first filtering at least at an initial subinterval of a current update interval according to coefficients associated to preceding update intervals, wherein the coefficients along at least the initial subinterval are scaled by a first scaling factor changing towards 0, or a value close to 0, along at least the initial subinterval; and
performing a second filtering at least at the initial subinterval, according to coefficients associated to the current update interval, wherein the coefficients along the initial subinterval are scaled by a second scaling factor changing from 0, or a value close to 0, toward a value different from 0, or a value more distant from 0 than the value close to 0, along at least the initial subinterval,
wherein the first filtering is performed on the information input signal and the second filtering is performed on signal outputted by the first filtering.

31. A non-transitory digital storage medium having a computer program stored thereon to perform a method for filtering an audio input signal divided into different update intervals, according to coefficients associated with the update intervals, to output a filtered output signal, the method comprising:
performing a first filtering at least at an initial subinterval of a current update interval according to coefficients associated to preceding update intervals, wherein the coefficients along at least the initial subinterval are scaled by a first scaling factor changing towards 0, or a value close to 0, along at least the initial subinterval; and
performing a second filtering at least at the initial subinterval, according to coefficients associated to the current update interval, wherein the coefficients along the initial subinterval are scaled by a second scaling factor changing from 0, or a value close to 0, toward a value different from 0, or a value more distant from 0 than the value close to 0, along at least the initial subinterval, wherein the first filtering is performed on the audio input signal and the second filtering is performed on signal outputted by the first filtering, when said computer program is run by a computer.

\* \* \* \* \*